(12) United States Patent
Shibazaki

(10) Patent No.: US 7,420,752 B2
(45) Date of Patent: Sep. 2, 2008

(54) HOLDING APPARATUS

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 24 days.

(21) Appl. No.: 11/420,632

(22) Filed: May 26, 2006

(65) Prior Publication Data

US 2007/0121224 A1    May 31, 2007

Related U.S. Application Data

(62) Division of application No. 10/111,065, filed as application No. PCT/JP01/06917 on Aug. 10, 2001, now Pat. No. 7,154,684.

(51) Int. Cl.
*G02B 7/02* (2006.01)
(52) U.S. Cl. .................. 359/811; 359/813; 359/814
(58) Field of Classification Search .............. 359/811, 359/813, 814, 817, 819, 822, 823, 824
See application file for complete search history.

(56) References Cited

U.S. PATENT DOCUMENTS

| | | |
|---|---|---|
| 3,917,385 A | 11/1975 | Caswell |
| 4,099,852 A | 7/1978 | Kobierecki et al. |
| 4,655,548 A | 4/1987 | Jue |
| 5,070,489 A | 12/1991 | Perry et al. |
| 5,249,082 A | 9/1993 | Newman |
| 5,383,168 A | 1/1995 | O'Brien et al. |
| 5,502,598 A | 3/1996 | Kimura et al. |
| 5,613,168 A | 3/1997 | Kawano et al. |
| 5,638,223 A | 6/1997 | Ikeda |
| 5,822,133 A | 10/1998 | Mizuno et al. |
| 5,852,518 A | 12/1998 | Hatasawa et al. |
| 5,973,863 A | 10/1999 | Hatasawa et al. |
| 5,986,827 A | 11/1999 | Hale |
| 5,991,005 A * | 11/1999 | Horikawa et al. ............. 355/53 |
| 6,122,114 A | 9/2000 | Sudo et al. |
| 6,229,657 B1 | 5/2001 | Holderer et al. |
| 6,259,571 B1 | 7/2001 | Holderer et al. |
| 6,275,344 B1 | 8/2001 | Holderer |
| 6,307,688 B1 | 10/2001 | Merz et al. |
| 6,388,823 B1 | 5/2002 | Gaber et al. |
| 6,543,740 B2 * | 4/2003 | Gaunt et al. ................ 248/476 |

FOREIGN PATENT DOCUMENTS

| | | |
|---|---|---|
| DE | 19825716 A | 12/1999 |
| EP | 0145 902 A1 | 6/1985 |
| EP | 1020751 A1 | 7/2000 |
| EP | 1028342 A1 | 8/2000 |
| EP | 1081521 A2 | 3/2001 |
| JP | 60-120522 | 6/1985 |
| JP | 61153626 | 7/1986 |

(Continued)

*Primary Examiner*—Timothy J Thompson
(74) *Attorney, Agent, or Firm*—Synnestvedt & Lechner, LLP

(57) ABSTRACT

A holding apparatus provided with a holding portion for holding a flange portion of an optical element. The holding portion includes a bearing surface block having a bearing surface, which contacts the flange portion, and a bearing surface block support mechanism, which rotatably supports the bearing surface block about a tangential axis of the optical element. This structure holds the optical element with the optical element holding apparatus in a kinematical manner and maintains satisfactory imaging performance in the optical element.

27 Claims, 31 Drawing Sheets

FOREIGN PATENT DOCUMENTS

| | | |
|---|---|---|
| JP | 06148493 | 5/1994 |
| JP | 06-50015 | 7/1994 |
| JP | 06-507739 | 9/1994 |
| JP | 10232363 | 2/1997 |
| JP | 09-106944 | 4/1997 |
| JP | 10096843 | 4/1998 |
| JP | 10206714 | 8/1998 |
| JP | 11044834 | 2/1999 |
| JP | 11281865 | 10/1999 |
| JP | 2000019371 | 1/2000 |
| JP | 2000-206385 | 7/2000 |
| JP | 2000-235134 | 8/2000 |
| JP | 2001-74991 | 3/2001 |
| WO | WO 01/22480 A1 | 3/2001 |

* cited by examiner

HOLDING APPARATUS

CROSS REFERENCE TO RELATED APPLICATION

This application is a divisional application of prior application Ser. No. 10/111,065, filed Apr. 18, 2002, now U.S. Pat. No. 7,154,684.

BACKGROUND OF THE INVENTION

The present invention relates to a holding apparatus for holding an optical element, and, more particularly, to an optical element holding apparatus for a projection optical system of an exposure apparatus which is used in a photolithography step performed during a process for fabricating micro devices, such as a semiconductor device, a liquid crystal display device, an imaging device, or an thin-film magnetic head, or in a process for forming masks, such as reticles and photomasks.

As shown in FIGS. 1 and 2, a conventional optical element holding apparatus 200 has a ring-like frame 202, which houses an optical element 201, such as a lens. Three bearing surfaces 204, which support the optical element 201, are arranged on the inner wall of the frame 202 at equiangular distances. Screw holes 205 are formed in the top surface of the frame 202 at positions corresponding to the bearing surfaces 204. Bolts 207 are fastened into the three screw holes 205 by means of three respective clamp members 206.

The fastening of the bolts 207 clamps a peripheral flange 201a of the optical element 201 between the clamp members 206 and the bearing surfaces 204. This holds the optical element 201 in the frame 202 at a predetermined position. Even when force is applied to the optical element 201 in a direction intersecting the optical axis of the optical element 201, the clamp members 206 prevent the optical element 201 from being displaced and stably hold the optical element 201.

Due to the miniaturization of semiconductor device patterns, a projection optical system of, for example, an exposure apparatus used to fabricate semiconductor devices is required to have higher resolution. To acquire higher resolution, it is important that the optical element 201 be fixed when maintaining the optical performance of the optical element 201 of the projection optical system. That is, to maintain the optical performance of the optical element 201, changes in the surface accuracy of the optical surface of the optical element 201 must be minimized when the optical element 201 is supported in the lens barrel of the exposure apparatus.

The optical element 201 is placed on the three bearing surfaces 204 and is clamped by the clamp members 206. The surface shape of the clamped optical element 201 is affected significantly by the machining accuracy of the bearing surfaces 204 (the positional relationship of the bearing surfaces 204), the clamp members 206, and the peripheral flange 201a of the optical element 201. In other words, machining must be performed with extremely high accuracy to make the bearing surfaces 204 identical and arrange the bearing surfaces 204 in the vicinity of the ideal positions so that such affect becomes subtle enough to be negligible. In addition to the bearing surfaces 204, the clamp members 206 and the peripheral flange 201a must also be machined with extremely high accuracy. This makes the machining of the individual members very troublesome and increases manufacturing costs.

Even if the bearing surfaces 204, the clamp members 206, and the peripheral flange 201a were machined with extremely high accuracy, the frame 202 may slightly be distorted when the frame 202 clamping the optical element 201 is fitted in the lens barrel. Such distortion slightly changes the positional relationship of the bearing surfaces 204 and distorts the optical surface of the optical element 201. This lowers the optical performance of the optical element 201.

Further, the pattern miniaturization requires a projection optical system, which has extremely low wave front aberration and distortion. To meet such requirement, the optical axis of the optical element 201 must be aligned as accurately as possible in the projection optical system.

To accurately position the optical element 201 and align the optical axis of the optical element 201, an outer surface 202a and a bottom surface 202b of the frame 202 are connected with an inner wall and receiving portion of the lens barrel. Thus, there is subtle freedom when the frame 202 is attached to the lens barrel. It is therefore necessary to attach the frame 202 to the lens barrel with meticulous care. This is troublesome.

Furthermore, if the frame 202 is inserted in the lens barrel in a slightly tilted state and fitted to the lens barrel with excessive load applied to the frame 202, the frame 202 may be distorted. The distortion of the frame 202 produces an unpredictable stress on the optical element 201, thus lowering the accuracy of the optical surface of the optical element 201.

BRIEF SUMMARY OF THE INVENTION

It is a primary object of the present invention to provide an optical element holding apparatus that maintains the optical performance of an optical element in a satisfactory manner.

It is a secondary object of the present invention to provide an optical element holding apparatus that positions an optical element in a facilitated manner with high accuracy.

The present invention provides an optical element holding apparatus provided with a holding portion for holding a peripheral portion of an optical element. The holding portion includes a bearing surface block having a bearing surface, which contacts the peripheral portion of the optical element, and a bearing surface block support mechanism for rotatably supporting the bearing surface block about a tangential axis of the optical element.

The present invention provides an optical element holding apparatus, which includes a holding portion for holding a peripheral portion of an optical element and a fastening portion to which the holding portion is fastened. The holding portion includes a bearing surface block having a bearing surface that contacts the peripheral portion of the optical element, a base portion fixed to the fastening portion, and a pair of link mechanisms for restricting movements of the bearing surface block relative to the base portion in a plurality of different directions and for connecting the base portion and the bearing surface block rotatably about each axis of the plurality of different directions.

The present invention provides a holding apparatus including a holding portion for holding a member to be held. The holding portion includes a drive mechanism for providing the member to be held with three movements along three coordinate axes with an origin being substantially the center of the member to be held and two rotations about at least two coordinate axes of the three coordinate axes.

The present invention provides an optical element holding apparatus including a holding member for holding a peripheral portion of an optical element, three flexure members for holding the holding member at three locations, and first and second manipulation members connected to at least one of the flexure members for manipulating the at least one flexure member. The manipulation member is held such that manipulation of the first manipulation member causes the at least one flexure member to move the optical element in a first direction and such that manipulation of the second manipulation member causes the at least one flexure member to move the optical element in a second direction that differs from the first direction.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

First Embodiment

Figure 1:
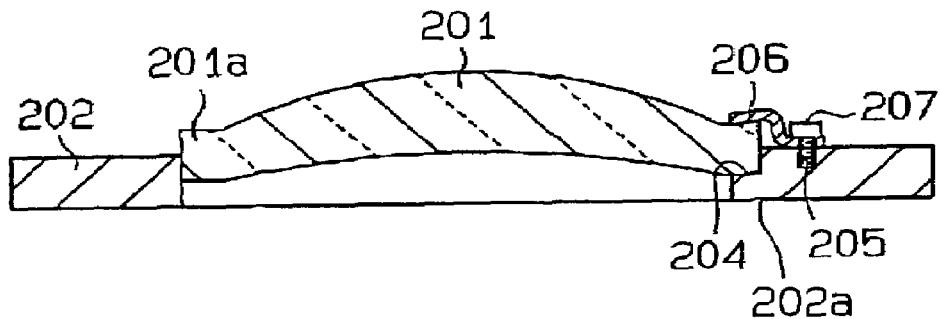
FIG. 1 is a cross-sectional view of a conventional optical element holding apparatus.
Figure 2:
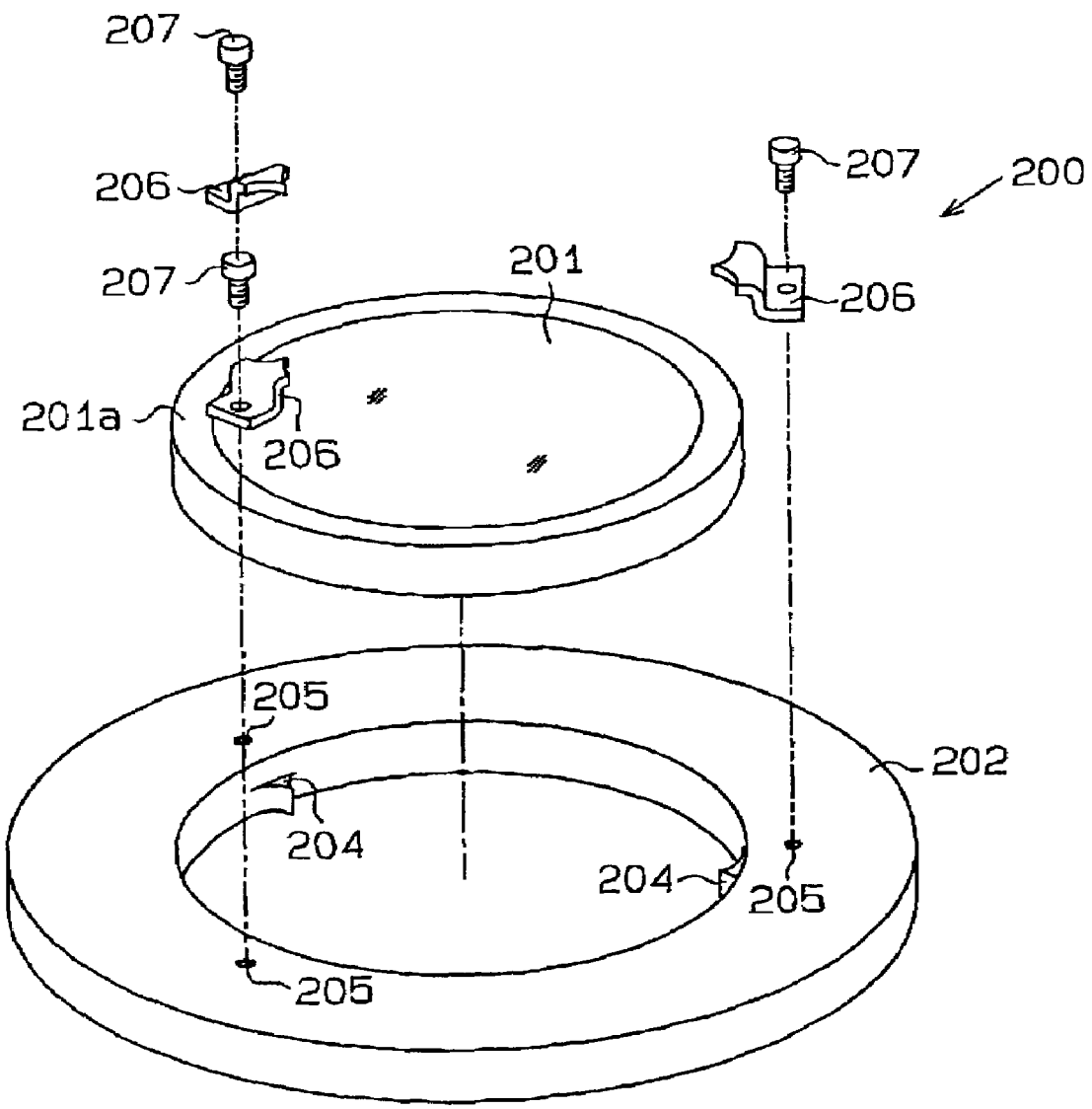
FIG. 2 is an exploded perspective view of the optical element holding apparatus in FIG. 1.
Figure 3:
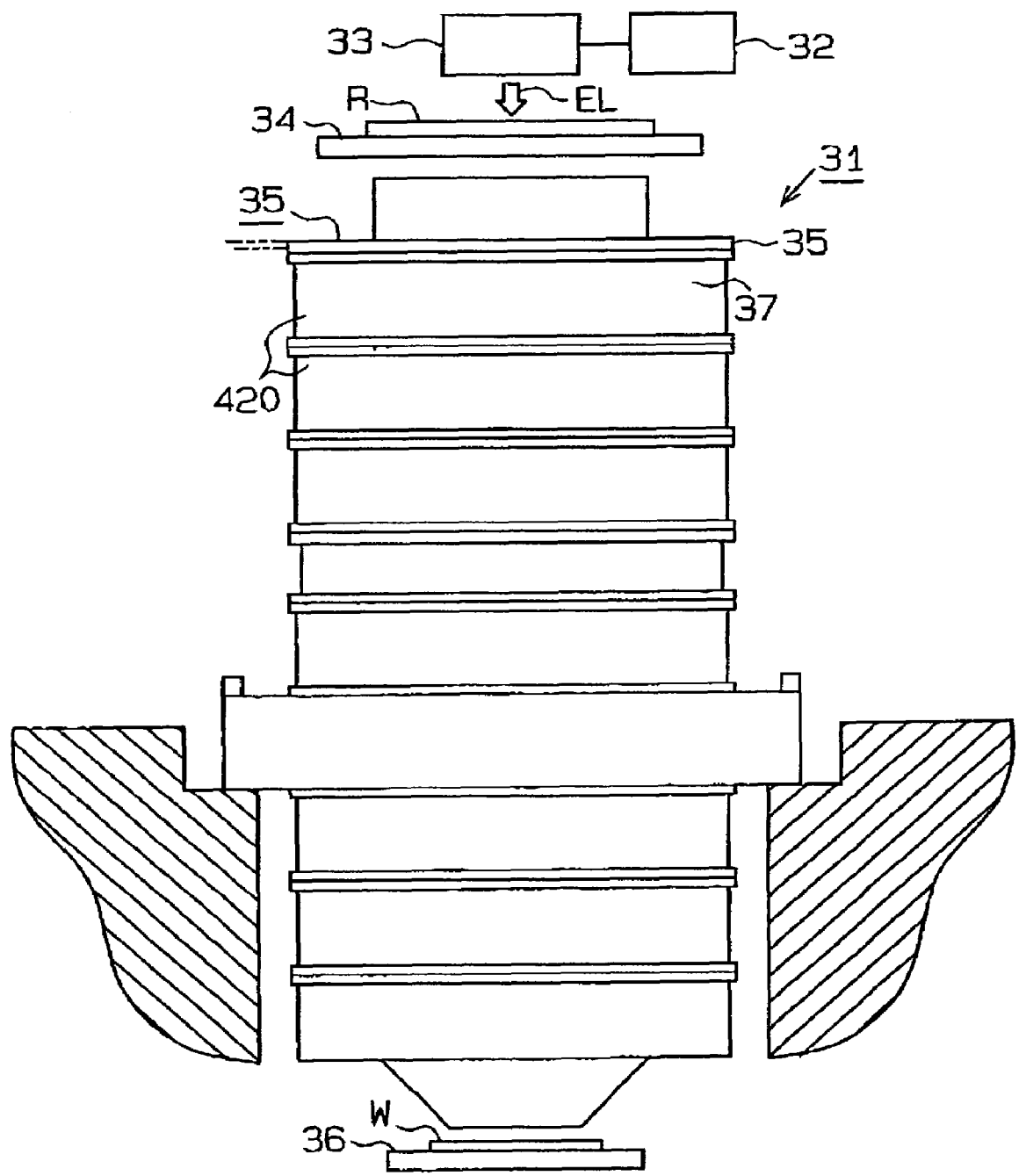
FIG. 3 is a schematic structural diagram of an exposure apparatus.

An optical element holding apparatus 39 according to a first embodiment of the present invention will now be described with reference to FIGS. 3 through 19. Referring to FIG. 3, the optical element holding apparatus 39 is used to hold an optical element or a lens 38 of a projection optical system 35 of an exposure apparatus 31 that is used in the fabrication of semiconductor devices.

As shown in FIG. 3, the exposure apparatus 31 includes a light source 32, an illumination optical system 33, a reticle stage 34, which holds a reticle R functioning as a mask, a projection optical system 35, and a wafer stage 36, which holds a wafer W functioning as a substrate.

The light source 32 emits, for example, an ArF excimer laser beam having a wavelength of, for example, 193 nm. The illumination optical system 33 various lens systems, for example, an optical integrator, such as a fly-eye lens or a rod lens, a relay lens, and a condenser lens, and an aperture stop, which are not shown in the drawings. The illumination optical system 33 adjusts the exposure light EL emitted from the light source 32 to light that uniformly illuminates a pattern on the reticle R.

The reticle stage 34 is arranged such that the surface on which the reticle R is mounted is substantially perpendicular to the direction of the optical axis of the projection optical system 35 on the outgoing side of the illumination optical system 33 (the incoming side of the exposure light EL in the projection optical system 35). The projection optical system 35 includes a lens barrel 37 including a plurality of lens barrel modules 420 in each of which the optical element 38 is held in a generally horizontal state by the optical element holding apparatus 39.

The wafer stage 36 is located on the exposure light EL outgoing side of the projection optical system 35. The wafer mounting surface of the wafer stage 36 is arranged to intersect the optical axis direction of the projection optical system 35. When the exposure light EL passes through the projection optical system 35, the image of the pattern on the reticle R is reduced by a predetermined reduction magnification. The reduced image of the pattern is then transferring onto the wafer W on the wafer stage 36.

The details of the optical element holding apparatus 39 will be described below.

Figure 4:
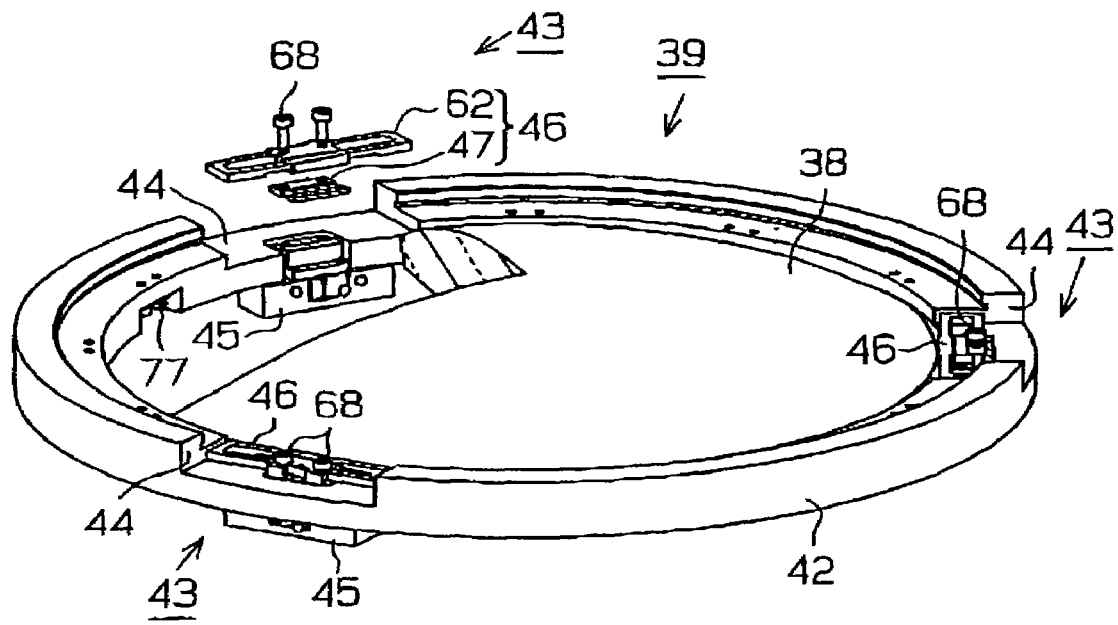
FIG. 4 is a perspective view of an optical element holding apparatus according to a first embodiment of the present invention.
Figure 5:
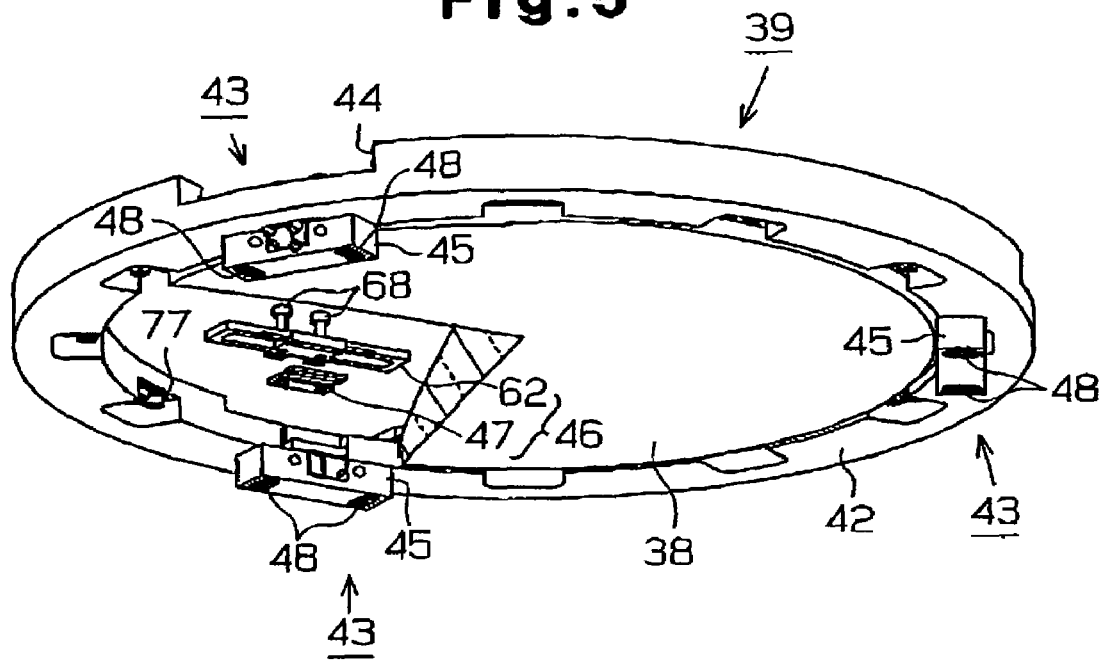
FIG. 5 is a perspective view of the optical element holding apparatus in FIG. 4 as seen from another angle.
Figure 6:
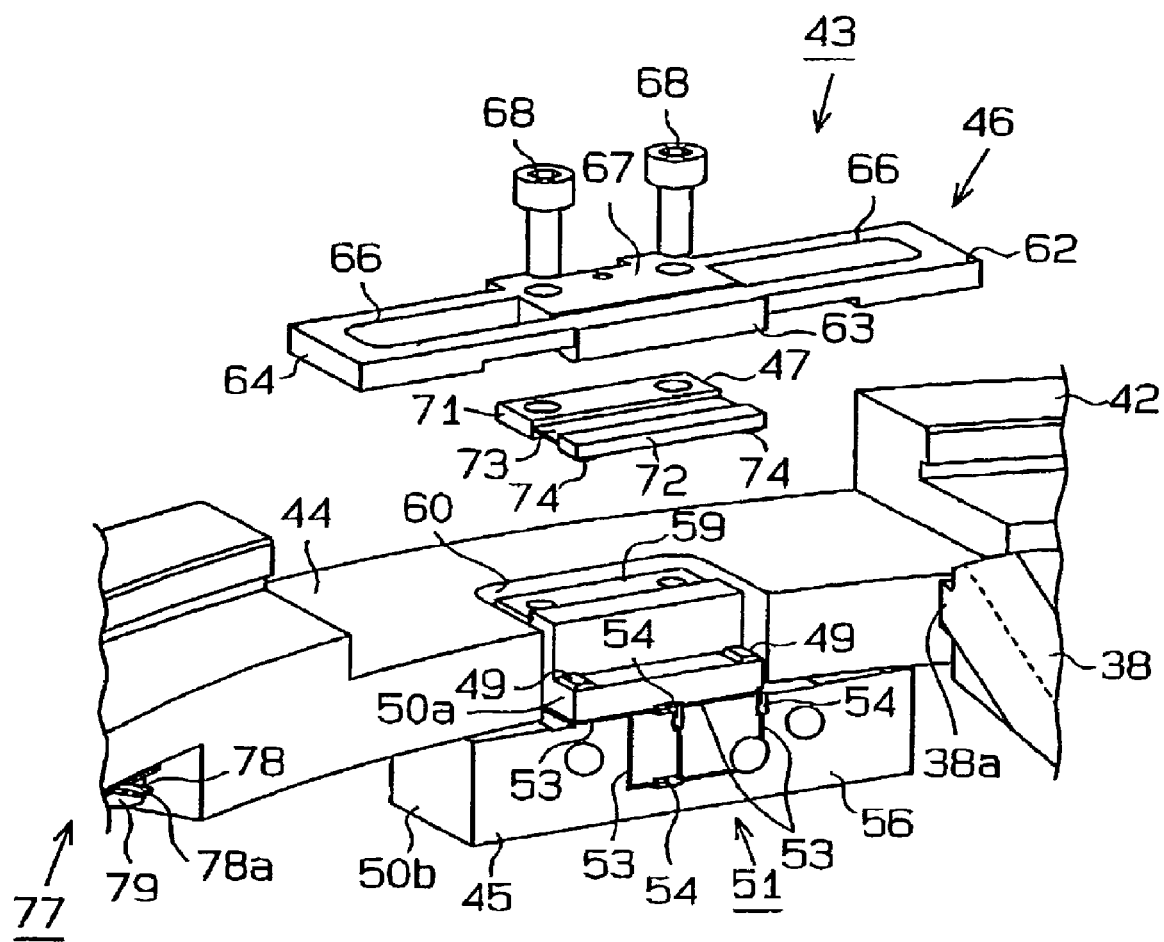
FIG. 6 is a perspective view of a holder of the optical element holding apparatus in FIG. 4.

FIG. 4 is a partial, cutaway, exploded perspective view of the optical element holding apparatus 39, FIG. 5 is a perspective view of the optical element holding apparatus 39 in FIG. 4 as seen from below, and FIG. 6 is a partial, enlarged perspective view of the optical element holding apparatus 39.

The optical element 38 is formed of a glass material, such as synthesized quartz, which has a relatively large fracture strength. The optical element 38 has a flange portion 38a (see FIG. 6) defined at its peripheral portion. The optical element holding apparatus 39 includes a lens frame 42, which serves as the lens barrel module 420 that functions as an external unit, and three holders 43, which are disposed at an equiangular distance on the lens frame 42 and hold the flange portion 38a of the optical element 38. Each holder 43 includes a base member 45 and a clamp member 46. The lens frame 42 is formed of metal, such as aluminum, in a ring-like shape. Attachment grooves 44 for attachment of the clamp members 46 are formed on the surface of the lens frame 42 at equiangular distances. Recesses 60 (see FIG. 6) for receiving bearing surface blocks of the base members 45 are formed on the inner surface of the lens frame 42 at positions corresponding to the attachment grooves 44. The recesses 60 prevent enlarging of the diameter of the lens frame 42.

In the attachment groove 44, the clamp member 46 is attached to the lens frame 42 by a pair of bolts 68. At this time, the heads of the pair of bolts 68 do not protrude from the surface of the lens frame 42. When the surface of one lens frame 42 comes into contact with the bottom surface of another lens frame 42, therefore, the bottom surface of the another lens frame 42 does not contact the bolts 68. A spacer is arranged between the top surface of one lens frame 42 and the bottom surface of another lens frame 42 to adjust the space between the frames 42. This determines the position of the optical element, which is held by each lens frame 42, with respect to the optical axis direction. Thus, the optical element does not contact the bottom surface of the upper lens frame 42 even if the optical element slightly projects from the top surface of the lower lens frame 42 as long as the optical element is thinner than the spacer. The base member 45 is secured to the bottom surface of the lens frame 42 by a pair of bolts (see FIG. 5).

Figure 7:
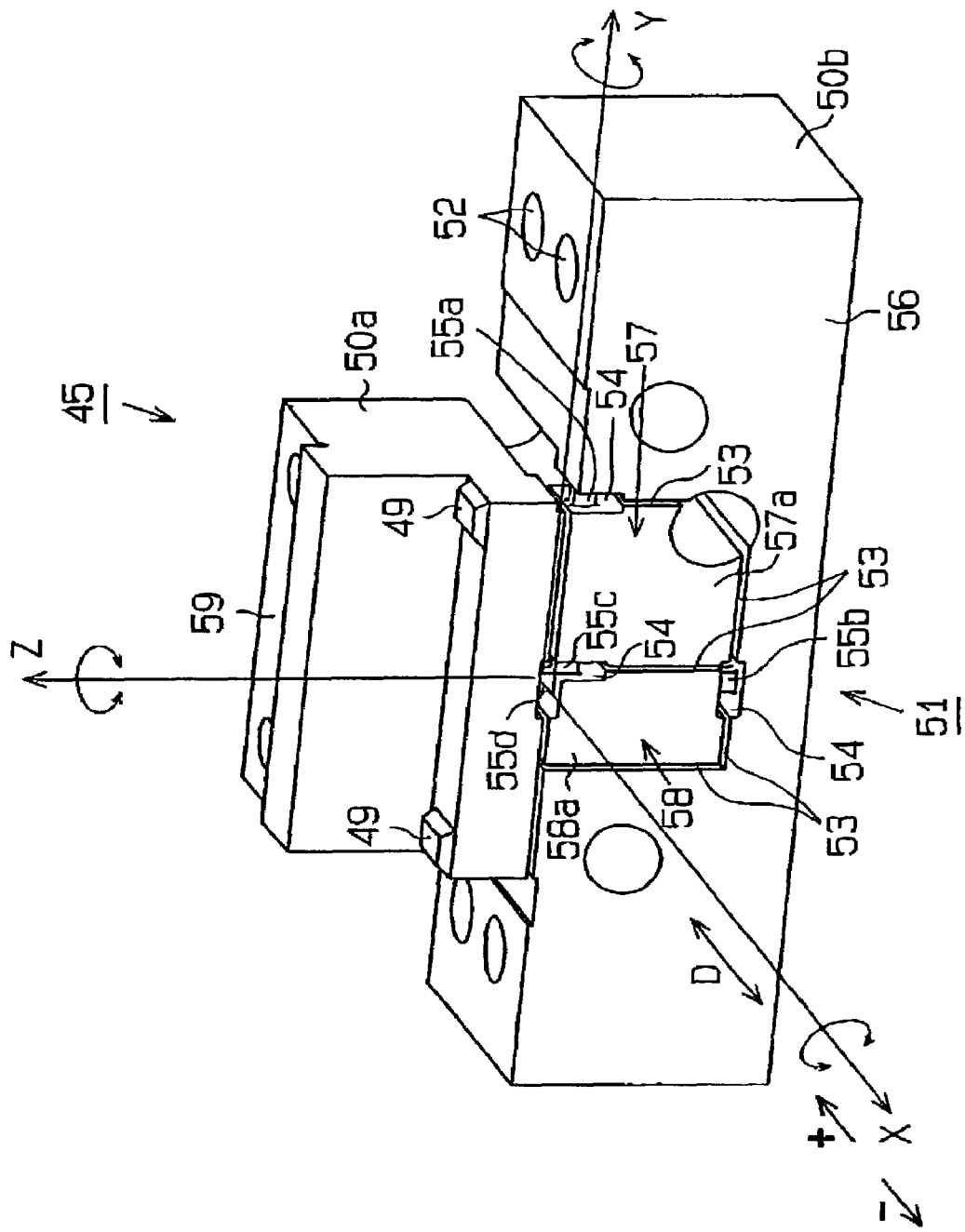
FIG. 7 is a perspective view of a base member of the holder in FIG. 6.
Figure 8:
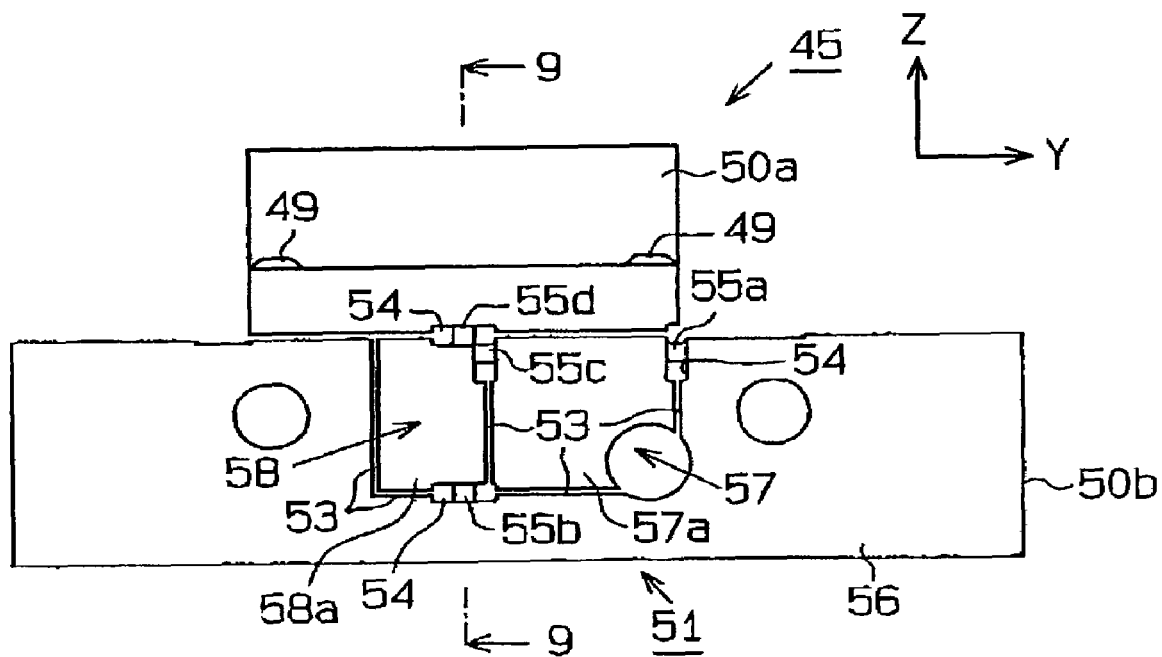
FIG. 8 is a front view of the base member in FIG. 7.
Figure 9:
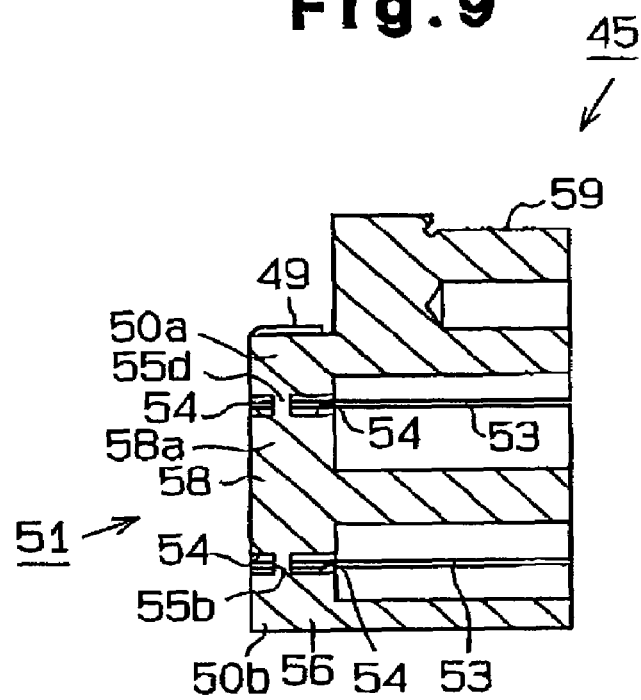
FIG. 9 is a cross-sectional view taken along line 9-9 in FIG. 8.

Next, the holder 43 will be described. First, the base member 45 will be discussed. FIG. 7 is an enlarged perspective view of the base member 45, FIG. 8 is a front view of the base member 45, and FIG. 9 is a cross-sectional view of the base member 45 taken along line 9-9 in FIG. 8. Through holes 52 for a pair of bolts 48 are formed in the base member 45. The base member 45 includes a bearing surface block 50a and a support block 50b. The bearing surface block 50a has bearing surfaces 49, which engage with a first flange surface of the flange portion 38a of the optical element 38. The support block 50b has a bearing surface block support mechanism 51, which supports the bearing surface block 50a so that the posture of the bearing surface block 50a is adjustable.

The bearing surface block 50a is arranged in such a way that its longitudinal direction extends along the tangential direction of the optical element 38. The bearing surfaces 49 are respectively formed on both longitudinal ends of the bearing surface block 50a. That is, the bearing surfaces 49 protrude from the surface of the bearing surface block 50a. Each bearing surface 49 includes a flat surface having a predetermined area and a curved portion, which is formed at the periphery of the flat surface and has a predetermined radius of curvature. The curved portion prevents the bearing surface 49 from being damaged when hit by the corners of the flange portion 38a of the optical element 38. A layer of gold is formed on the bearing surface 49 by plating, vapor deposition or the like in order to increase the coefficient of friction with respect to the flange portion 38a.

To increase the coefficient of friction between the bearing surface 49 and the flange portion 38a, the same metal film as the reflection preventing film applied to the surface of the optical element 38 is formed on the surface of the flange portion 38a. For example, a single layer or multilayer (two layers, four layers or more) of a metal film is applied to the surface of the flange portion 38a by vacuum vapor deposition using $MgF_2$ (magnesium fluoride), $AlF_3$ (aluminum fluoride), $ZrO_2$ (zirconia), $Al_2O_3$ (alumina) or the like. The surface area of the flange portion 38a may be increased relative to the longitudinal direction of the bearing surface block 50a to increase the coefficient of friction between the bearing surface 49 and the flange portion 38a.

A plurality of slits 53, which extend through the blocks in the direction of the X axis in FIG. 7 (i.e., the radial direction of the optical element 38), are formed between the bearing surface block 50a and the support block 50b and in the support block 50b. A plurality of neck portions 55a to 55d (bent portions) are formed between the bearing surface block 50a and the support block 50b and on the support block 50b. The neck portions 55a-55d are formed in the following manner. First, the slits 53 are formed with non-machined portions left between the adjoining slits 53. Next, the non-machined portions are engraved from the +X direction and –X direction to form engraved portions 54 and the neck portions 55a-55d. A large hole is first machined in the –X direction engraving since the machining distance to the neck portions 55a-55d is long.

To avoid unpredictable distortion from remaining in the neck portions 55a-55d, both sides of each neck are formed by the same machining process, such as mold engraving-discharging or mechanical machining.

The support block 50b is separated into a fixed portion 56, a first block 57a, and a second block 58a by the slits 53, as shown in FIG. 7. The fixed portion 56 is secured to the lens frame 42. The first neck portion 55a connects the fixed portion 56 to the first block 57a, the second neck portion 55b connects the fixed portion 56 to the second block 58a, the third neck portion 55c connects the first block 57a to the second block 58a, and the fourth neck portion 55d connects the second block 58a to the bearing surface block 50a. The neck portions 55a-55d have square cross sections.

The first block 57a is fixed to the second block 58a and the fixed portion 56 by the first neck portion 55a and the third neck portion 55c. The first neck portion 55a and the third neck portion 55c hold the first block 57a so that the first block 57a is rotatable about the Y direction (the tangential direction of the optical element) and displacement in the Y direction is restricted. The first block 57a, the first neck portion 55a, and the third neck portion 55c form a tangential restriction link 57, which restricts the displacement of the optical element 38 in the tangential direction.

The second block 58a is fixed to the bearing surface block 50a and the fixed portion 56 by the second neck portion 55b and the fourth neck portion 55d. The second neck portion 55b and the fourth neck portion 55d hold the second block 58a so that the second block 58a is rotatable about the Z direction (the direction parallel to the optical axis of the optical element) and displacement in the Z direction is restricted. The second block 58a, the second neck portion 55b, and the fourth neck portion 55d form an optical axis direction restriction link 58, which restricts the displacement of the optical element 38, in the direction parallel to the optical axis of the optical element.

The restricting direction of the tangential restriction link 57 and the restricting direction of the optical axis direction restriction link 58 are substantially perpendicular to each other. In other words, the rotational axis of the tangential restriction link 57 and the rotational axis of the optical axis direction restriction link 58 are substantially perpendicular to each other.

The bearing surface block 50a is connected to the support block 50b by the fourth neck portion 55d. That is, the tangential restriction link 57 and the optical axis direction restriction link 58 support the bearing surface block 50a on the fixed portion 56.

As shown in FIG. 8, the second and fourth neck portions 55b, 55d are located along a line that passes through the median position between both bearing surfaces 49. The line is perpendicular to a line connecting the two bearing surfaces 49 and is parallel to the Z axis. The first and third neck portions 55a, 55c are located along a line parallel to the line that connects the two bearing surfaces 49. The third neck portion 55c is located near the fourth neck portion 55d.

The bearing surface block 50a is supported on the fixed portion 56 by the tangential restriction link 57 and optical axis direction restriction link 58 in such a way that the bearing surface block 50a is rotatable about the X direction, Y direction, and Z direction and its displacements in the Y direction and Z direction are restricted. Further, the bearing surface block 50a is supported by the fourth neck portion 55d so that it is displaceable in the X direction. In other words, the bearing surface block support mechanism 51 includes the tangential restriction link 57, the optical axis direction restriction link 58, and the fourth neck portion 55d, which is displaced in the X direction.

The bearing surface block 50a has an attachment portion 59 having a surface located above the bearing surfaces 49.

Figure 10:
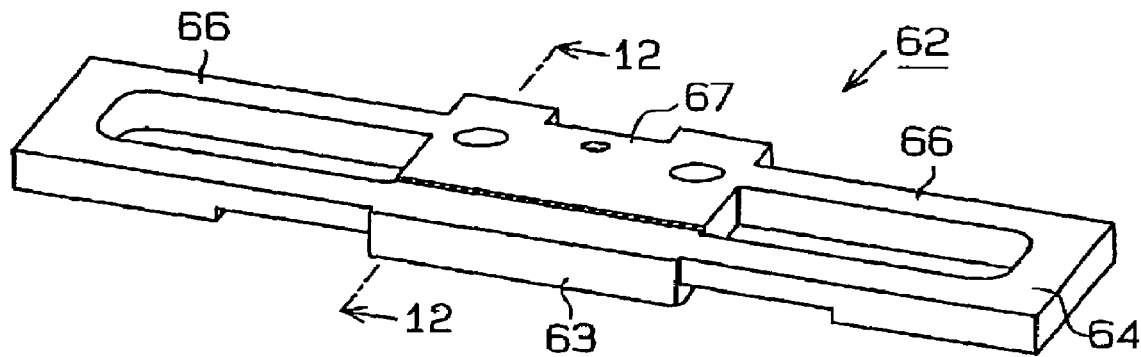
FIG. 10 is a perspective view of a clamp member of the holder in FIG. 6.
Figure 11:
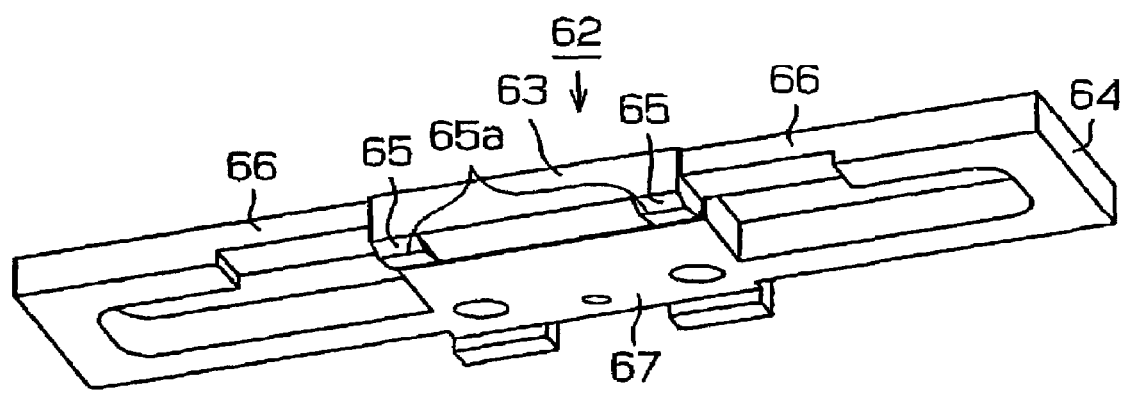
FIG. 11 is a perspective view of the clamp member of the holder in FIG. 6 as seen from another angle.
Figure 12:
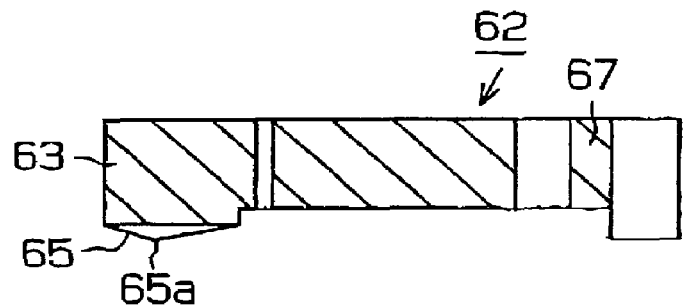
FIG. 12 is a cross-sectional view taken along line 12-12 in FIG. 11.

As shown in FIG. 6, the clamp member 46 is located above the bearing surface block 50a and includes a clamp body 62 and a pad member 47. The clamp body 62 will be discussed below with reference to FIGS. 10, 11, and 12. FIG. 10 is an enlarged perspective view of the clamp body 62, FIG. 11 is an enlarged perspective view of the clamp body 62 as seen from below, and FIG. 12 is a cross-sectional view of the clamp body 62 taken along line 12-12 in FIG. 10.

The clamp body 62 includes a block 63 and a block support mechanism 64, which is formed integrally with the block 63. Press surfaces 65, which face the bearing surfaces 49 of the bearing surface block 50a, are formed on the two ends of the bottom surface of the block 63. Each press surface 65 is formed roof-like and has a ridge line 65a extending generally along the tangential direction of the optical element 38. The median point of a line connecting two ridge lines 65a of both press surfaces 65 is positioned above the fourth neck portion 55d.

The block support mechanism 64 includes a pair of arms 66 and an attachment portion 67. The attachment portion 67 and the block 63 are separated from each other by a predetermined interval. The attachment portion 67 is fastened to the attachment portion 59 by means of the pad member 47 by the bolts 68 so that the clamp member 46 is fixed to the bearing surface block 50a. The pair of arms 66 are formed integrally with the two sides of the block 63 and the attachment portion 67. Each arm 66 is formed in a generally U-shaped manner and has an elastically variable length. Each arm 66 is separated by a predetermined distance from the inner wall in the attachment groove 44 of the lens frame 42.

Figure 13:
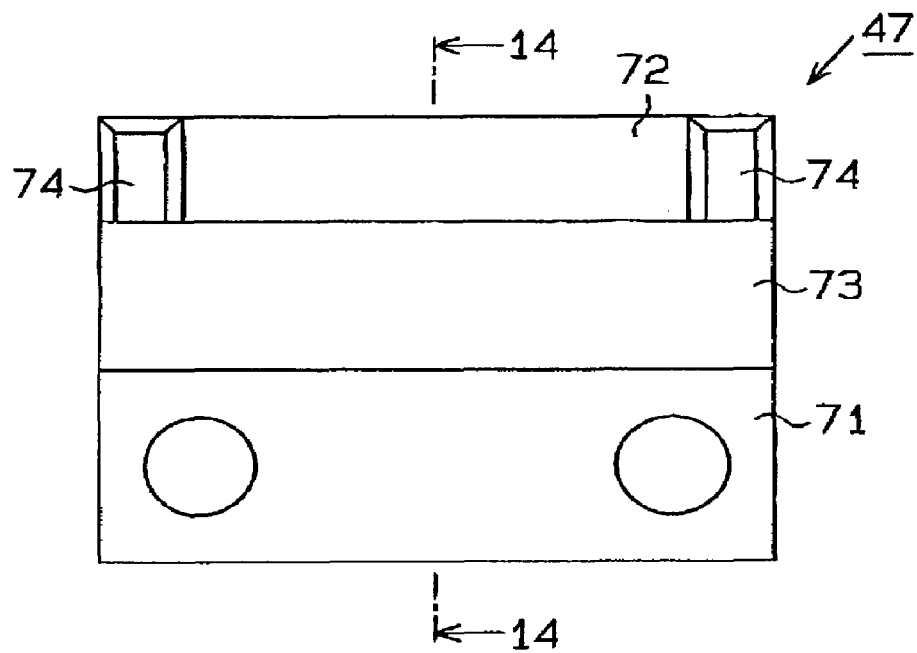
FIG. 13 is a bottom view of a pad member of the holder in FIG. 6.
Figure 14:
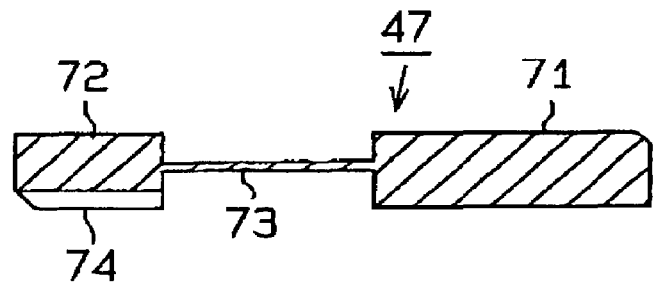
FIG. 14 is a cross-sectional view taken along line 14-14 in FIG. 13.

The pad member 47 will now be discussed referring to FIGS. 13 and 14. FIG. 13 is a cross-sectional view taken along line 14-14 in FIG. 13. The pad member 47 has a clamped portion 71, which is clamped between the attachment portions 59 and 67, an action portion 72, which is located between the press surfaces 65 and the flange portion 38a of the optical element 38, and a flexible thin plate portion 73, which connects the clamped portion 71 to the action portion 72 and is elastically deformable. Action surfaces 74, which are connected to the flange portion 38a of the optical element 38, are defined on the bottom surface of the action portion 72 in association with the bearing surfaces 49. Each action surface 74 has a flat portion and a peripheral portion having a predetermined radius of curvature. The peripheral portion of the action surface 74 prevents damage when hit by the corners of the flange portion 38a. A layer of gold is applied to the action surface 74 by plating, vapor deposition or the like to increase the coefficient of friction with respect to the flange portion 38a of the optical element 38.

Figure 15:
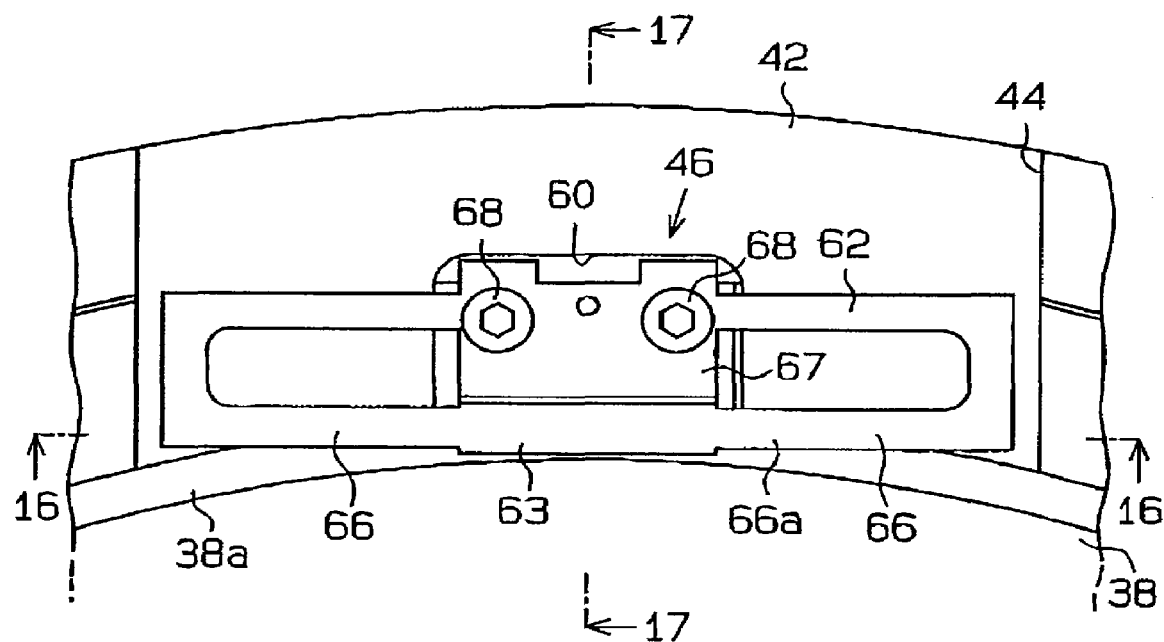
FIG. 15 is an enlarged plan view of the holder in FIG. 6.
Figure 16:
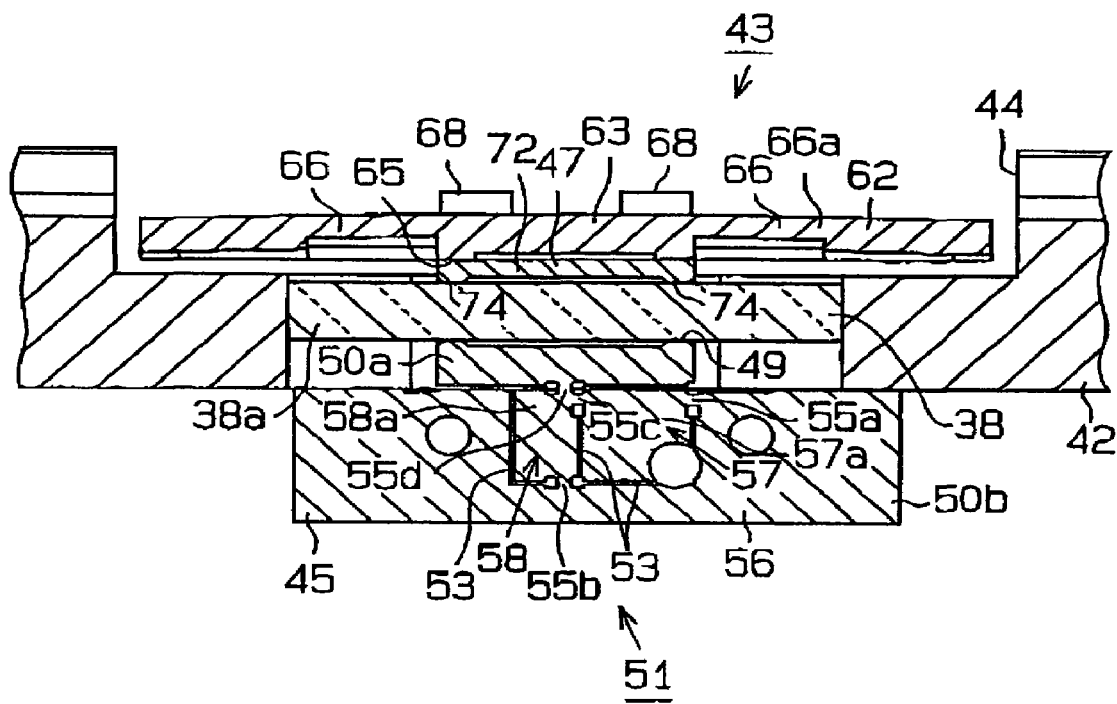
FIG. 16 is a cross-sectional view taken along line 16-16 in FIG. 15.
Figure 17:
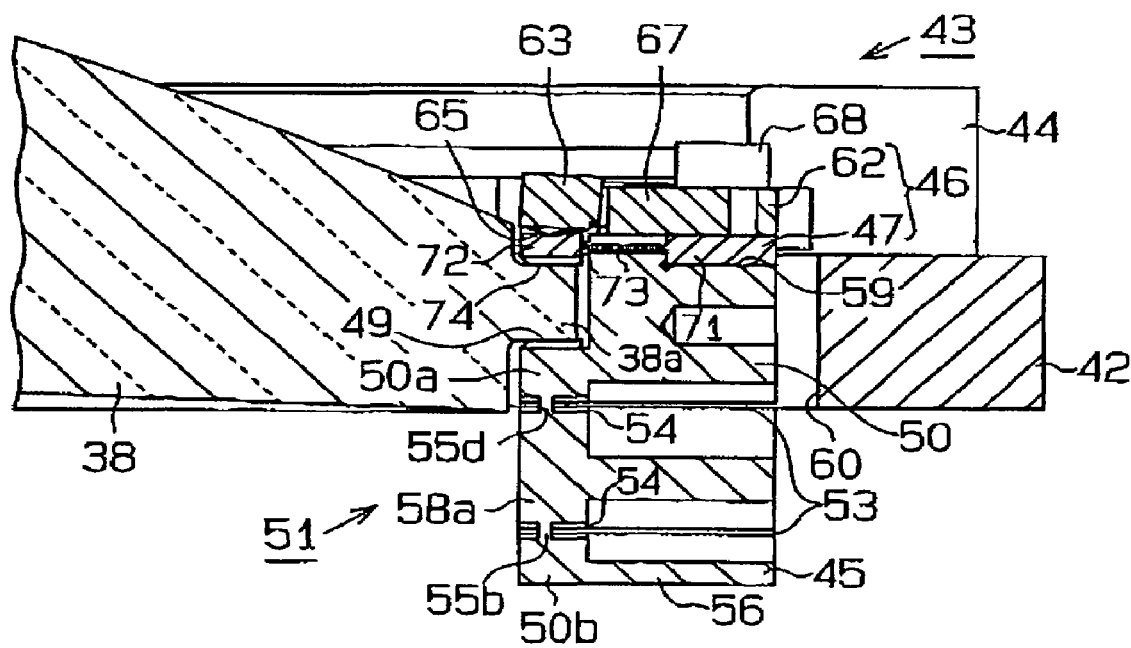
FIG. 17 is a cross-sectional view taken along line 17-17 in FIG. 15.

Referring to FIG. 15 and 16, by fastening of the bolts 68, the clamp member 46 elastically deforms the arms 66 and applies pressure to the press surfaces 65 of the block 63 toward the bearing surface block 50a. The pressure acts on the flange portion 38a of the optical element 38 by means of the action surfaces 74 of the pad member 47. This clamps the flange portion 38a of the optical element 38 between the bearing surfaces 49 and the press surfaces 65.

As shown in FIGS. 4 to 6, a plurality of weight support mechanisms 77 are provided on the lens frame 42 between the adjoining holders 43. The number of the weight support mechanisms 77 is set in accordance with at least one of the parameters of the optical element 38, namely the weight, the thickness, the diameter, the shape, and the material of the optical element 38, and the number of the holders 43. In the first embodiment, three weight support mechanisms 77 are provided between the adjoining holders 43.

Figure 18:
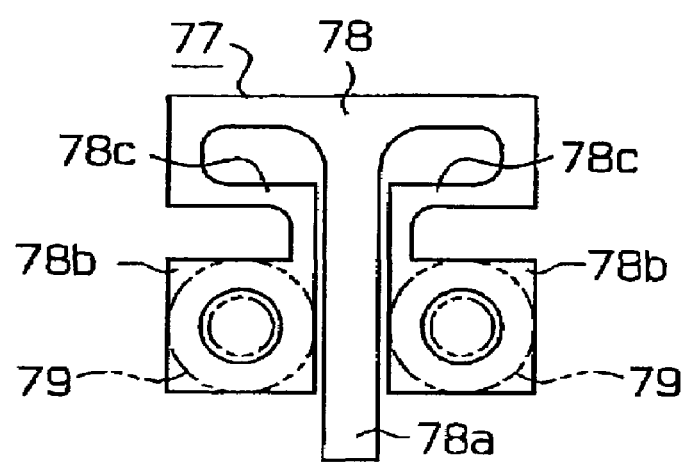
FIG. 18 is an enlarged plan view of a weight support mechanism of the optical element holding apparatus in FIG. 4.

As shown in FIG. 18, each weight support mechanism 77 includes a plate spring 78. The plate spring 78 includes an abutment portion 78a, which abuts on the bottom surface of the flange portion 38a of the optical element 38, a pair of support portions 78b, which are attached to the lens frame 42 by a pair of bolts 79, and a pair of bent portions 78c, which connect the abutment portion 78a to the support portions 78b. The elasticity of the plate spring 78 supports part of the optical element 38.

The procedures for holding the optical element 38 using the optical element holding apparatus 39 will now be described.

As shown in FIG. 4 and FIGS. 15 to 17, the base members 45 are attached to the three attachment grooves 44 of the lens frame 42 by the bolts 48, and the bearing surface blocks 50a are arranged in the recesses 60. Then, part of the two side surfaces of the bearing surface block 50a may be held between a pair of flat sandwiching members and be temporarily fastened to the base member 45 to prevent unintentional deformation of the bearing surface block 50a with respect to the fixing portion. The temporary fastening prevents unintentional application of load to the neck portions 55a-55d of the bearing surface block support mechanism 51.

Next, the optical element 38 is inserted into the lens frame 42, and the flange portion 38a at the periphery of the optical element 38 is arranged on the bearing surfaces 49 of the bearing surface blocks 50a. Then, the temporary fixing plates are separated from the bearing surface block support mechanism 51. The fourth neck portion 55d function to rotate each bearing surface block 50a about the tangential direction (Y direction) and the radial direction (X direction) of the optical element 38 along the bottom surface of the flange portion 38a of the optical element 38. The rotation adjusts the posture of the bearing surface block 50a in accordance with the state of the flange portion 38a of the optical element 38, such as the inclination or waving of the flange portion 38a, thereby maximizing the contact area between the optical element 38 and the flange portion 38a.

Thereafter, each pad member 47 is placed on the top surface of the flange portion 38a of the optical element 38 and the clamp body 62 is placed on the top surface of the attachment portion 59 of the associated bearing surface block 50a so that the action surfaces 74 of the pad member 47 are connected to the top surface of the flange portion 38a of the optical element 38. In this state, each pad member 47 and the associated clamp body 62 are securely fastened by the pair of bolts 68. This causes the press surfaces 65 of the associated block 63 to contact the top surface of the pad member 47 and elastically deforms the arms 66. As a result, the action surfaces 74 of the pad member 47 press the optical element 38.

The pressure causes the flange portion 38a of the optical element 38 to be clamped between the bearing surfaces 49 and the action surfaces 74. In this state, the area of the flange portion 38a contacting the bearing surfaces 49 and the action surfaces 74 of the optical element 38 is maximized. This stably holds the optical element 38.

In a state held by the lens frame 42 of the optical element holding apparatus 39, the optical elements 38 are superimposed as shown in FIG. 3. Since the optical element 38 and the lens frame 42 are formed of different materials, a coefficient of linear expansion may vary between the optical element 38 and the lens frame 42. Thus, when the optical element 38 is heated by the irradiation of the exposure light EL from the light source 32, the expansion lengths of the optical element 38, the lens frame 42 and the lens barrel modules 420 differ from one another in the radial direction of the optical element 38.

When a difference in the expansion length occurs, the cooperative action of the restriction links 57 and 58 and the neck portions 55a-55d of each bearing surface block support mechanism 51 relatively moves the bearing surface block 50a and the block 63, which hold the optical element 38, in the radial direction of the optical element 38 with respect to the lens frame 42. The movement absorbs the difference in expansion length so that a large expansion load will not be applied directly to the optical element 38.

When superimposing a lens frame 42, the lens frame 42 may slightly be distorted. When the lens frame 42 is distorted, the cooperative action of the restriction links 57 and 58 and the neck portions 55a-55d of each bearing surface block support mechanism 51 causes the optical element 38 to be held to the lens frame 42 in a kinematical manner. This suppresses the influence of the distortion on the optical element 38.

A description will now be given of the mechanism that holds the optical element 38 in a kinematical manner.

Figure 19:
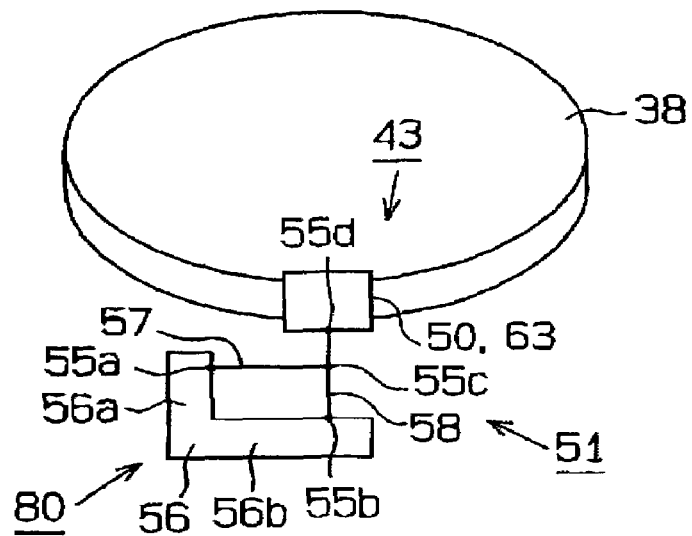
FIG. 19 is a schematic diagram of the holder in FIG. 6.
Figure 20:
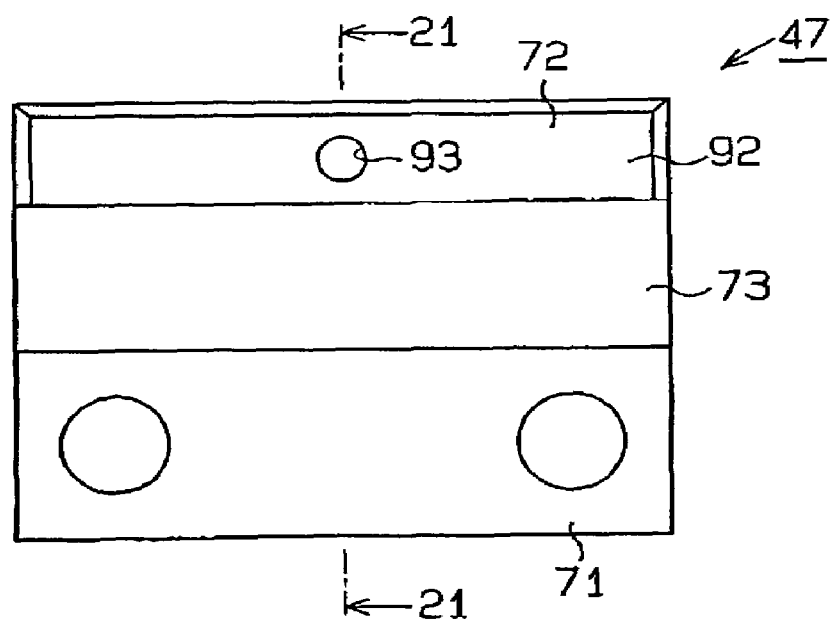
FIG. 20 is an enlarged bottom view showing a pad member in an optical element holding apparatus according to a second embodiment.

FIG. 19 is a schematic diagram of the holder 43 for the optical element 38. Referring to FIG. 19, the rectangle at the periphery of the optical element 38 indicates the bearing surface block 50a and the block 63, the L-like shape indicates the fixed portion 56 of the base member 45, the two lines respectively indicate the tangential restriction link 57 and the optical axis direction restriction link 58, and the dots on the lines respectively indicate the neck portions 55a-55d.

The fixed portion 56 is a bent rigid body having two right-angle rigid body portions 56a, 56b. The first end of the tangential restriction link 57 is coupled to the right-angle rigid body portion 56a by means of the first neck portion 55a. The first end of the optical axis direction restriction link 58 is coupled to the other right-angle rigid body portion 56b by means of the second neck portion 55b. The second end of the tangential restriction link 57 is coupled to the optical axis direction restriction link 58 by means of the third neck portion 55c. The second end of the optical axis direction restriction link 58 is coupled to the bearing surface block 50a via the fourth neck portion 55d.

Each of the restriction links 57, 58 functions as a rigid body in the longitudinal direction and does not expand in the longitudinal direction. Each of the linear body portions 56a, 56b, 57, 58 are coupled by the neck portions 55a-55d, which function as rotational pivots. The cross-sectional area of each of the neck portions 55a-55d is considerably smaller than the cross-sectional area of each linear rigid body, and the neck portions 55a-55d are easily bent or twisted in every direction within the range where plastic deformation does not occur, in accordance with the displacements of the rigid bodies. A link mechanism 80, in which the fixed portion 56 functions as a fixed link and the restriction links 57, 58 act cooperatively, is formed on each bearing surface block support mechanism 51.

A polar coordinate system R-θ-Z in which the optical axis of the optical element 38 is the Z axis will now be construed. In the link mechanism 80, the fourth neck portion 55d, which serves as a point of connection between the optical element 38 and the link mechanism 80, is displaceable within a predetermined range only in the R direction. That is, two degrees of freedom of the optical element 38 are restricted at each of the three points (fourth neck portion 55d) fixed to the optical element 38, and the posture (determined by six degrees of freedoms) of the optical element 38 is mechanically restricted. In other words, the optical element 38 is held in a kinematical manner.

A description will now be given of the action of the link mechanisms 80 that absorbs the thermal deformation of the optical element 38. When the optical element 38 is thermally deformed, the optical element 38 expands or contracts in the radial direction, and a force that displaces the optical element 38 in the radial direction acts on the fourth neck portion 55d. In response to this force, the restriction links 57, 58 rotate about the line that connects the first neck portion 55a and the second neck portion 55b. The rotational motion absorbs the displacement of the optical element 38 and suppresses the distortion of the optical element 38.

The optical element holding apparatus 39 of the first embodiment has the following advantages.

(1) The holder 43 of the optical element holding apparatus 39 that holds the optical element 38 includes the bearing surface block 50a having the bearing surface 49 that engages the flange portion 38a of the optical element 38. The holder 43 further includes the bearing surface block support mechanisms 51 that supports the bearing surface blocks 50a rotatably about the tangential direction, the optical axis direction, and the radial direction of the optical element 38.

The bearing surface block support mechanism 51 changes the posture of each bearing surface 49 in accordance with the shape of the flange portion 38a of the optical element 38. Thus, the production of stress on the optical element 38 is suppressed when the flange portion 38a abuts on the bearing surface 49. As a result, the optical element 38 is held stably while maintaining the accuracy of the optical surface of the optical element 38 in a satisfactory state. Further, satisfactory imaging performance of the optical element 38 is maintained without the holder 43 having to undergo extremely accurate machining.

(2) The bearing surface block support mechanism 51 supports the associated bearing surface block 50a movably in the radial direction of the optical element 38. Accordingly, the thermal deformation of the optical element 38 is absorbed by the bearing surface block support mechanisms 51 so that the accuracy of the optical surface of the optical element 38 is maintained in a satisfactory state and changes in the imaging performance of the optical element 38 is reduced when the optical element 38 is thermally deformed.

(3) The holder 43 is provided with the tangential restriction link 57 and the optical axis direction restriction link 58. The tangential restriction link 57 restricts the movement of the fixed portion 56, which is fixed to the lens frame 42, and the bearing surface block 50a in the tangential direction of the optical element 38 and permits the rotation of the fixed portion 56 and the bearing surface block 50a about the tangential direction. The optical axis direction restriction link 58 restricts the movement of the fixed portion 56 and the bearing surface block 50a in the optical axis direction of the optical element 38 and permits rotation of the fixed portion 56 and the bearing surface block 50a in the optical-axial direction. The tangential restriction link 57 and the optical axis direction restriction link 58 are rotatably connected to each other.

At the connecting links of the links 57, 58, displacement in multiple directions or rotation about these directions are permitted. That is, the bearing surface block 50a is permitted to move in multiple directions or rotate about these directions. When, for example, the lens frame 42 is distorted, the connecting links allow for the movement or rotation of each bearing surface block 50a in such a way as to offset the distortion, so that the three bearing surface blocks 50a are held at their predetermined positions. The holder 43 having the links does not require highly accurate machining. This maintains the imaging performance at a high level in the optical element 38.

The links 57 and 58 of the bearing surface block support mechanism 51 are provided in the tangential direction and optical axis direction of the optical element 38. This simplifies the structure of the link mechanism and facilitates the designing of the link mechanism.

(4) The fixed portion 56, the bearing surface block 50a, the tangential restriction link 57, and the optical axis direction restriction link 58 are coupled by means of the neck portions 55a-55d, which function as rotational pivots. The cross-sectional area of each of the neck portions 55a-55d is smaller than the cross-sectional area of each of the fixed portion 56, the bearing surface block 50a, the tangential restriction link 57, and the optical axis direction restriction link 58.

This enables the neck portions 55a-55d, the fixed portion 56, the bearing surface block 50a, the tangential restriction link 57, and the optical axis direction restriction link 58 to be formed integrally. Accordingly, the holder has a simplified structure even though the number of components is not increased.

(5) The fourth neck portion 55d that is connected to the bearing surface block 50a extends through the median position between the two bearing surfaces 49 and is arranged along a line parallel to the optical axis of the optical element 38. This changes the posture of the bearing surface 49 in a stable manner.

(6) The bearing surface block 50a has two bearing surfaces 49 formed with a predetermined distance in between at the position that faces the flange portion 38a of the optical element 38. Therefore, the optical element 38 formed of a glass material, such as synthesized quartz, which has a relatively large fracture strength is held in a reliable and stable manner by the two bearing surfaces 49.

(7) A gold layer is plated or vapor-deposited on the bearing surfaces 49 of the bearing surface block 50a and the action surface 74 of the pad member 47 in order to increase the coefficient of friction with respect to the flange portion 38a of the optical element 38. This suppresses sliding of the bearing surfaces 49 and the action surfaces 74 with respect to the flange portion 38a of the optical element 38 and holds the optical element 38 in a further stable state.

(8) The block 63 of the clamp member 46 includes the press surfaces 65, the ridge lines 65a of which extend in the tangential direction of the optical element 38. The press surfaces 65 press the flange portion 38a of the optical element 38 by means of the action portion 72 of the pad member 47. As a result, the flange portion 38a of the optical element 38 is held between the block 63 and the bearing surface block 50a. In this state, the fourth neck portion 55d is located below the line that connects the ridge lines 65a of the two press surfaces 65.

This suppresses the generation of the moment originated from the pressure applied to the fourth neck portion 55d, allowing the optical element 38 to be held stably.

(9) The bearing surface block 50a and the bearing surfaces 49 are formed integrally with the restriction links 57, 58, the neck portions 55a-55d, and the fixed portion 56.

Therefore, the bearing surface block 50a and the support block 50b are formed integrally from the same material. There is no junction made of another material that is formed between the bearing surface block 50a and the support block 50b. Thus, distortion is unlikely to occur. Due to the integration of the bearing surface block 50a and the support block 50b, the holder 43 is relatively small.

(10) The lens barrel 37 is formed by superimposing the lens barrel modules 420, each of which houses the optical element 38 held by the optical element holding apparatus 39. This permits a plurality of optical elements 38 to be held stably while preventing the imaging performances of the optical elements 38 from decreasing so that the imaging performance of the entire lens barrel 37 is maintained at a satisfactory level.

(11) The exposure apparatus 31 has the projection optical system 35, which includes the lens barrel 37. This improves the exposure accuracy of the exposure apparatus 31.

Second Embodiment

An optical element holding apparatus 39 according to a second embodiment of the invention will be described below, centering on the differences from the first embodiment.

Figure 21:
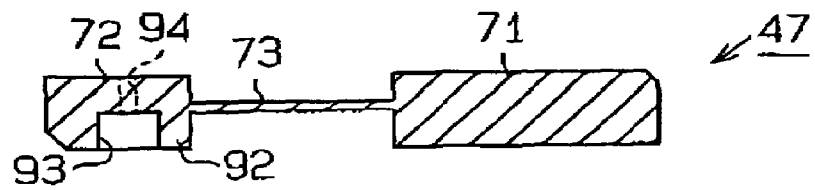
FIG. 21 is a cross-sectional view taken along line 21-21 in FIG. 20.
Figure 22:
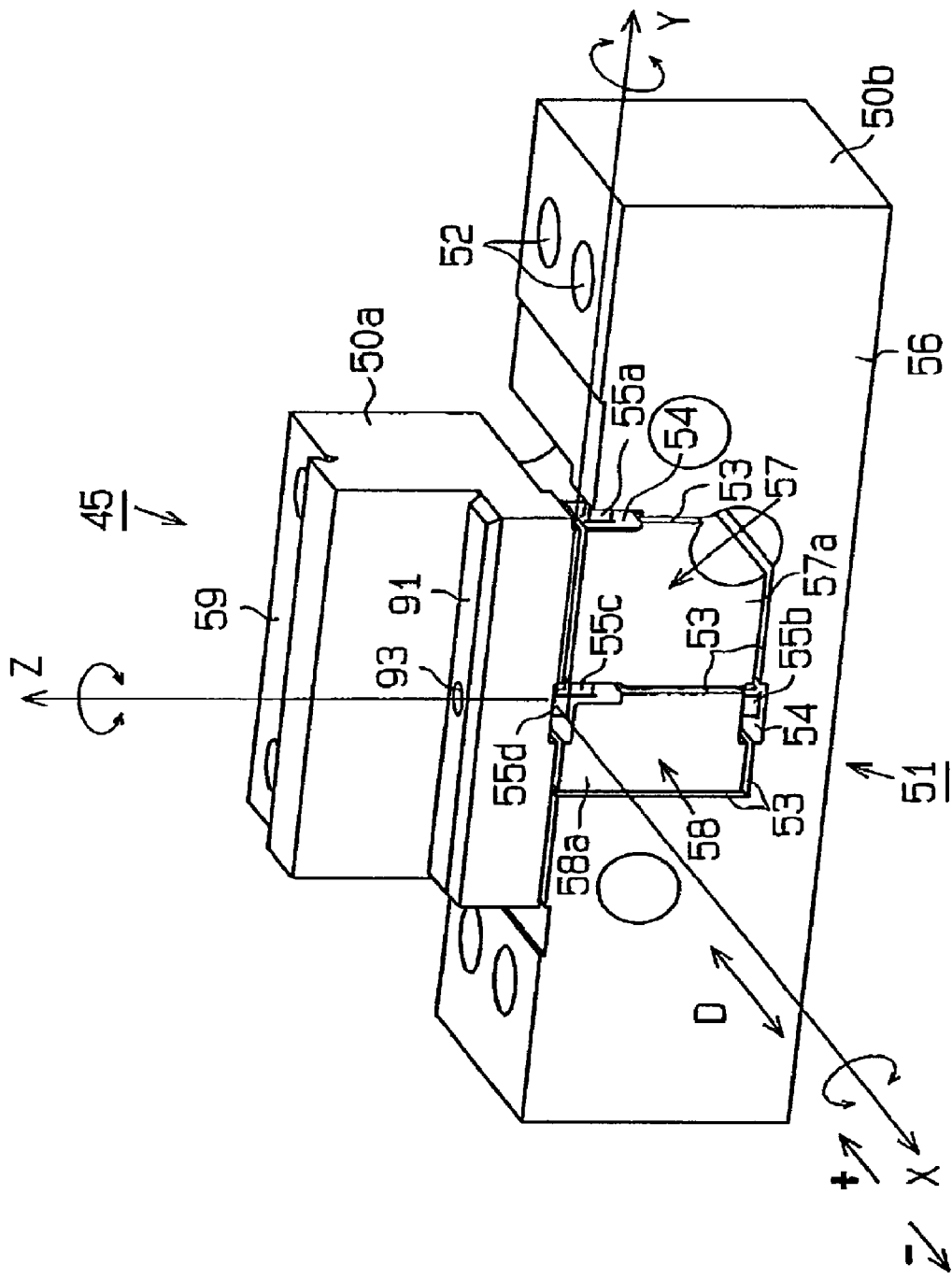
FIG. 22 is an enlarged perspective view showing a base member in the optical element holding apparatus according to the second embodiment.
Figure 23:
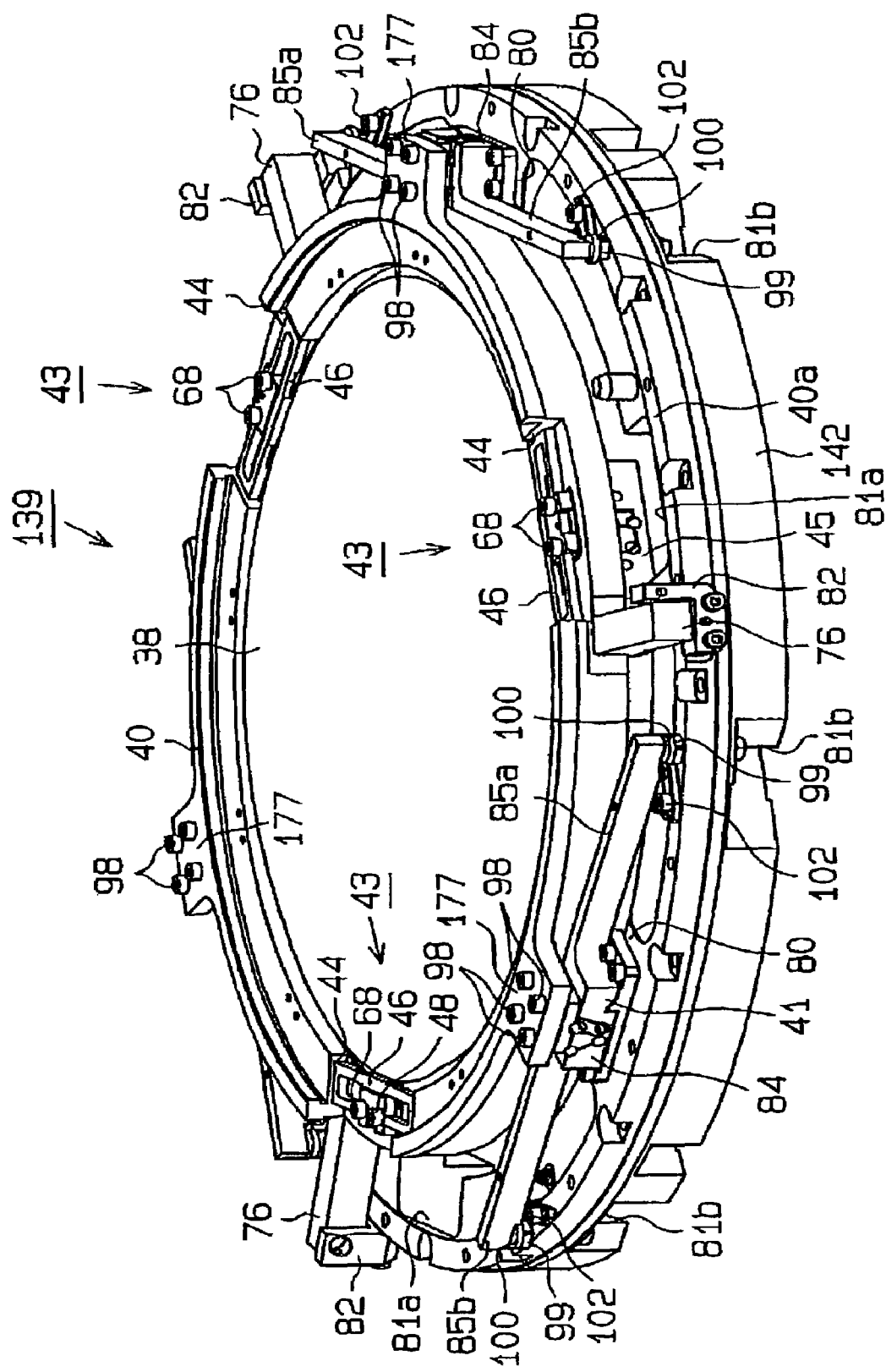
FIG. 23 is a perspective view of an optical element holding apparatus according to a third embodiment of the invention.

In the second embodiment, as shown in FIGS. 21 to 23, a bearing surface 91 of the bearing surface block 50*a* and an action surface 92 of the pad member 47 are formed extending in the tangential direction of the optical element 38.

A housing hole 93 is formed in the centers of the bearing surface 91 and the action surface 92. A contractible adhesive which volume slightly contracts when hardening is charged in the housing hole 93. The flange portion 38*a* of the optical element 38 is connected to the bearing surface 91 and the action surface 92 by the adhesive charged in the housing hole 93. An adhesive charging hole 94 which is connected to the housing hole 93 may be formed in the bottom of the housing hole 93 as shown by the broken lines in FIG. 22.

The optical element holding apparatus 39 of the second embodiment has the following advantages in addition to advantages (1) to (5) and (7) to (11) of the first embodiment.

(12) The bearing surface 91 and the action surface 92 are formed to extend in the tangential direction of the optical element 38.

Therefore, when holding an optical element 38 formed of a glass material, such as fluorite, which has a relatively small fracture strength, the stress resulting from the holding is dispersed. This prevents the optical element 38 from being damaged by concentrated stress.

(13) The housing hole 93, which the adhesive is housed in, is formed in the centers of the bearing surface 91 and the action surface 92.

Accordingly, the adhesive charged in the housing hole 93 connects the flange portion 38*a* of the optical element 38 to the bearing surface 91 and the action surface 92, and the hardening of the adhesive engages the flange portion 38*a* of the optical element 38 with the bearing surface 91 and the action surface 92. In this state, the use of the contractible adhesive prevents the flange portion 38*a* of the optical element 38 from being compressed and holds the optical element 38 in a stable manner.

In the first and second embodiments, the pad members 47 may be omitted and the block 63 may be pressed directly against the flange portion 38*a*. In this case, it is desirable that the press surfaces 65 of the block 63 be flat like the bearing surfaces 49.

In the first embodiment, the bearing surface 49 may be formed on the entire surface of the bearing surface block 50*a* that faces the optical element 38. Alternatively, three or more bearing surfaces 49 may be formed. The press surface 65 of the block 63 may also be formed on the entire surface of the block 63 that faces the optical element 38. Alternatively, three or more press surfaces 65 may be formed.

An elastic member, such as a plate spring or a coil spring, may be used in lieu of the arms 66 of the clamp body 62 to apply pressure to the block 63.

Each weight support mechanism 77 may be a plate spring formed by the abutment portion 78*a* and the support portions 78*b*.

Instead of plating the bearing surfaces 49 and the action surfaces 74 with gold, metal, such as tin, indium, aluminum, or brass, may be applied through metal vapor deposition, plating, welding or the like. The coefficient of friction may be improved by performing etching or grinding to roughen the bearing surfaces 49 and the action surfaces 74.

Third Embodiment

An optical element holding apparatus 139 according to a third embodiment of the present invention will be described below with reference to the accompanying drawings.

Figure 24:
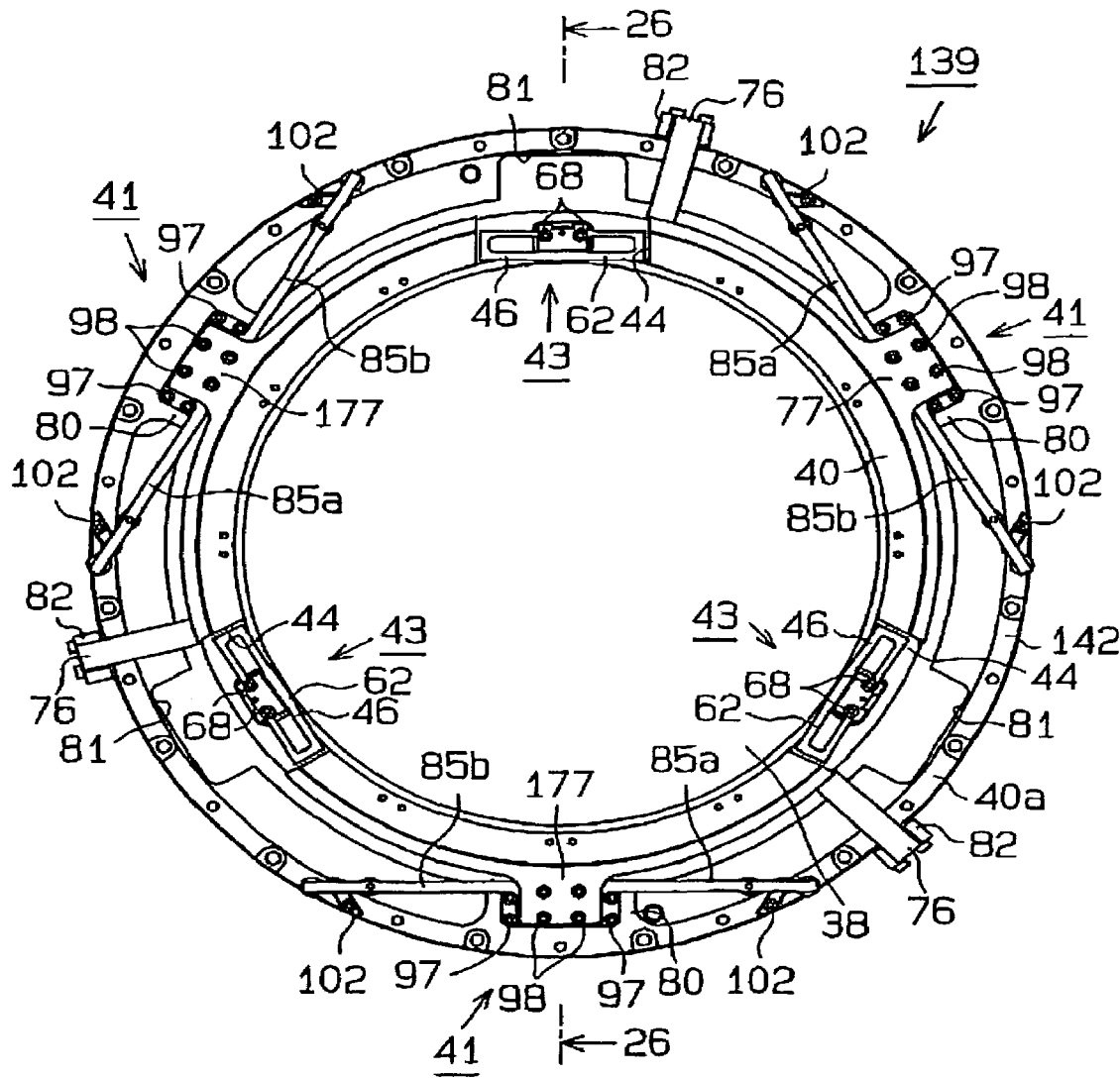
FIG. 24 is a plan view of the optical element holding apparatus in FIG. 23.
Figure 25:
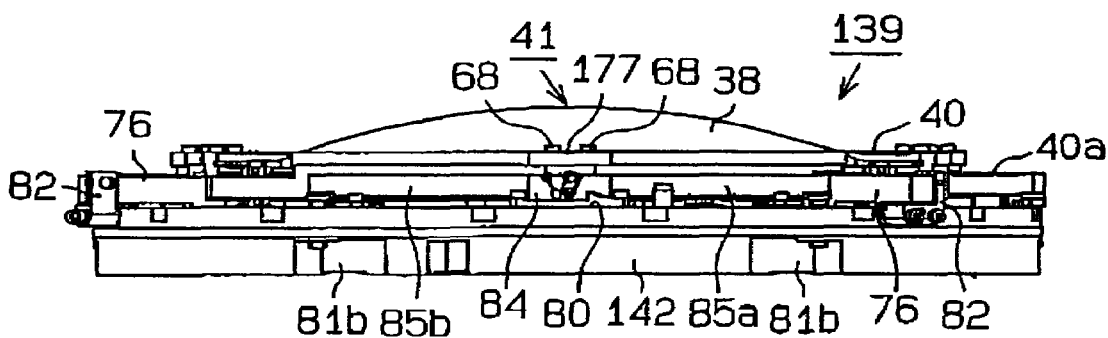
FIG. 25 is a side view of the optical element holding apparatus in FIG. 23.
Figure 26:
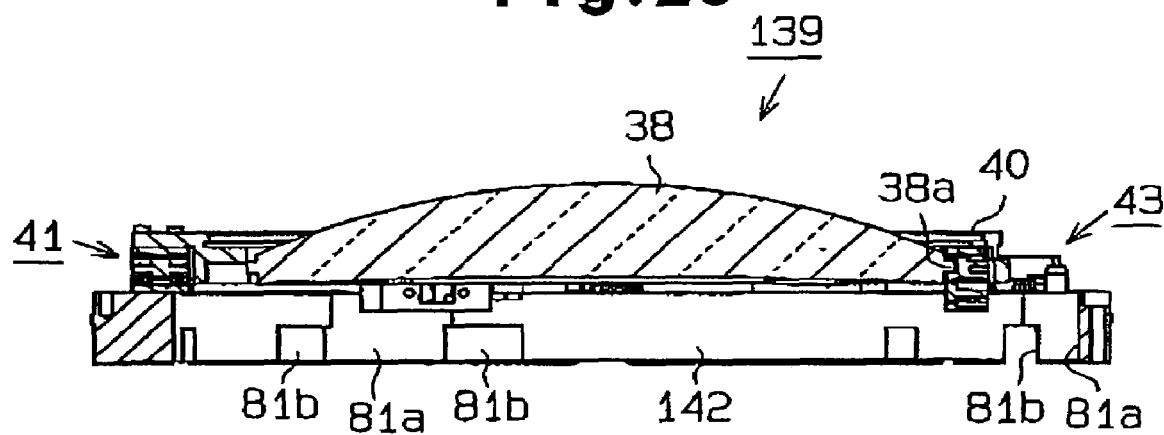
FIG. 26 is a cross-sectional view taken along line 26-26 in FIG. 23.
Figure 27:
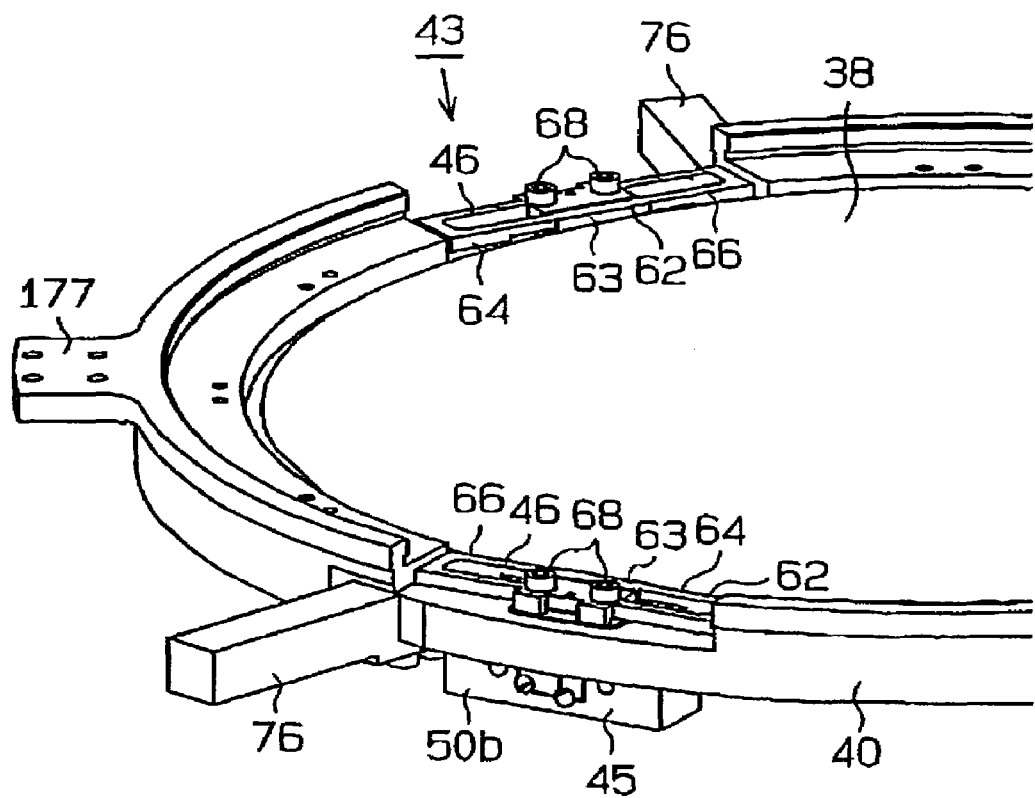
FIG. 27 is a partial, enlarged perspective view showing a lens chamber and a holder of the optical element holding apparatus in FIG. 23.

FIG. 23 is a perspective view of the optical element holding apparatus 139, FIG. 24 is a plan view of the optical element holding apparatus 139, FIG. 25 is a side view of the optical element holding apparatus 139, and FIG. 26 is a cross-sectional view taken along the line 26-26 in FIG. 25. The optical element holding apparatus 139 includes a frame 142, three flexure members 41, a lens frame 40, and holders 43. The three flexure members 41 are fixed to the frame 142 at equiangular distances. The lens frame 40 is fixed to the top surfaces of the flexure members 41, and the three holders 43 are provided on the lens frame 40 at equiangular distances.

Figure 38:
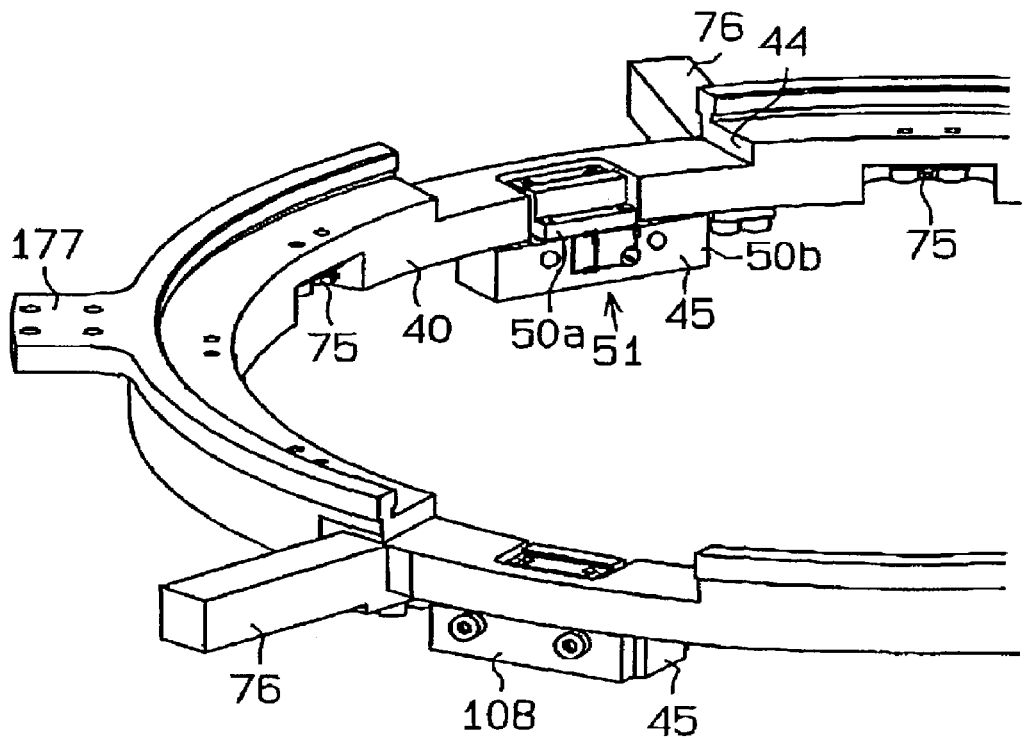
FIG. 38 is a perspective view showing a lens chamber and a base member of the optical element holding apparatus in FIG. 23.
Figure 39:
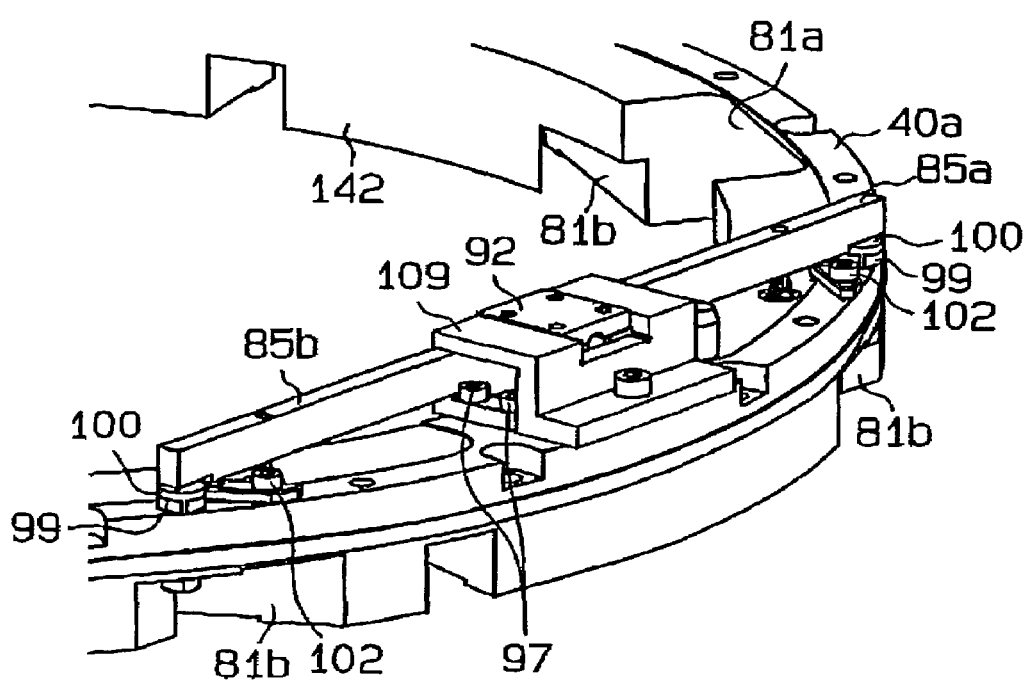
FIG. 39 is a perspective view of the frame and the flexure body of the optical element holding apparatus in FIG. 23.

The structure of the lens frame 40 is similar to that of the lens frame 42 of the optical element holding apparatus 39 discussed in the first and second embodiments but differs from the first and second embodiments in that, as shown in FIG. 38, quadratic prism-like position-detecting projections 76 are formed on the peripheral surface of the lens frame 40 in the vicinity of the attachment grooves 44. Flat flexure junction portions 177 for connecting the flexure members 41 are arranged on the top surface of the lens frame 40 between the adjoining holders 43. The flexure junction portions 177 differ from the above embodiments in that they extend outward from the lens frame 40. The structure of the holder 43 is similar to that of the first and second embodiments.

Figure 28:
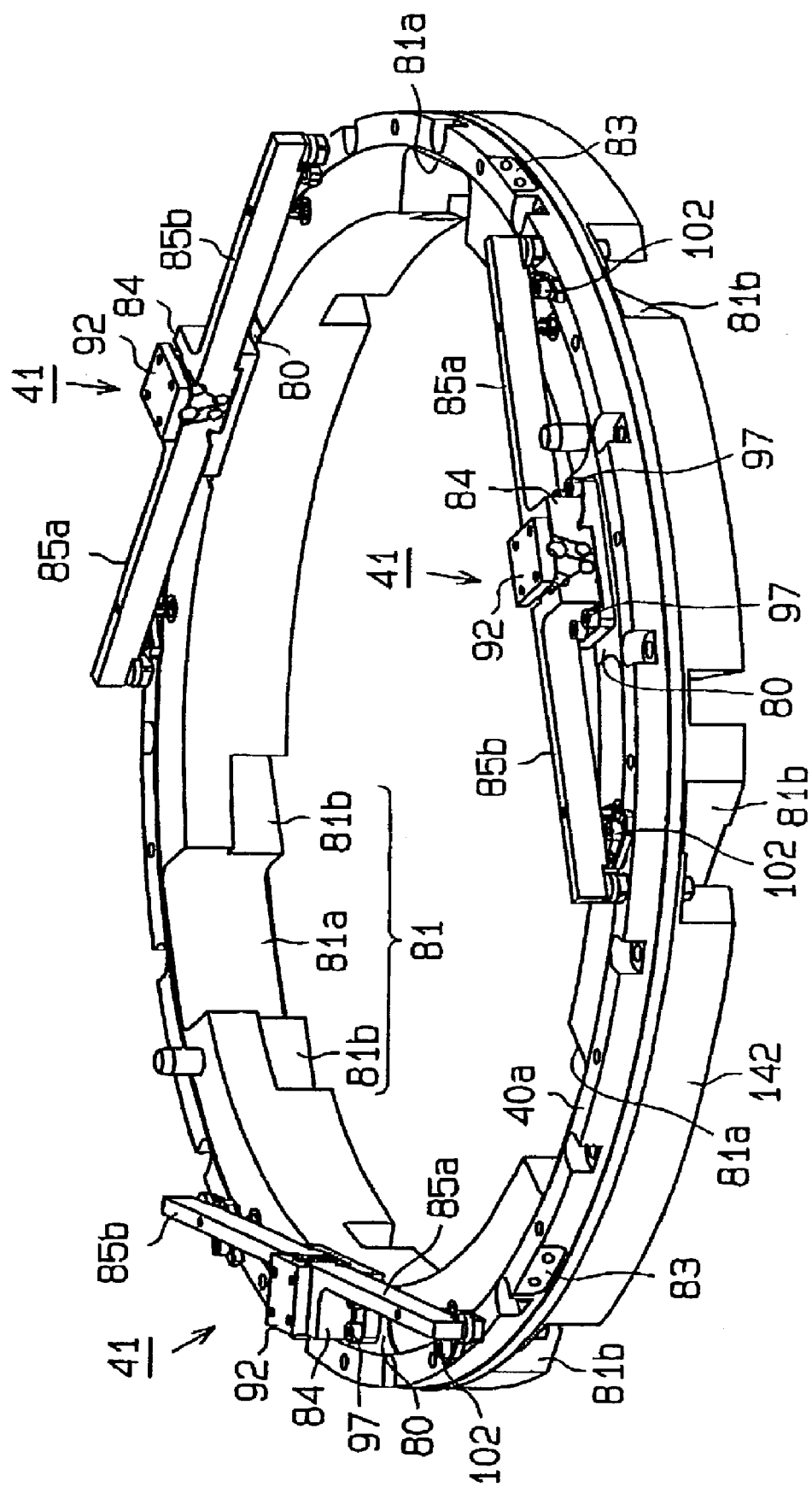
FIG. 28 is a perspective view of a frame of the optical element holding apparatus in FIG. 23.
Figure 29:
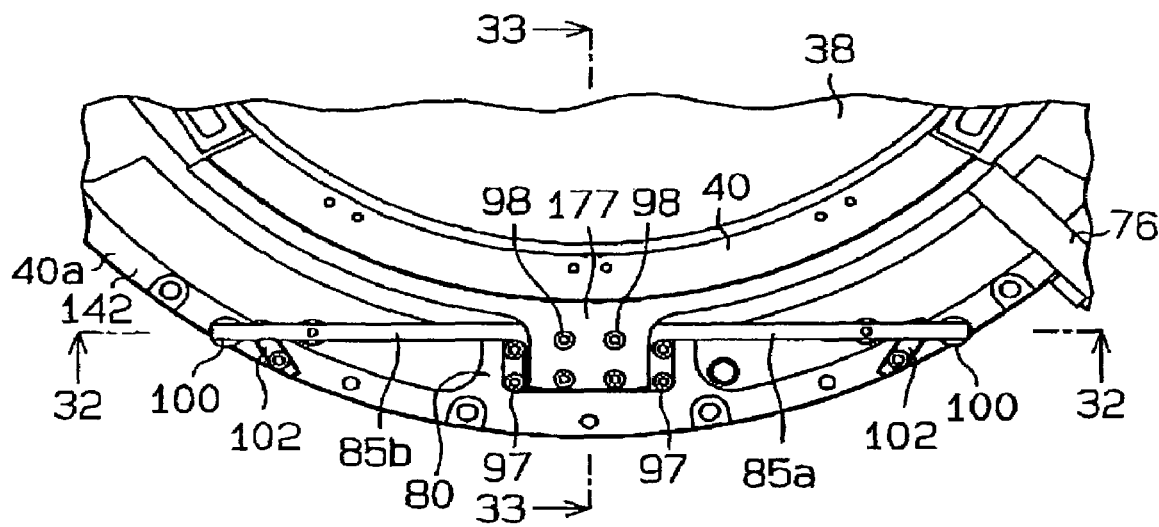
FIG. 29 is a partial, enlarged plan view of the frame of the optical element holding apparatus in FIG. 23.

The structure of the frame 142 will be discussed below referring to FIGS. 28 to 33. FIG. 28 is a perspective view of the frame 142, FIG. 29 is a partly enlarged plan view of the frame 142, and FIG. 32 is a partial enlarged side view of the frame 142.

Figure 30:
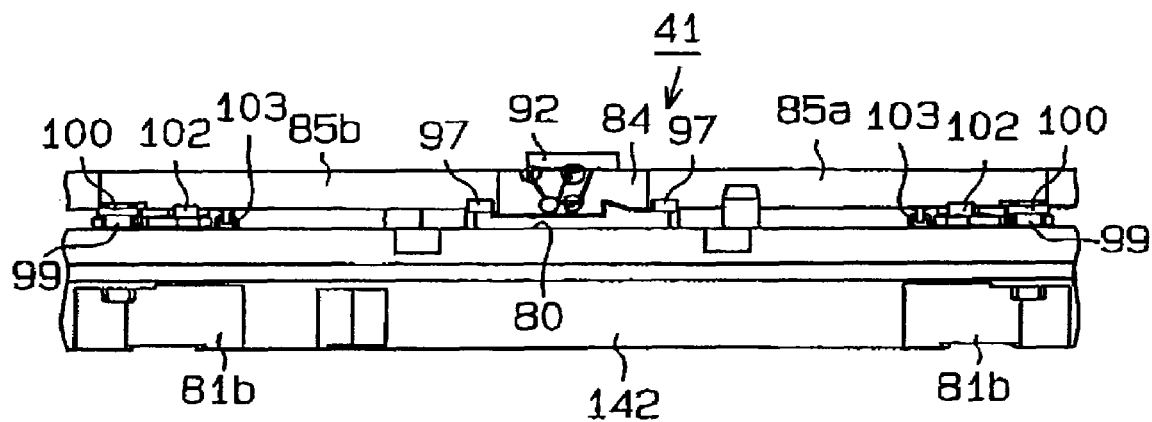
FIG. 30 is a partial, enlarged side view of the frame of the optical element holding apparatus in FIG. 23.

As shown in FIG. 28, the frame 142 is annular and formed of metal, such as steel or aluminum. As shown in FIGS. 28 to 30, three flexure attaching portions 80 for attachment of the flexure members 41 are formed on the top surface of the frame 142 at equiangular distances. Three flexure housing recesses 81, which house the respective flexure members 41 when the frames 142 are superimposed, are formed in each frame 142 between the adjacent flexure attaching portions 80. Each flexure housing recess 81 includes a body housing portion 81*a* for housing an associated flexure body 84 and a lever housing portion 81*b* for housing various drive levers 85*a*, 85*b*. The flexure attaching portions 80 and the flexure housing recesses 81 are formed alternately in the circumferential direction of the frame 142. In other words, the flexure housing recess 81 is formed between adjacent flexure attaching portions 80.

As shown in FIG. 28, attachment seats 83, which receive lens-chamber position detecting mechanisms 82, are formed on the peripheral surface of the frame 142 in the vicinity of the flexure housing recesses 81. The lens-chamber position detecting mechanism 82 (see FIG. 24), which is of, for example, a capacitance detection type and has an L-like shape, is attached to the attachment seat 83. When the lens frame 40 is mounted onto the frame 142 by means of the flexure members 41, the lens-chamber position detecting mechanisms 82 are arranged facing the position-detecting projections 76 of the lens frame 40 with a predetermined distance in between. When the lens frame 40 is moved relative to the frame 142, each position-detecting projection 76 is displaced with respect to the associated lens-chamber position detecting mechanism 82 and the displacement amount is detected by the lens-chamber position detecting mechanism 82.

The flexure member 41 will now be discussed with reference to FIGS. 29 to 33. As shown in FIGS. 28-30, each flexure member 41 includes the flexure body 84, a vertical drive lever 85a, and a horizontal drive lever 85b. The vertical and horizontal drive levers 85a, 85b form part of a displacement member and a transmission portion.

Each flexure body 84 is held between the associated flexure junction portion 177 of the lens frame 40 and the associated flexure attaching portion 80 of the frame 142. The flexure body 84 has a connection block 84a, which fixes the associated flexure junction portion 177 of the lens frame 40 with a bolt 98, and a flexure support block 84b, which includes a connection-block support mechanism 92 for supporting the connection block 84a so that its posture is adjustable.

Figure 31:
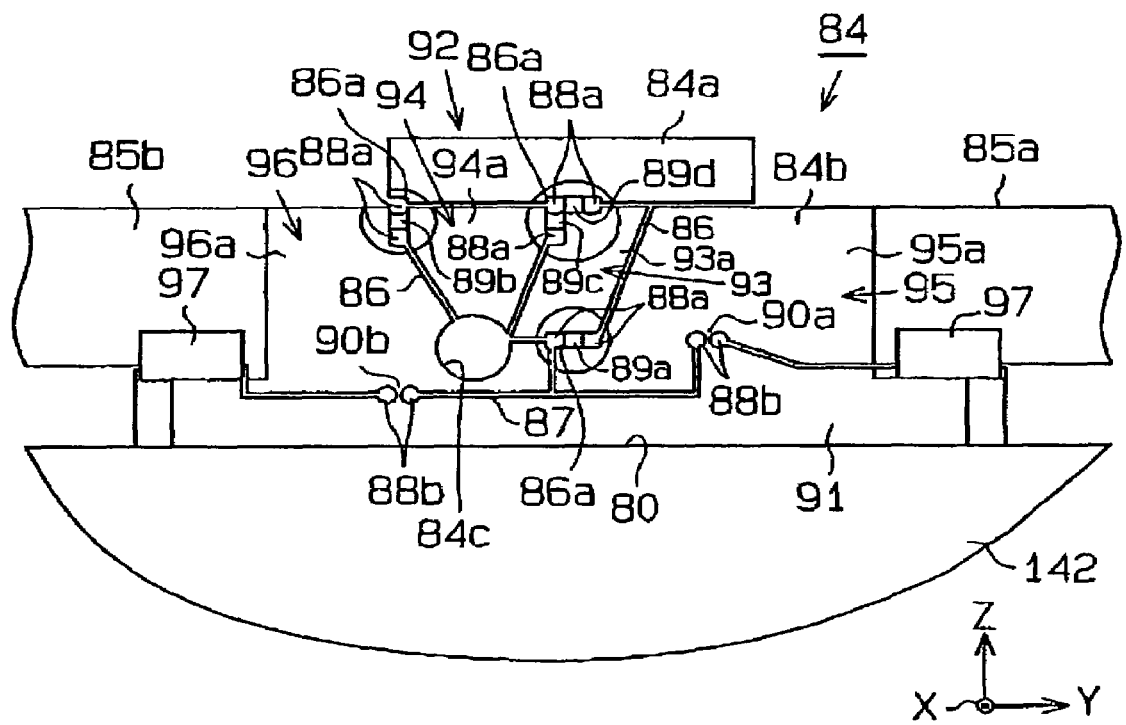
FIG. 31 is a partial, enlarged side view of a flexure body of the optical element holding apparatus in FIG. 23.
Figure 32:
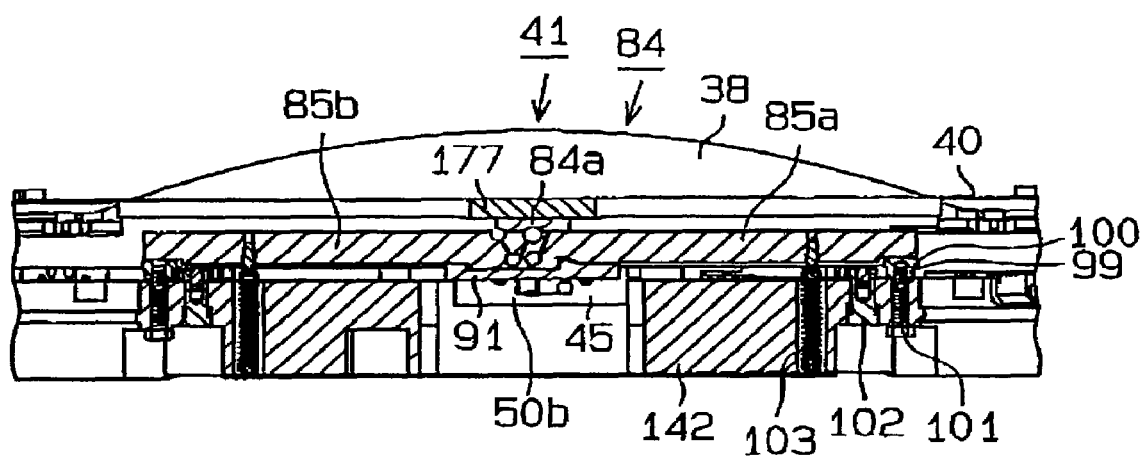
FIG. 32 is a cross-sectional view taken along line 32-32 in FIG. 29.
Figure 33:
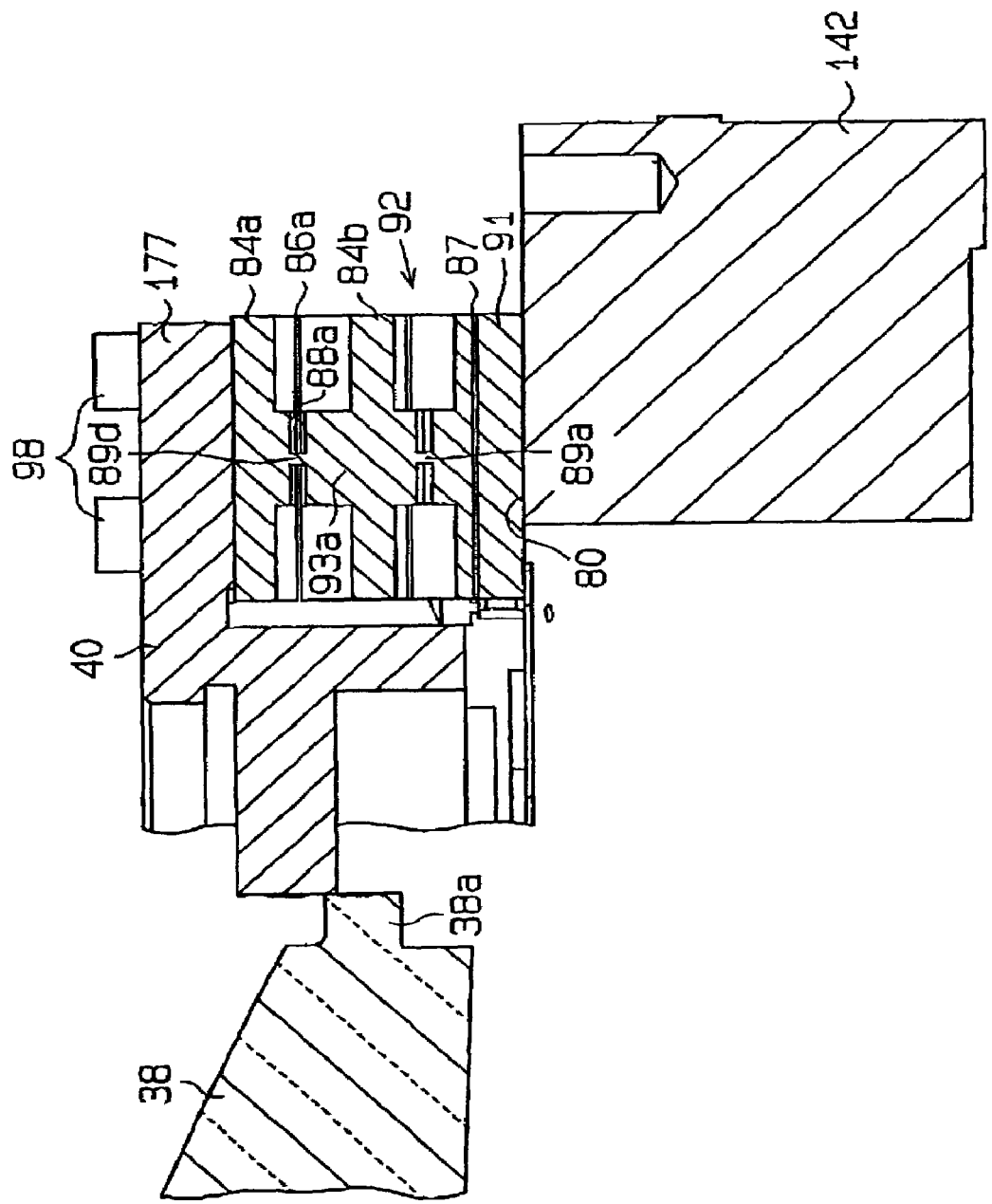
FIG. 33 is a cross-sectional view taken along line 33-33 in FIG. 29.

FIG. 31 is a partial enlarged side view of the attaching portion of the flexure body 84, and FIG. 32 is a cross-sectional view taken along the line 32-32 in FIG. 29. FIG. 33 is a partial enlarged cross-sectional view showing the cross sections of the flexure member 41 and the frame 142.

As shown in FIGS. 31 to 33, each flexure body 84, which has a generally rectangular parallelepiped shape, includes plural first slits 86 and a second slit 87 formed between the connection block 84a and the flexure support block 84b and in the flexure support block 84b. The first slits 86 and second slit 87 extend in the X direction of FIG. 33. A reference hole 84c is formed in the lower portion of the flexure body 84, each first slit 86 is formed above the reference hole 84c, and the second slit 87 is formed below the reference hole 84c. A plurality of flexure neck portions 89a to 89d, which serve as rotational pivots and notch springs are formed between the connection block 84a and the flexure support block 84b and on the flexure support block 84b. The flexure neck portions 89a-89d are formed in the following manner.

First, the slits 86, 87 are formed with non-machined portions left between the adjoining slits 86, 87. Next, the non-machined portions of the first slits 86 are subjected to engraving from the +X direction (toward the top surface of the sheet of FIG. 33) and −X direction (toward the back surface of the sheet of FIG. 33), thus forming engraved portions 86a and the flexure neck portions 89a-89d. The engraved portions 86a are formed on both sides of the flexure neck portions 89a-89d, and each include a rectangular though hole 88a, which extends in the radial direction of the optical element 38. To form the engraved portions 86a and the flexure neck portions 89a-89d, holes larger than the engraved portions 86a and the flexure neck portions 89a-89d are formed in both sides of the flexure support block 84b.

To prevent unpredictable distortion from remaining in the flexure neck portions 89a-89d, both sides of each of the flexure neck portions 89a-89d are formed though the same kind of machining, such as engrave discharging or mechanical machining, in the depth direction of the through holes 88a.

A pair of circular through holes 88b, which extend in the radial direction of the optical element 38, are formed with a predetermined distance provided between two non-machined portions of the second slit 87. First and second thin portions 90a, 90b, which serve as a conversion mechanism and a first notch spring, are formed between the two circular through holes 88b.

The flexure support block 84b is separated into a flexure fixing portion 91, a first restriction block 93a, a second restriction block 94a, a first drive block 95a, and a second drive block 96a by the first and second slits 86, 87. The flexure fixing portion 91 is secured to the flexure attaching portion 80 of the frame 142 by bolts 97 (refer to FIGS. 28 and 29).

The first flexure neck portion 89a connects the first drive block 95a to the first restriction block 93a, the second flexure neck portion 89b connects the second drive block 96a to the second restriction block 94a, the third flexure neck portion 89c connects the first restriction block 93a to the second restriction block 94a, and the fourth flexure neck portion 89d connects the first restriction block 93a to the connection block 84a. The flexure neck portions 89a-89d have square cross sections considerably smaller than the cross sections of the drive blocks 95a and 96a and the connection block 84a.

The first restriction block 93a is fixed to the first drive block 95a and the connection block 84a by the first flexure neck portion 89a and the fourth flexure neck portion 89d. The first flexure neck portion 89a and the fourth flexure neck portion 89d hold the first restriction block 93a rotatable around the Z direction (the optical axis direction of the optical element 38) and restrict its displacement in the Z direction. The first restriction block 93a, the first flexure neck portion 89a, and the fourth flexure neck portion 89d form a vertical restriction link 93, which restricts the displacement of the optical element 38 in the vertical direction (the optical axis direction).

The second restriction block 94a is fixed to the second drive block 96a and the first restriction block 93a by the second flexure neck portion 89b and the third flexure neck portion 89c. The second flexure neck portion 89b and the third flexure neck portion 89c hold the second restriction block 94a rotatable about the Y direction (the tangential direction of the optical element 38) and restrict its displacement in the Y direction. The second restriction block 94a, the second flexure neck portion 89b, and the third flexure neck portion 89c form a horizontal restriction link 94, which restricts the displacement of the optical element 38 in the horizontal direction (the tangential direction).

The restricting direction of the vertical restriction link 93 is substantially perpendicular to the restricting direction of the horizontal restriction link 94. In other words, the rotational axis of the vertical restriction link 93 and the rotational axis of the horizontal restriction link 94 are substantially perpendicular to each other.

The connection block 84a is connected to the flexure support block 84b by means of the fourth flexure neck portion 89d. That is, the connection block 84a is supported by the vertical restriction link 93 and the horizontal restriction link 94.

As shown in FIGS. 31 to 33, the first and fourth flexure neck portions 89a, 89d are located on a line that substantially extends through the center of the connection block 84a and is parallel to the Z axis. The second and third flexure neck portions 89b, 89c are located on a line that is substantially parallel to the surface of the connection block 84a. The third flexure neck portion 89c is located near the fourth flexure neck portion 89d.

In the flexure body 84, the connection block 84a is supported on the first and second drive blocks 95a and 96a by the vertical restriction link 93 and the horizontal restriction link 94 in such a way that the connection block 84a is rotatable in the X direction, Y direction, and Z direction and its displacements in the Y direction and Z direction are restricted. Further, the connection block 84a is supported so that it is displaceable in the X direction by the fourth flexure neck portion 89d.

The first drive block 95a is fixed to the first restriction block 93a by the first flexure neck portion 89a and to the flexure fixing portion 91 by the first thin portion 90a. The first thin portion 90a serves as the conversion mechanism and the first notch spring. The vertical drive lever 85a, which extends in the tangential direction of the optical element 38 is formed integrally on the first drive block 95a. The first thin portion 90a transmits the movement of the vertical drive lever 85a in the optical axis direction (vertical direction) of the optical element 38 to the first flexure neck portion 89a, which serves as a second notch spring. The first drive block 95a, the first flexure neck portion 89a, and the first thin portion 90a form a vertical drive link 95 which transmits the movement of the vertical drive lever 85a in the vertical direction, to the vertical restriction link 93.

The second drive block 96a is connected to the second restriction block 94a by the second flexure neck portion 89b and to the flexure fixing portion 91 by the second thin portion 90b. The horizontal drive lever 85b, which extends in the tangential direction of the optical element 38, is formed integrally on the second drive block 96a. The second thin portion 90b serves as the conversion mechanism and a third notch spring. The second thin portion 90b transmits the movement of the horizontal drive levers 85b in the optical axis direction (vertical direction) of the optical element 38 to the second flexure neck portion 89b, which serves as a fourth notch spring. The second drive block 96a, the second flexure neck portion 89b, and the second thin portion 90b form a horizontal drive link 96, which converts the vertical movement of the horizontal drive lever 85b to a horizontal movement and transmits the horizontal movement to the horizontal restriction link 94.

The first flexure neck portion 89a is located on an imaginary line that extends through the center of the first thin portion 90a and in the tangential direction of the optical element 38. The second flexure neck portion 89b is located on an imaginary line that extends through the center of the second thin portion 90b and in the optical axis direction of the optical element 38.

As shown in FIGS. 28 to 30 and FIG. 32, adjusting washers 99 and adjusting buttons 100 are fixed to the distal ends of the drive levers 85a, 85b in a replaceable manner by replacing members 101 (e.g., bolts and plugs). The adjusting washers 99 and adjusting buttons 100 form moving-amount setting means. A plurality of adjusting washers 99 are prepared beforehand in such a way that the thickness can be adjusted in units of, for example, 1 µm. A plurality of adjusting buttons 100 are prepared beforehand in such a way that the thickness can be adjusted in units of, for example, 10 µm. In other words, the adjusting washers 99 are used for fine adjustment, and the adjusting buttons 100 are used for rough adjustment. The selective combination of the adjusting washers 99 and adjusting buttons 100 adjusts the distances between the drive levers 85a and 85b and the frame 142, thereby setting the amounts of movement of the drive levers 85a and 85b. The drive levers 85a and 85b have predetermined lengths. Thus, the movement amounts of the proximal end portions of the drive levers 85a, 85b are smaller than the movement amounts of the distal end portions.

Lift levers 102, which serve as manipulation portions are provided near the adjusting washers 99 and adjusting buttons 100 and on the top surface of the frame 142 in such a way as to be vertically movable toward and away from the drive levers 85a and 85b. Return springs 103, which are extension springs, are attached between the drive levers 85a, 85b and the frame 142 in the vicinity of the lift levers 102. The return springs 103 urge the drive levers 85a, 85b toward the frame 142 so that when the lift levers 102 are not contacting the drive levers 85a, 85b, the distal ends of the drive levers 85a, 85b contact the top surfaces of the adjusting buttons 100. The drive levers 85a, 85b are separated from the frame 142 against the biasing force of the extension springs by moving the lift lever 102 away from the frame 142, or in an upward direction, while the lift lever 102 is in contact with the drive levers 85a, 85b. This separates the drive levers 85a, 85b from the adjusting buttons 100. The adjusting buttons 100 and the adjusting washers 99 are replaced when the drive levers 85a, 85b are separated from the adjusting button 100 in this manner. After the replacement of the adjusting buttons 100 and the adjusting washers 99 is completed, the lift lever 102 is returned to its original position. This results in the biasing force of the extension springs causing the drive levers 85a, 85b to contact the upper surfaces of the adjusting buttons.

As shown in FIGS. 23 and 28, a connection surface 40a connected with another frame 142 is defined on the frame 142. A plurality of optical element holding apparatuses 139 are superimposed with a phase difference of 180° between one another by the connection surfaces 40a of the frames 142 by means of a space adjusting spacer. In this state, the lens frame 40 of the underlying optical element holding apparatus 139 is housed in the frame 142 of the overlying optical element holding apparatus 139. The flexure members 41 of the underlying optical element holding apparatus 139 are housed in the flexure housing recesses 81 of the frame 142 of the overlying optical element holding apparatus 139.

Figure 35:
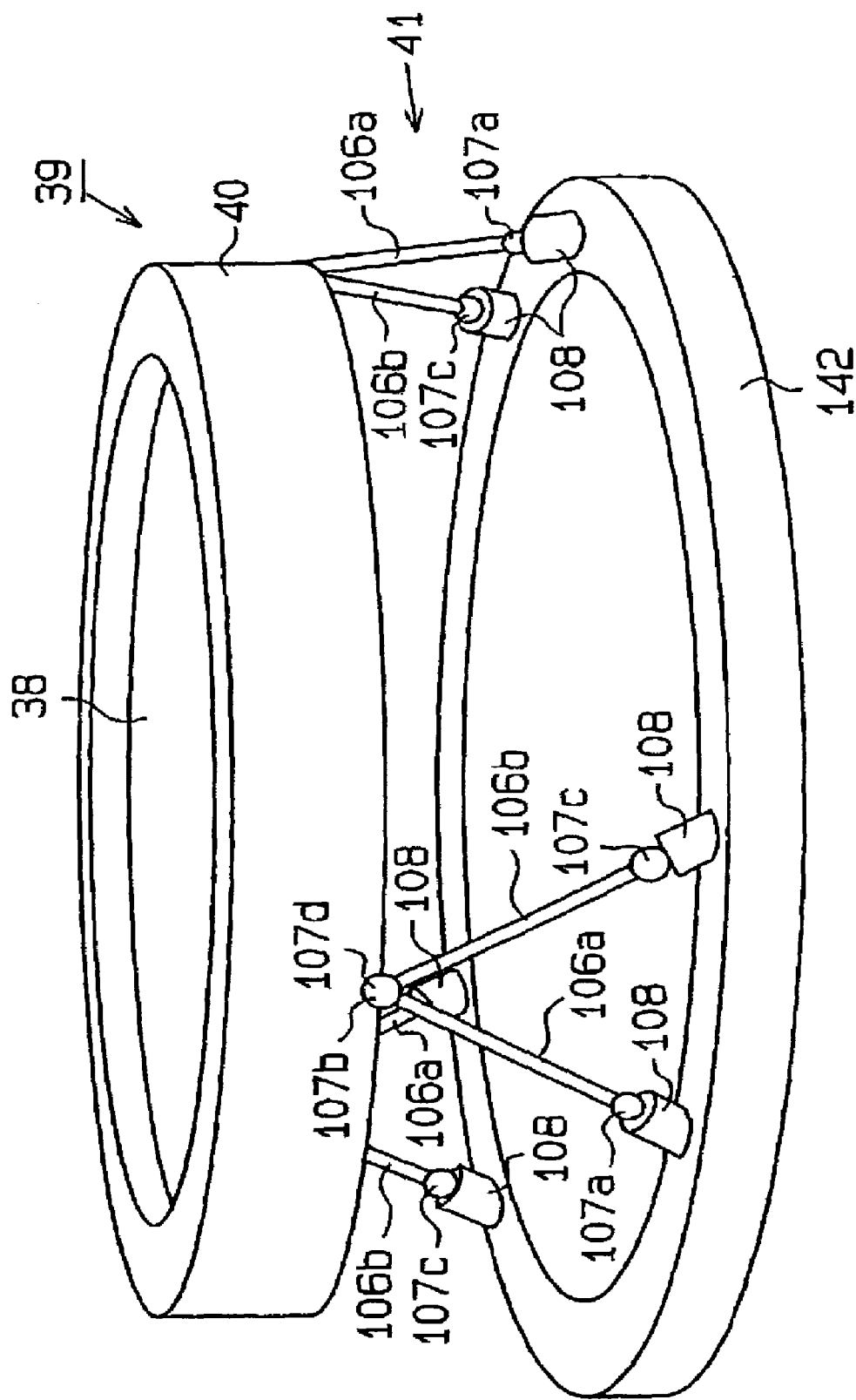
FIG. 35 is an exemplary diagram of the optical element holding apparatus in FIG. 23.

The operation of the optical element holding apparatus 139 will now be discussed. In the optical element holding apparatus 139 of the third embodiment, the lens frame 40, which serve as a support member for supporting an optical element 38, and the frame 142, which serves as a fixing portion for fixing the lens frame 40 to a lens barrel module 37a, are connected by the three flexure members 41. The lens barrel module 37a refers to the other superimposed frames 142. Another mode of the flexure member 41 of the optical element holding apparatus 139 is shown in FIG. 35. As shown in FIG. 35, each flexure member 41 has two rigid bodies 106a, 106b, rotational pivots 107a, 107b provided on the two ends of the rigid body 106b, and rotational pivots 107c, 107d provided on the two ends of the rigid body 106a. In other words, the entire optical element holding apparatus 139 includes six rigid bodies and rotational pivots provided on the two ends of each rigid body. The rotation in three directions refers to the rotations about an axis extending through the longitudinal direction of each rigid body 106 and two axes perpendicular to the axis and to each other.

Further, the rigid bodies 106a, 106b are arranged so that when a straight line connects the rotational pivots 107a, 107b of the rigid body 106a and a straight line connects the rotational pivots 107c, 107d of the rigid body 106b (in the present embodiment, there are six straight lines since there are three combinations of the rigid bodies 106a, 106b), three or more straight lines do not intersect the same point. Since the rotational pivot 107b at one end of the rigid body 106a and the rotational pivot 107d of the rigid body 107d are arranged in the vicinity of each other, it seems as a whole that the rotational pivots 107b, 107d are integral. In other words, the two rigid bodies 106a, 107b share the same rotational pivot.

Further, a position adjusting mechanism 108, which serves as a distance adjusting mechanism for adjusting the positions of the rigid bodies 106a, 106b relative to the frame 142, is arranged at the other end of each of the rigid bodies 106a, 106b. The position adjusting mechanism 108 displaces the positions of the end portions of each rigid body to adjust the distance between the frame 142 and the lens frame 40.

When comparing the third embodiment with the above embodiments, the rigid body 106a corresponds to the second restriction block 94a and the rigid body 106b corresponds to the first restriction block 94b. Further, the rotational pivot 107a corresponds to the second flexure neck portion 89b, the rotational pivot 107b corresponds to the second flexure neck portion 89a, the rotational pivot 107c corresponds to the second flexure neck portion 89c, and rotational pivot 107d corresponds to the second flexure neck portion 89d. The third flexure neck portion 89c at one end of the second restriction block 94a is connected to the vicinity of the fourth flexure neck portion 89d at one end of the first restriction block 93a. Thus, as a whole, the two flexure neck portions 89c, 89d appears as integral rotational pivots 107b, 107d. Further, the position adjusting mechanism 108 corresponds to the adjusting washers 99, the adjusting buttons 100, the vertical drive levers 85a, the horizontal drive levers 85b, the first drive block 95a, and the second drive block 96a.

For designing reasons, the displacement direction of each restriction block 93a, 94a is vertical or lateral and differs from the diagonal direction of the two rigid bodies in the above model but are substantially the same when combined.

Figure 36:
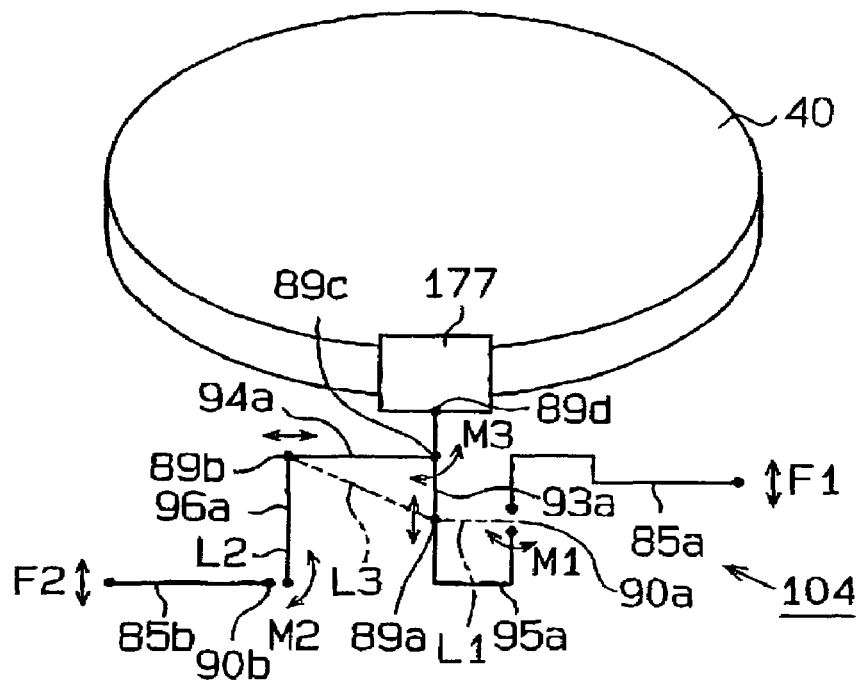
FIG. 36 is a schematic diagram of the optical element holding apparatus in FIG. 23.

The operation of the optical element holding apparatus 139 will now be discussed in detail. FIG. 36 exemplarily shows only the link mechanism 104 of a single flexure body 84.

When the tip end portion of the vertical drive lever 85a is actuated in the vertical direction by a predetermined drive force F1, the first thin portion 90a converts the drive force to a rotating moment M1 about the radial axis of the optical element 38. The rotating moment M1 is converted to linear drive force in the vertical direction of the first flexure neck portion 89a on the extension of a center line L1 of the first thin portion 90a via the first drive block 95a. The linear drive force is transmitted to the connection block 84a by means of the first restriction block 93a and the fourth flexure neck portion 89d. This moves the optical element 38 in the lens frame 40 in the optical axis direction.

Next, when the tip end portion of the horizontal drive levers 85b is actuated in the vertical direction by a predetermined drive force F2, the second thin portion 90b converts the drive force to a rotating moment M2 about the radial axis of the optical element 38. The rotating moment M2 is converted to linear drive force in the horizontal direction of the second flexure neck portion 89b positioned on the extension of a center line L2 of the second thin portion 90b via the second drive block 96a. The linear drive force is transmitted to the connection block 84a by means of the second restriction block 94a, the third flexure neck portion 89c, and the fourth flexure neck portion 89d. This moves the optical element 38 in the lens frame 40 in the tangential direction.

When the tip end portions of the drive levers 85a, 85b are driven in the vertical direction by the predetermined drive forces F1, F2, the two drive forces are synthesized by the restriction links 93 and 94 and the third flexure neck portion 89c. A polar coordinate R-θ-Z system in which the optical axis of the optical element 38 is the Z axis will now be discussed. The θ coordinate and Z coordinate of the third flexure neck portion 89c change in accordance with the movements of the drive levers 85a and 85b. As the movements of the third flexure neck portion 89c in the X and Y directions are restricted by the restriction links 93 and 94, the third flexure neck portion 89c can slightly rotate about a line L3, which connects the first flexure neck portion 89a to the second flexure neck portion 89b. That is, the third flexure neck portion 89c has some degree of freedom to move in the direction of the R coordinate (the radial direction of the optical element 38). Therefore, the parallel shifts of the polar coordinates θ and Z of the third flexure neck portion 89c that is a fixed point with respect to the lens frame 40 are restricted to a predetermined position and the parallel shift of the polar coordinate R is permitted. Since the third flexure neck portion 89c is a rotational pivot, the third flexure neck portion 89c is free to rotate about the polar coordinates R, θ, and Z.

The aforementioned movements and restrictions independently occur on each of the three flexure bodies 84. Therefore, the freedom of the three fixed points (the third flexure neck portions 89c) in two directions is restricted. That is, the posture (six degrees of freedom) of the lens frame 40 is restricted based on the mechanics. As the posture of the lens frame 40 corresponds 1:1 to the movement amounts of the drive levers 85a, 85b, the posture of the optical element 38 held in the lens frame 40 can be adjusted freely without applying excessive force and distortion to the optical element 38.

The lens frame 40 is supported in the frame 142 by the individual flexure members 41 in a kinematical manner. A polar coordinate system R-Q-Z, in which the center of the optical element 38 is the origin, the optical-axial direction of the optical element 38 is the Z axis, the radial direction of the optical element 38 is the R axis, and the circumferential direction of the optical element 38 is the Q axis, will now be discussed. In each link mechanism 104, the third flexure neck portion 89c is displaceable in the directions of the R, Q and Z axes within predetermined ranges. Further, the lens frame 40 can be tilted in an arbitrary direction with respect to the frame 142 by properly changing the height of the third flexure neck portion 89c in each link mechanism 104 from the frame 142. The lens frame 40 is therefore supported on the frame 142 in such a way as to be movable in the directions of the R, Q, and Z axes and rotatable around the R axis, the Q axis, and the Z axis.

Figure 37:
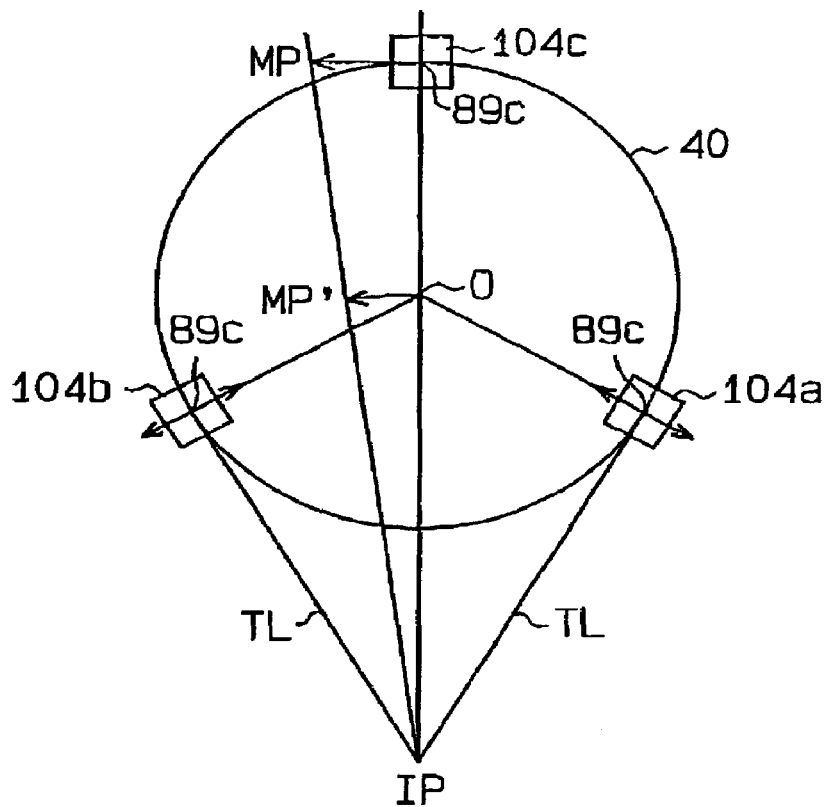
FIG. 37 is a diagram explaining parallel movement of an optical element.

An example in which the optical element 38 is moved within a plane perpendicular to its optical axis by the three link mechanisms 104 will now be discussed with reference to FIG. 37. If the third flexure neck portion 89c of a link mechanism 104c is moved to a point MP by a predetermined distance, in accordance with the movement, the center O of the lens frame 40 moves by a distance of ⅔ of the predetermined distance of the link mechanism 104c around an intersection IP of tangential lines TL of the third flexure neck portions 89c of link mechanisms 104a, 104b.

This is because of the following reasons. The positional relationship of four points, namely, the center O of the lens frame 40, the third flexure neck portions 89c of the link mechanisms 104a, 104b, and the intersection IP of the tangential lines TL will now be discussed. The four points form two right triangles, which have interior angles of 30°, 60° and 90° and are congruent with each other. When the distance (radius) between the center O of the lens frame 40 and each third flexure neck portion 89c is set to 1, the distance between the center O of the lens frame 40 and the intersection IP is twice the radius. Thus, the distance between the intersection IP and the third flexure neck portion 89c of the link mechanism 104c is three times the radius. Therefore, the center O of the optical element 38 moves to a point MP' by a distance of ⅔ of the moving distance of the third flexure neck portion 89c of the link mechanism 104c.

A description will now be given of the procedures for assembling the optical element holding apparatus 139.

First, as shown in FIG. 38, the base members 45 of the holders 43 are fastened to the surface of the lens frame 40 opposite to the attachment grooves 44 by bolts, which are not shown. The bearing surface block support mechanisms 51 of the base members 45 are temporarily secured to the base members 45 by sandwich members 108. Each sandwich member 108 prevents a load from being unintentionally applied to the restriction links 57, 58 and the neck portions 55a-55d of the associated bearing surface block support mechanism 51 until the optical element 38 is mounted.

Next, the optical element 38 is housed in the lens frame 40 and the flange portion 38a of the optical element 38 is placed on the bearing surfaces 49 of the bearing surface blocks 50a of the base members 45. The optical element 38 is positioned with respect to the lens frame 40 using a centering machine, and the pad members 47 and the clamp members 46 are fastened to the attachment portions 59 of the base members 45 by the bolts 68. As a result, the flange portion 38a of the optical element 38 is held between the bearing surfaces 49 and the press surfaces 65. Then, the sandwich members 108 are separated from the base members 45 and the postures of the bearing surface blocks 50a are adjusted in accordance with the shape of the flange portion 38a of the optical element 38 by operating the bearing surface block support mechanisms 51. This holds the optical element 38 in a stable state.

Next, the optical surface of the optical element 38 is inspected. When the inspection shows a change in the optical surface that is greater than a predetermined value, the bearing surface block support mechanisms 51 are temporarily secured by the sandwich members 108 again and the mounting of the optical element 38 is performed again.

Then, the flexure bodies 84 are securely fastened to the flexure attaching portions 80 by the bolts 97, as shown in FIG. 28. Then, shoulder pad members 109 are attached in such a way as to sandwich the connection blocks 84a of the flexure bodies 84. Each shoulder pad member 109 prevents a load from being unintentionally applied to the restriction links 93, 94, the drive links 95, 96, the flexure neck portions 89a-89d, and the thin portions 90a, 90b of the associated flexure body 84 until the lens frame 40 is assembled.

Next, the flexure junction portions 177 are fastened to the connection blocks 84a of the flexure bodies 84 by the bolts 98 to temporarily fix the lens frame 40 on the frame 142. In this state, the frame 142 is placed on the centering machine and rotated during which the vibration of the optical axis of the optical element 38 is observed. Based on the observation results, the bolts 98 are loosened to adjust the position of the lens frame 40 after which the lens frame 40 is temporarily secured again by the bolts 98. This adjustment is repeated until the vibration of the optical axis of the optical element 38 becomes subtle. When the vibration of the optical axis of the optical element 38 is substantially eliminated, the bolts 98 are fully fastened to fix the lens frame 40 onto the frame 142 by means of the flexure bodies 84.

Then, the shoulder pad members 109 are removed. This obtains in the optical element holding apparatus 139 of FIG. 24. The frame 142 is rotated on the centering machine again in this state and the table of the centering machine is shifted in parallel or tilted to completely eliminate the vibrations of the optical axis of the optical element 38. In this state, the amount of eccentricity of the outside diameter of the lens frame 40 and the amount of inclination of the end face thereof that are detected by the centering machine are recorded. Using those pieces of information, the combination of the number of the adjusting washers 99 and the number of the adjusting buttons 100 that eliminates the eccentricity amount and the inclination amount is computed by a computer based on a special software program. Based on the computation results, the adjusting washers 99 and the adjusting buttons 100 are selectively attached. Finally, the entire assembly is rotated by the centering machine and the vibration of the optical axis of the optical element 38 is checked again.

Figure 34:
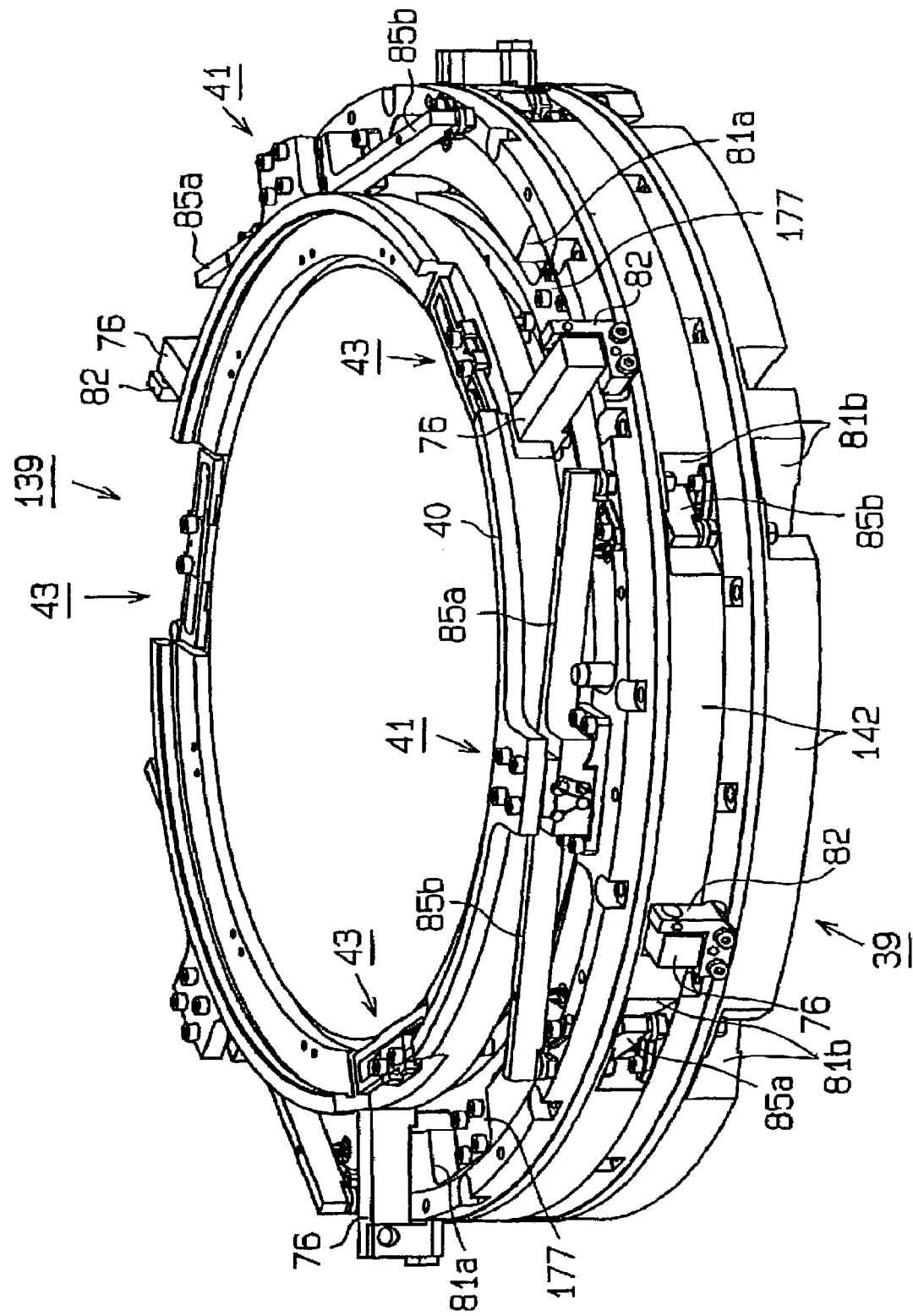
FIG. 34 is a perspective view showing the optical element holding apparatuses in FIG. 23 in a superimposed state.

Then, the lens barrel 37 is assembled by superimposing multiple optical element holding apparatuses 139 with phases offset from one another by 180°, as shown in FIG. 34.

The optical element holding apparatus 139 of the third embodiment has the following advantages.

(1) The lens frame 40, which holds the optical element 38, and the frame 142 are connected by means of the three flexure bodies 84. Each flexure body 84 is provided with the drive levers 85a, 85b that produce three movements in a coordinate system, which uses the center of the optical element 38 as an origin, the optical axis direction of the optical element 38 as the Z axis, the radial axis as the R axis, and the circumferential direction as the Q axis, and rotations about the three coordinate axes R, Q, and Z.

When predetermined drive forces are applied to the drive levers 85a, 85b, each flexure body 84 functions to give the optical element 38 six degrees of freedom of motion or the three movements along the coordinate axes R, Q, and Z and three rotations around the three axes R, Q, and Z. That is, the optical element 38 is held in a kinematical manner. Therefore, the flexure bodies 84 function to finely adjust the posture of the optical element 38 and easily and accurately position the optical element 38 without having to perform accurate machining.

(2) The three flexure bodies 84 are arranged at equiangular distances around the optical element 38. The positioning of the three flexure bodies 84 simplifies the structure for positioning the optical element 38 and holds the optical element 38 in a stable state.

(3) Each of the three flexure bodies 84 has the flexure fixing portion 91, which is fixed to the frame 142, and the connection block 84a, which is connected to the lens frame 40. The vertical restriction link 93 and the horizontal restriction link 94 are provided to restrict the movements of the flexure fixing portion 91 and the connection block 84a in different directions (the vertical direction and horizontal direction) and to support the flexure fixing portion 91 and the connection block 84a in a manner rotatable in different directions. The flexure fixing portion 91 and the restriction links 93 and 94 provide the connection block 84a with six degree of freedom of motion. This structure permits the optical element 38 to be positioned easily and accurately.

(4) The horizontal restriction link 94 restricts the horizontal movement of the flexure fixing portion 91 and the connection block 84a and supports the flexure fixing portion 91 and the connection block 84a rotatable in the horizontal direction. The vertical restriction link 93 restricts the vertical movement of the flexure fixing portion 91 and the connection block 84a and supports the flexure fixing portion 91 and the connection block 84a rotatable in the vertical direction. The link mechanism formed by the horizontal restriction link 94 and the vertical restriction link 93 simplify the structure of the flexure body 84.

(5) The flexure fixing portion 91 and the connection block 84a are coupled to the restriction links 93, 94 by the flexure neck portions 89a-89d. This transmits the movement of the restriction links 93, 94 to the flexure fixing portion 91 and the connection block 84a with a simple structure.

(6) The drive force in the vertical direction applied to the horizontal drive lever 85b is converted to the horizontal drive force by the conversion mechanism, which includes the second thin portion 90b and the second flexure neck portion 89b. This increases the degree of freedom of design of the flexure body 84. The vertical movement outside the flexure body 84 moves the optical element 38 horizontally. When the optical element 38 is housed in the lens frame 40, therefore, the conversion mechanism is particularly effective.

(7) The drive force in the vertical direction applied to the vertical drive lever 85a is converted to the drive force in the vertical direction by the conversion mechanism, which includes the first thin portion 90a and the first flexure neck portion 89a. The vertical movement outside the flexure body 84 vertically moves the optical element 38. When the optical element 38 is housed in the lens frame 40, therefore, the conversion mechanism is particularly effective.

(8) The flexure fixing portion 91, the connection block 84a, and the restriction links 93, 94 are formed by a single member. The restriction links 93, 94 are coupled to the flexure fixing portion 91 and the connection block 84a by the neck portions. This forms the link mechanism with a simple structure without increasing the number of components.

(9) The first thin portion 90a and the first flexure neck portion 89a are arranged on the same horizontal plane. When a drive force is applied to the vertical drive lever 85a, this arrangement prevents the rotational moment from being produced at the first flexure neck portion 89a so that the vertical drive force is accurately converted to the vertical drive force of the optical element 38.

(10) The second thin portion 90b and the second flexure neck portion 89b are arranged on the same vertical plane. When a drive force is applied to the horizontal drive lever 85b, this arrangement prevents the rotational moment from being produced at the second flexure neck portion 89b so that the vertical drive force is accurately converted to the horizontal drive force of the optical element 38.

(11) Since a movement amount that is less than the movement amount at the tip ends of the drive levers 85a, 85b is transmitted to the link mechanism of the flexure body 84, fine movement of the optical element 38 is possible. In accordance with the reduction in the movement amount, the movement amount of the optical element 38 is accurately controlled.

(12) The movement amounts of the drive levers 85a, 85b are adjusted by the adjusting washers 99 and the adjusting buttons 100. Therefore, the movement amounts of the drive levers 85a and 85b do not change, and the position of the optical element 38 is accurately controlled.

(13) The adjusting washers 99 and the adjusting buttons 100 are arranged between the drive levers 85a, 85b and the frame 142. The distance between the drive levers 85a, 85b and the frame 142 (i.e., the movement amounts of the drive levers 85a, 85b) are adjusted by the quantity of the adjusting washers 99 and adjusting buttons 100. This accurately controls the position of the optical element 38 with a simple structure.

(14) The optical element 38 is moved in its tangential direction by operating the horizontal drive lever 85b, and the optical element 38 is moved in the optical axis direction by operating the vertical drive lever 85a. Operating the two drive levers 85a, 85b thus easily and accurately controls the posture of the optical element 38.

(15) The flexure bodies 84 are arranged between adjacent bearing surface blocks 50a. This arrangement makes the optical element holding apparatus 139 compact.

(16) The rotational pivots that connect the restriction links 93, 94 are the flexure neck portions 89a-89d that have relatively small cross-sectional areas. This structure forms the flexure fixing portion 91, the connection block 84a, and the restriction links 93, 94 with an integral member by a simple structure.

(17) The drive levers 85a, 85b are urged toward the frame 142 by the return springs 103. Contact of the drive levers 85a, 85b with the adjusting buttons 100, which result from the urging forces of the return springs 103, determines the positions of the drive levers 85a, 85b. That is, the positions of the drive levers 85a and 85b are determined by the thickness of the adjusting washers 99 and the adjusting buttons 100. The adjusting washers 99 and the adjusting buttons 100 enable the positions of the drive levers 85a, 85b to be set more accurately compared to when the positions of the drive levers are determined by the meshed amount of screws.

(18) The flexure housing recesses 81, which house the flexure bodies 84 of another optical element holding apparatus 139, are provided between the adjoining flexure bodies 84. This structure makes the superimposed optical element holding apparatuses 139 smaller.

(19) The flexure housing recesses 81 are arranged at positions shifted by 180° with respect to the associated flexure bodies 84. Thus, by superimposing multiple optical element holding apparatuses 139 in a state shifted from one another by 180°, the superimposed optical element holding apparatuses 139 become compact.

(20) The connection surface 40a, which is connected to the frame 142 of another optical element holding apparatus 139, is defined on the end face of the frame 142. The arrangement of the space adjusting spacer between the connection surfaces 40a enables the adjustment of the positions of the optical element holding apparatuses 139 relative to each other. That is, the space adjusting spacer enables rough adjustment of the positions of the optical element held by the optical element holding apparatuses 139. Afterward, the drive levers 85a, 85b of the optical element holding apparatuses 139 are driven and the thickness of the adjusting washers and the adjusting buttons is changed to move the optical element to a target position. The space adjusting spacer may be annular so that its shape is generally the same as the connection surfaces. The spacer may also be divided into a number of portions (e.g., washers) to be arranged at a plurality of locations on the connection surfaces.

(21) In each lens barrel module 420, a plurality of optical elements 38 are held by the optical element holding apparatuses 139. The optical elements 38 in each lens barrel module 420 are accurately positioned, thus improving the imaging performance of the entire lens barrel 37.

(22) The exposure apparatus 31 performs exposure using the projection optical system 35 that includes the lens barrel 37, in which the optical element 38 is held by the optical element holding apparatus 139. This improves the imaging performance of the projection optical system 35 and improves the exposure accuracy.

(23) In the exposure apparatus 31, the drive levers 85a, 85b, which drive the flexure member 41, is arranged between the lens frame 40, which supports the optical element 38, and the frame 142. Thus, the actuation of the drive levers 85a, 85b enables the movement of the optical element 38 with the six degrees of freedom of motion. Accordingly, the frame 142 and the lens frame 40 do not have to be machined accurately, and the positioning of the optical element 38 is performed easily and accurately.

(24) In the exposure apparatus 31, the three flexure members 41 each have the first restriction block 93a and the second restriction block 94a, which are rigid bodies having a predetermined length. The lens frame 40 is supported on the frame 142 by six rigid bodies in total. In addition, each rigid body has the six degrees of freedom of motion. This enables precession relative to the frame 142. Thus, the optical element supported by the lens frame 40 may be supported in a kinematical manner in a three-coordinate axis system R-θ-Z, the center of which is the origin, the radial direction of which is R, the circumferential direction of which is θ, and the optical axis direction of which is Z.

(25) In the exposure apparatus 31, the flexure member 41 has the position adjusting mechanism 108, which adjusts the distance between the lens frame 40 and the frame 142. The adjustment of the distance between the lens frame 40 and the frame 142 enlarges the movement range of the optical element 38. The usage of this to correct the residual aberration significantly improves the imaging performance of the projection optical system 35 and improves the exposure accuracy of the exposure apparatus 31.

(26) In the exposure apparatus 31, the drive levers 85a, 85b, which are attached to the drive levers 85a, 85b of the flexure body 84 of the three flexure members 41, are displaced to displace the flexure body 84. The displacement of the flexure body 84 positions the optical element 38. By using the flexure members 41 to move the optical element 38, unpredicted distortion is prevented from occurring in the optical element 38. Accordingly, the optical element 38 may accurately be moved while maintaining the accuracy of the optical element 38.

(27) When a certain object is held on a predetermined fixed portion by six rigid bodies in a kinematical manner, a kinematical unique point is produced when three or more extension lines of the six rigid bodies intersect at the same point. The object is held in an unstable manner at the unique point causing accurate positioning of the object to be difficult. In comparison, in the exposure apparatus 31, presuming that six lines connect the flexure neck portions 89a-89d at the two ends of each restriction block 93a, 94a, which define the rigid body of each flexure member 41, three or more lines do not intersect at the same point. Thus, the positioning of the optical element 38 is performed without producing a kinematical unique point.

Fourth Embodiment

An optical element holding apparatus according to a fourth embodiment of the present invention will now be discussed with reference to FIGS. 40-42 centering on parts differing from the first embodiment.

Figure 40:
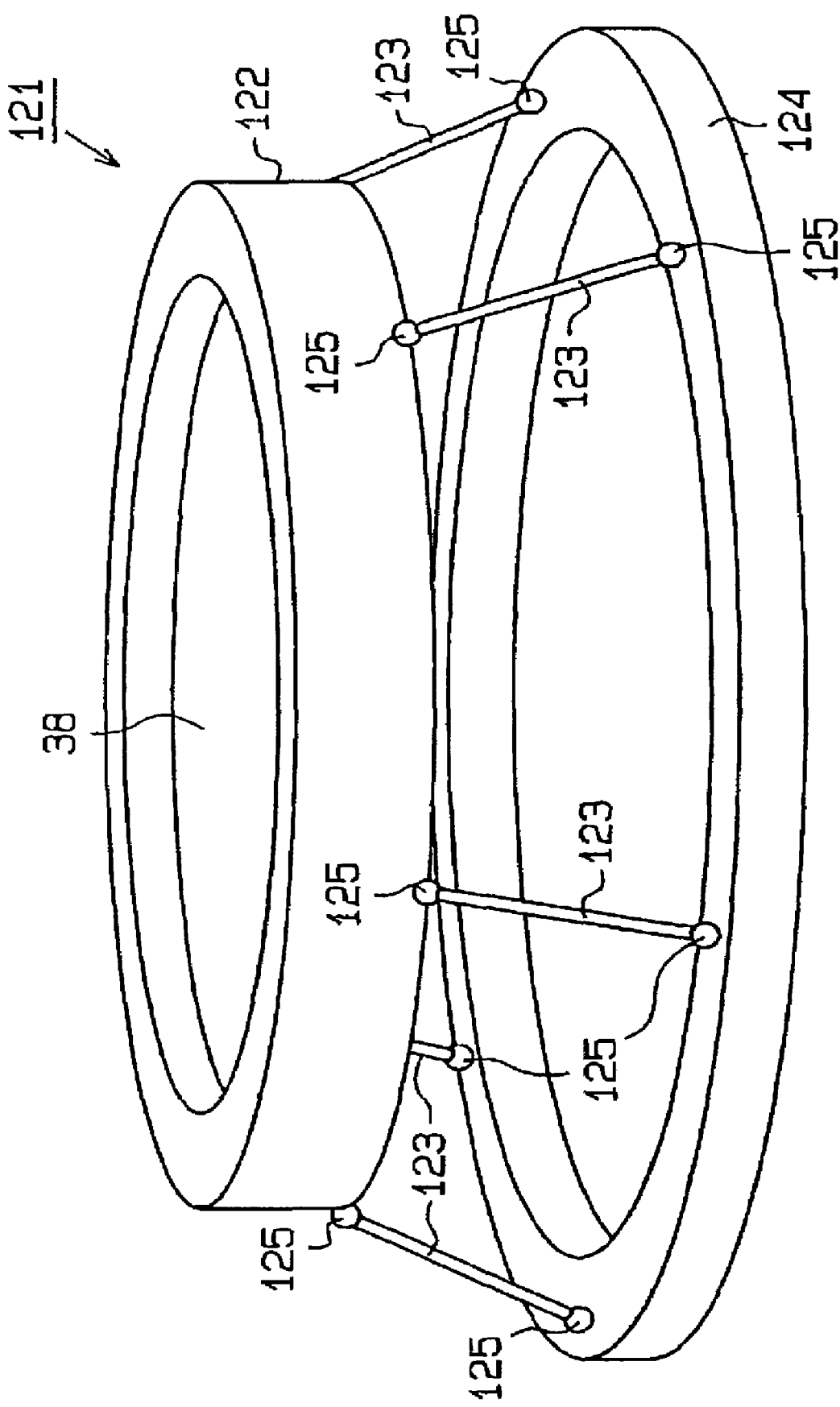
FIG. 40 is a schematic diagram of an optical element holding apparatus according to a fourth embodiment of the present invention.

FIG. 40 is a perspective view schematically showing an optical element holding apparatus 121 of the fourth embodiment. As shown in FIG. 40, in the optical element holding apparatus 121, a lens frame 122, which holds an optical element 38, is held on a frame 124 by six independent (five shown in the drawing) rigid bodies 123.

Figure 41:
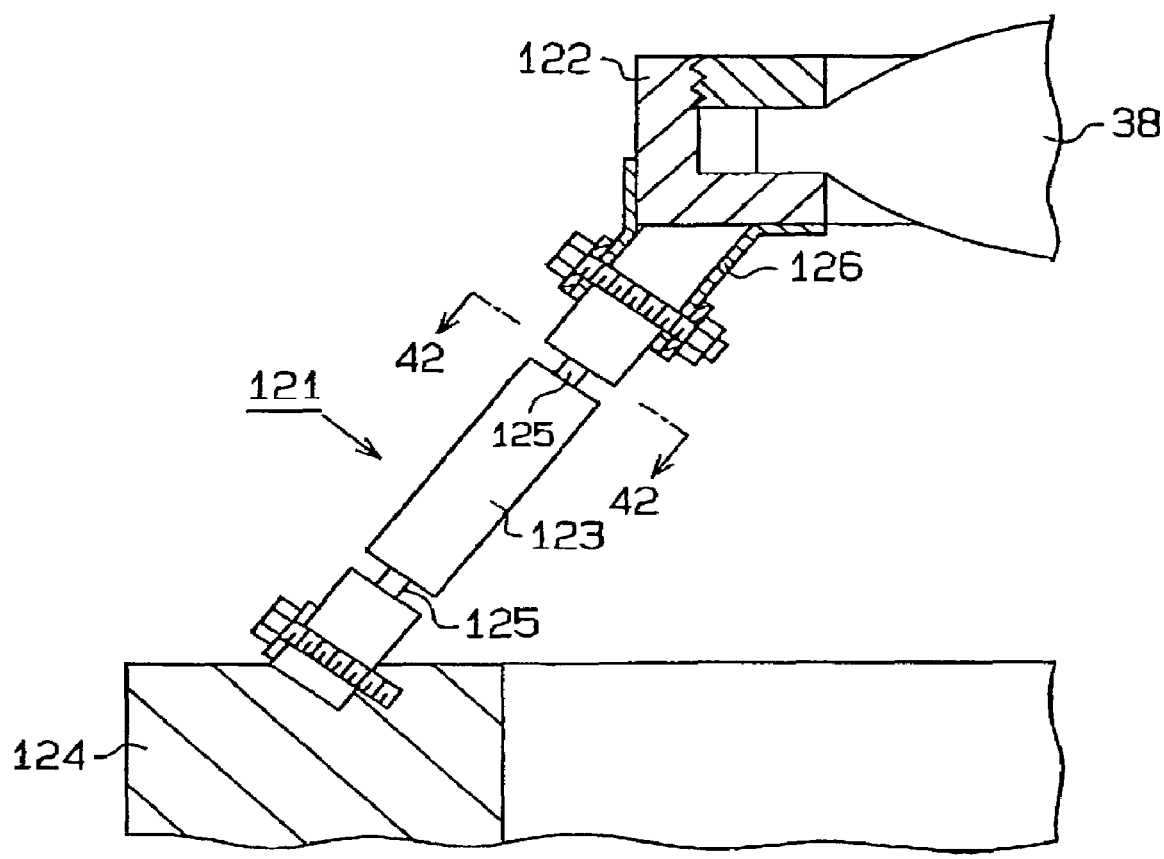
FIG. 41 is a cross-sectional view showing a rigid body of FIG. 40.
Figure 42:
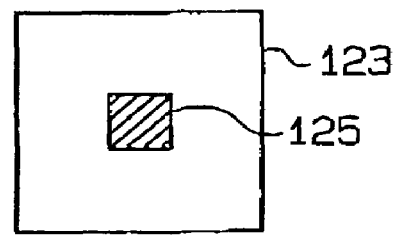
FIG. 42 is a cross-sectional view taken along line 42-42 in FIG. 41.
Figure 43:
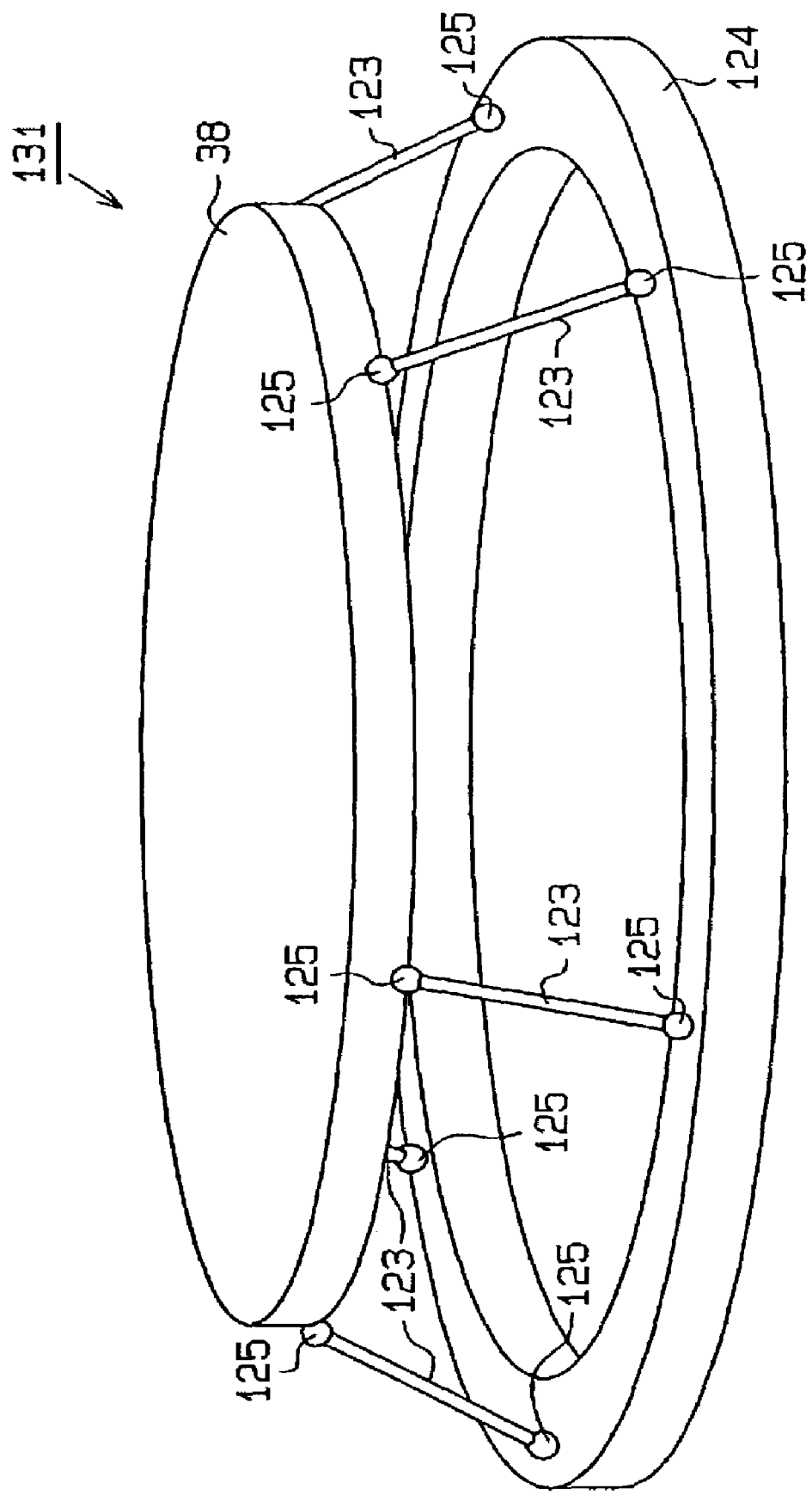
FIG. 43 is a schematic diagram of an optical element holding apparatus according to a fifth embodiment of the present invention.

FIG. 41 is a cross-sectional view of the rigid body 123, FIG. 42 is a cross-sectional view taken along line 42-42 in FIG. 41. As shown in FIGS. 41 and 43, the rigid body 123 is formed by a metal square pillar, and notched rotational pivots 125, the structure of which is the similar to the flexure neck portions 89a-89d of the third embodiment, are formed near the ends of the rigid body 123. One end of each rigid body 123 is directly fixed to the frame 124 and the other end is fixed to the frame body 122 by an attaching member 126. When presuming there are six lines connecting the rotational pivots 125 at the ends of each rigid body 123, the six rigid bodies 123 are also arranged so that three or more lines do not intersect at the same point.

Fifth Embodiment

An optical element holding device according to a fifth embodiment of the present invention will now be discussed centering on parts differing from each of the above embodiments. As schematically shown in FIG. 43, in an optical element holding apparatus 131 of the fifth embodiment, the lens frame 122 of the optical element holding apparatus 121 of the fourth embodiment is eliminated. A bearing surface block mechanism or a clamp member is attached to one of the ends of the rigid body 123 to directly clamp the optical element 38.

This also obtains the same advantages as the optical element holding apparatus 121 of the fourth embodiment.

Sixth Embodiment

An optical element holding apparatus according to a sixth embodiment of the present invention will now be discussed centering on parts differing from each of the above embodiments.

Figure 44:
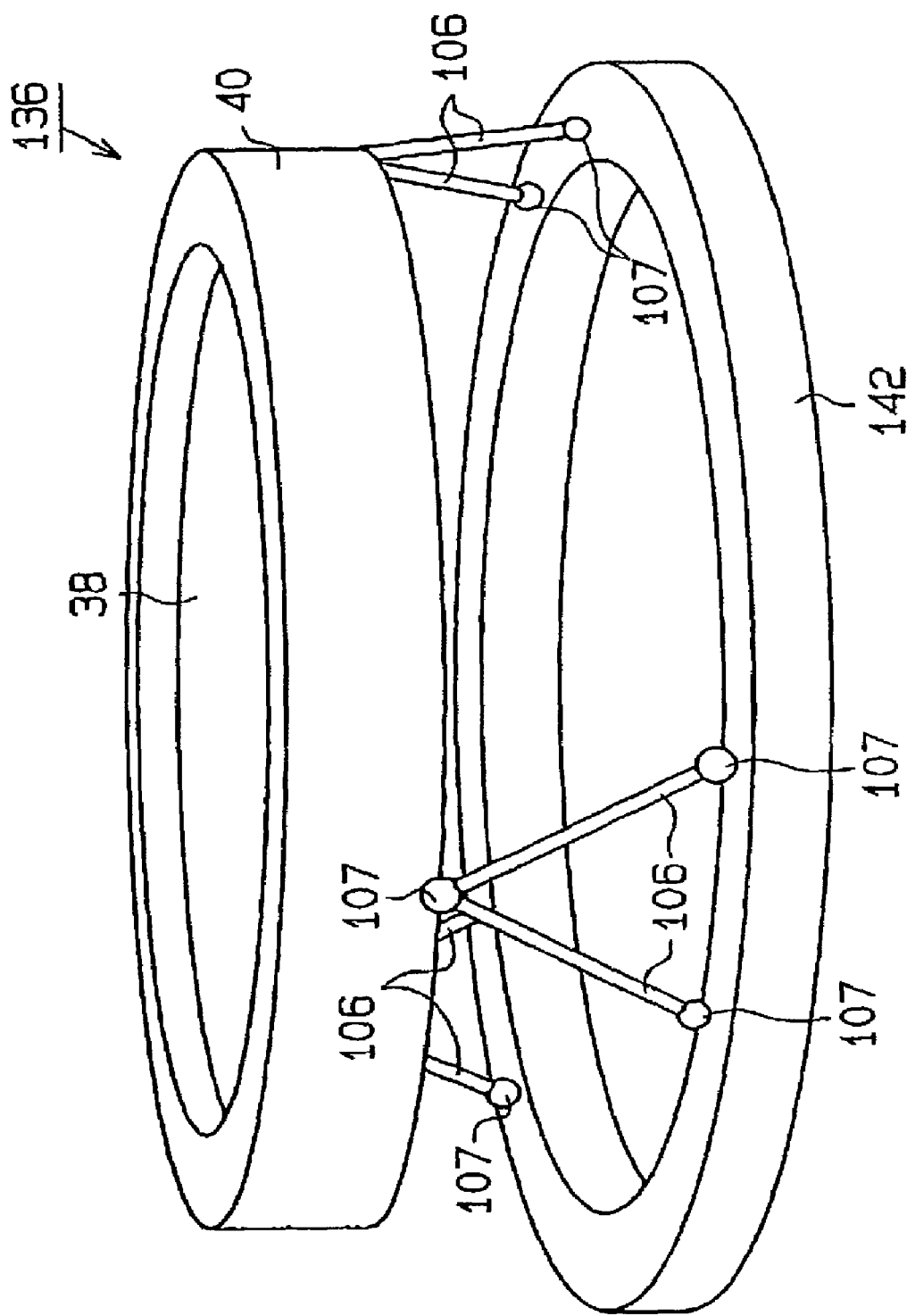
FIG. 44 is a schematic diagram of an optical element holding apparatus according to a sixth embodiment of the present invention.

FIG. 44 is a perspective view schematically showing an optical element holding apparatus 136 of the sixth embodiment. As shown in FIG. 44, in the optical element holding apparatus 136, the position adjusting mechanism 108 of the optical element holding apparatus 139 of the third embodiment is eliminated. More specifically, in the optical element holding apparatus 139 of the third embodiment, in the optical element holding apparatus 139 of the third embodiment, the vertical drive lever 85a, the horizontal drive lever 85b, the adjusting washers 99 and the adjusting buttons 100, which adjust the displacement of the two drive levers 85a, 85b, and their peripheral structure are eliminated.

In such structure, when the optical element 38 is placed on the lens frame 40, the flexure member 41 functions to obtain the six degrees of freedom of motion, which include the three movements along the polar coordinate system R-θ-Z and rotations about the three coordinate axes R, θ, Z. Accordingly, the optical element 38 is held on the frame 142 in a kinematical manner. Further, although the range of position adjustment of the optical element 38 is narrowed, the same advantages as the optical element holding apparatus 139 of the third embodiment is obtained.

Seventh Embodiment

An optical element holding apparatus according to a seventh embodiment of the present invention will now be discussed centering on the parts differing from the above embodiments.

Figure 45:
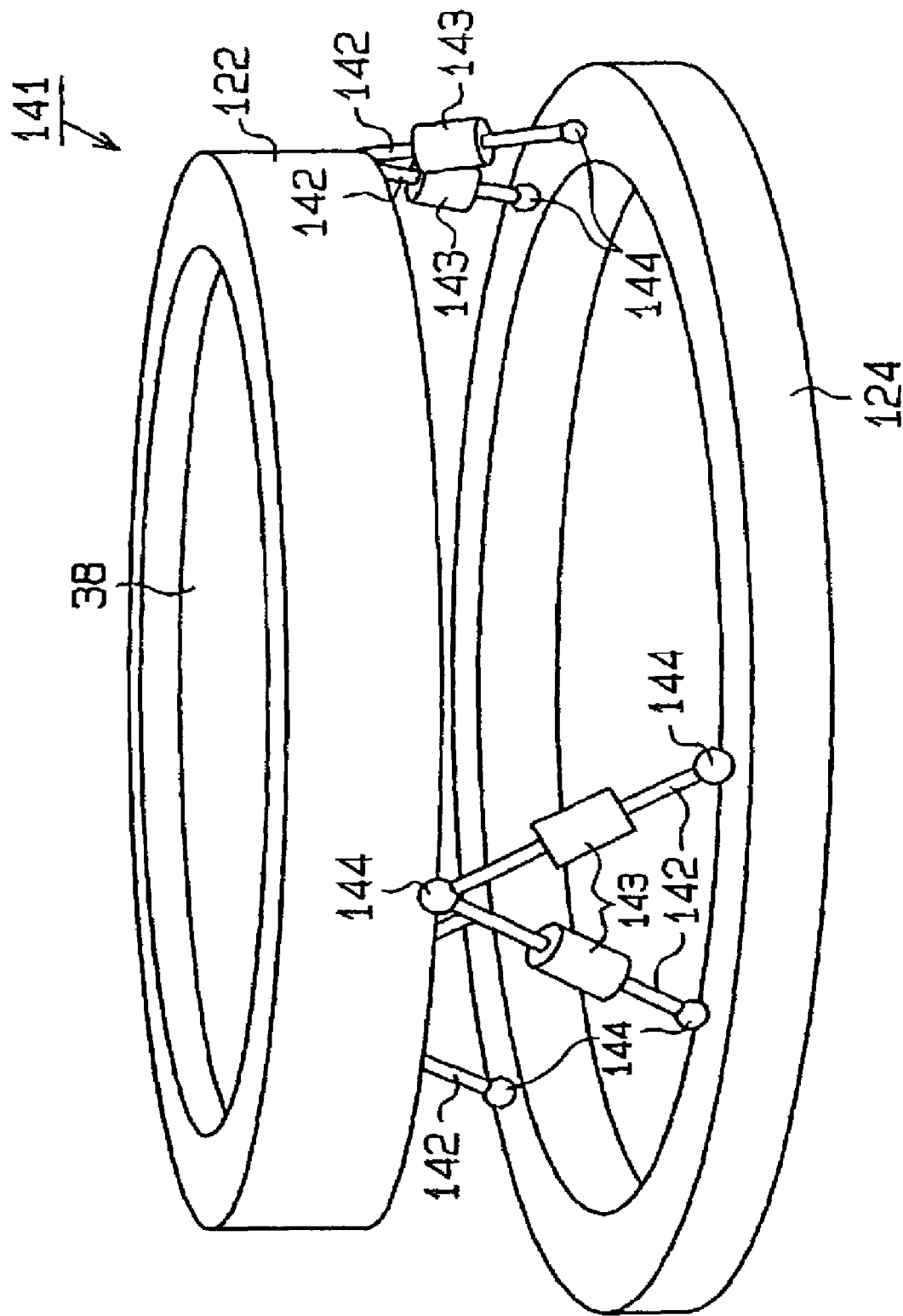
FIG. 45 is a schematic diagram of an optical element holding apparatus according to a seventh embodiment of the present invention.

FIG. 45 is a perspective view schematically showing an optical element holding apparatus 141 of the seventh embodiment 141. As shown in FIG. 45, the optical element holding apparatus 141 differs from the optical element holding apparatus 121 of the fourth embodiment in that the shape of a rigid body 146 is changed and a length adjusting mechanism 143, which functions as a distance adjusting mechanism, is arranged at the middle of each rigid body 146. Further, rotational pivots 144 located on the ends of two rigid bodies 146 are arranged in the vicinity of each other so that two rigid bodies 146 share the same rotational pivot.

Figure 46:
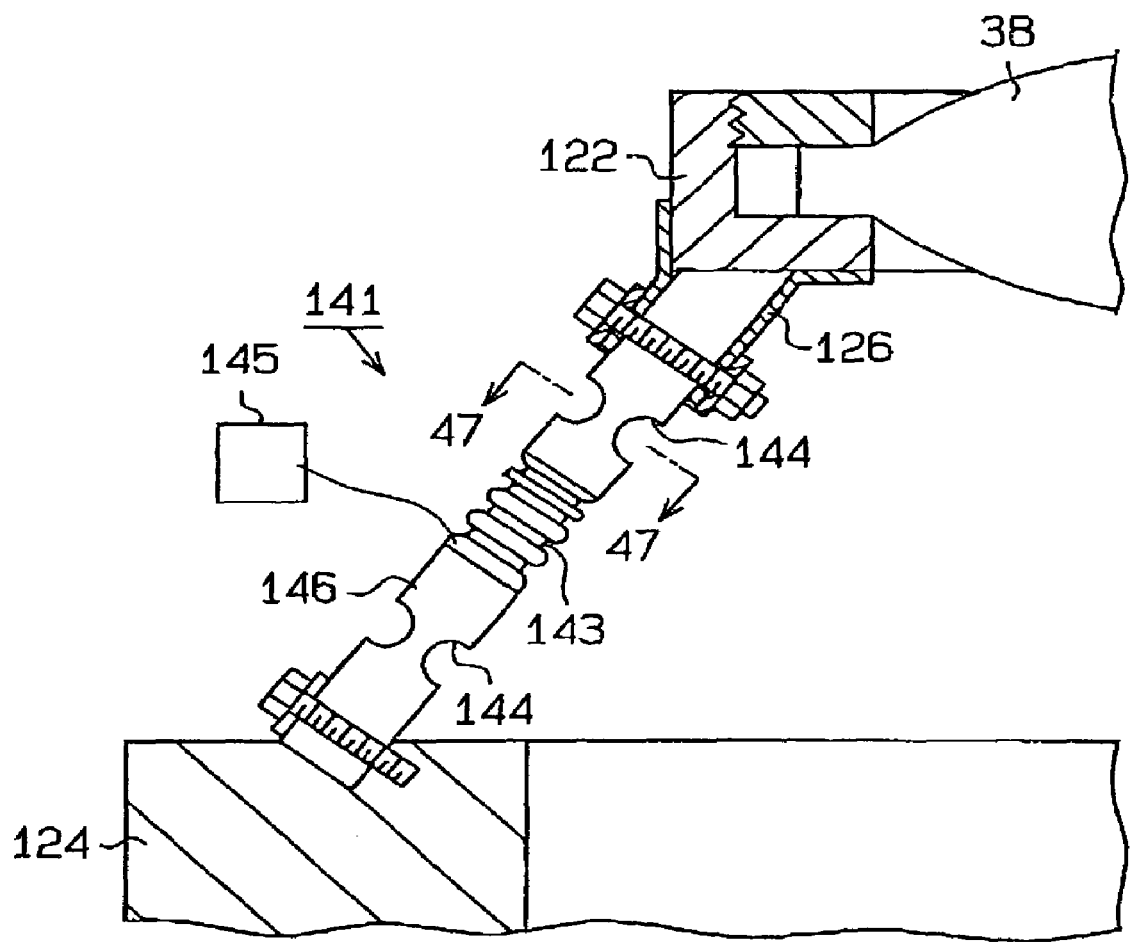
FIG. 46 is a cross-sectional view showing a rigid body of FIG. 45.
Figure 47:
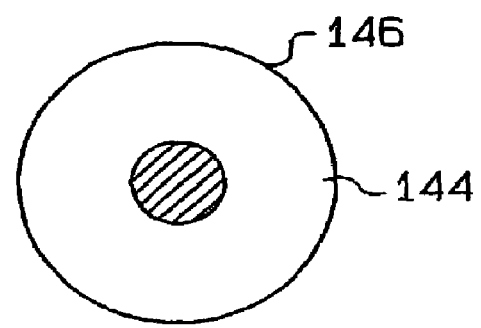
FIG. 47 is a cross-sectional view taken along line 47-47 in FIG. 46.

FIG. 46 is a cross-sectional view of one of the rigid bodies 146. FIG. 47 is a cross-sectional view taken along line 47-47 in FIG. 46. Referring to FIGS. 46 and 47, the rigid body 146 is made of a metal cylinder, and rotational pivots 144, which is formed by an annular groove having a generally U-shaped cross-section, are formed near the two ends of the rigid body 146. The rotational pivot 144 functions in the same manner as the flexure neck portions 89a-89d of the third embodiment. The rotational pivot 144 of another rigid body 146 is connected to the vicinity of the rotational pivot. One end of each rigid body 146 is directly fixed to the frame 124, which serves as a fixed portion, and the other end is fixed to the lens frame 122 by an attaching member 126.

The length adjusting mechanism 143, which is, for example, a piezo-element, is connected to a main control apparatus, which serves as a control apparatus fro controlling the operation of the entire exposure apparatus 31. The main control apparatus 145 detects the aberration information of the projection optical system 35 based on the image of the pattern on the reticle Rt formed on an image surface of the projection optical system 35 of the exposure apparatus. Further, the main control apparatus 145 receives information of the expanded length of the length adjusting mechanism 143 from the length adjusting mechanism 143 and obtains the distance between the lens frame 122 and the frame 124 from the expanded length information. This adjusts the distance between the lens frame 122 and the frame 124 and corrects the aberration of the projection optical system 35.

In addition to advantages (1), (5), (8), (22), (24, and (27), the fourth embodiment having the above structure has the following advantages.

(28) In the optical element holding apparatus 141, the main control apparatus 145 detects the distance between the lens frame 122 and the frame 124. The main control apparatus 145 controls the length adjusting mechanism 143 to adjust the distance between the lens frame 122 and the frame 124 based on the detection result and the aberration information included in the image of the pattern formed on the image surface side of the projection optical system 35.

Thus, the residue aberration in the projection optical system 35 is accurately corrected. This further improves the exposure accuracy. In addition, since a piezo-element is employed as the length adjusting mechanism 143, the distance between the lens frame 122 and the frame 124 is electrically adjusted in real time, and the aberration of the projection optical system 35 is corrected by having the aberration follow changes in the state of the projection optical system 35.

(29) In the optical element holding apparatus 141, the distance between the lens frame 122 and the frame 124 is adjusted by adjusting the length of the rigid bodies 146, which connect the lens frame 122 and the frame 124, with the length adjusting mechanism 143. Thus, the distance between the lens frame 122 and the frame 124 is adjusted with a simple structure and the range of the vertical movement and tilting movement of the optical element is enlarged.

It should be apparent to those skilled in the art that the present invention may be embodied in many other specific forms without departing from the spirit or scope of the invention. Particularly, it should be understood that the present invention may be embodied in the following forms.

In the third embodiment, the amounts of movement of the drive levers 85a and 85b may be set by using, for example, piezo-actuators in place of the adjusting washers 99 and adjusting buttons 100. The posture of the optical element 38 may be controlled in real time by using a sensor, which detects the position of the lens frame 40.

In the third embodiment, the optical element 38 may be held by the lens frame 40 without using the holders 43.

The optical element 38 may be a plane parallel plate, a mirror, or a half mirror instead of a lens. Further, a polarizing member, which polarizes exposure light, or a reflection optical member having a reflection surface, which reflects exposure light, may be used as well.

The present invention may be adapted to an optical element holding apparatus in the illumination optical system 33 of the exposure apparatus 31 or to an optical element holding apparatus, which holds an optical element upright. Further, the invention may be adapted to an optical element holding apparatus in an optical system of an optical machine, such as a microscope or an interferometer.

The present invention may be adapted to the optical system of a contact exposure apparatus, which exposes the pattern of a mask by having a mask and a substrate come into close contact, or a proximity exposure apparatus, which exposes the pattern of a mask by having a mask and a substrate arranged in the proximity of each other. The projection optical system is not limited to a full refraction type but may be a reflection refraction type as well.

The present invention may be adapted to an exposure apparatus of an equal magnification type or an exposure apparatus of an enlargement type as well as a reduction exposure type exposure apparatus.

The present invention may also be adapted to an exposure system that transfers a circuit pattern onto a glass substrate or a silicon wafer from a mother reticle in order to produce a reticle or mask, which is used in a light exposure apparatus, an EUV exposure apparatus, an X-ray exposure apparatus, or an electron-beam exposure apparatus. The exposure apparatuses that use deep ultraviolet rays (DUV) or vacuum ultraviolet rays (VUV) usually use a transmission reticle substrate. Quartz glass, fluorine-doped quartz glass, fluorite, magnesium fluoride, or crystal or the like are used as the reticle substrate. A proximity type X-ray exposure apparatus and electron-beam exposure apparatus use a transmission mask substrate (stencil mask or membrane mask). A silicon wafer is used as the mask substrate.

The present invention may be adapted not only to an exposure apparatus, which is used to fabricate semiconductor devices, but also to an exposure apparatus, which is used to manufacture displays including a liquid crystal display (LCD) and transfers a device pattern onto a glass plate. The invention may also be adapted to an exposure apparatus, which is used to produce thin-film magnetic heads and which transfers a device pattern onto a ceramic wafer, and an exposure apparatus which is used to fabricate imaging devices, such as CCDs.

The present invention may be adapted to a scanning stepper, which transfers the pattern of a mask on a substrate with the mask and substrate being moved relatively and moves the substrate step by step. The present invention may also be adapted to a step and repeat type stepper, which transfers the pattern of a mask on a substrate without moving the mask and substrate and which moves the substrate step by step.

The exposure apparatus may use a light source, such as g rays (436 nm), i rays (365 nm), a KrF excimer laser (248 nm), $F_2$ laser (157 nm), $Kr_2$ laser (146 nm), and $Ar_2$ laser (126 nm). Further, harmonic waves, which are obtained by amplifying the single-wavelength laser beam of the ultraviolet range or visible range emitted from a DFB semiconductor laser or a fiber laser using an erbium-doped (or erbium-yttrium-doped) fiber amplifier and converting the amplified laser beam to violet rays using a non-linear optical crystal.

The exposure apparatus 31 may be manufactured as follows.

First, at least some optical elements 38, such as a plurality of lenses or mirrors forming the illumination optical system 33 and the projection optical system 35, are held by the optical element holding apparatuses 39, 139, the illumination optical system 33 and the projection optical system 35 are incorporated in the body of the exposure apparatus 31, and optical adjustment is performed. Then, the wafer stage 36 that includes multiple mechanical components (including the reticle stage 34 when using a scan type exposure apparatus) are attached to the body of the exposure apparatus 31 and wires are connected. Then, a gas supplying pipe for supplying gas into the optical path of the exposure light EL is connected and the total adjustment (electric adjustment, operational check or the like) is performed.

The individual components of the optical element holding apparatus 39 are assembled after impurities, such as machining oil or metal substances, are cleaned off through ultrasonic cleaning or the like. It is desirable that the exposure apparatus 31 should be manufactured in a clean room where the temperature, humidity and atmospheric pressure are controlled and the degree of cleanness is adjusted.

The glass material in the embodiments is not limited to fluorite and quartz glass, but may be a crystal, such as lithium fluoride, magnesium fluoride, strontium fluoride, lithium-calcium-aluminum-fluoride or lithium-strontium-aluminum-fluoride; fluoride glass of zirconium-barium-lantern-aluminum; and modified quartz, such as fluorine-doped quartz glass, fluorine-hydrogen-doped quartz glass, quartz glass containing an OH group or quartz glass containing fluorine and an OH group.

A description will now be given of a method of fabricating a device through a lithography process using the exposure apparatus 31.

Figure 48:
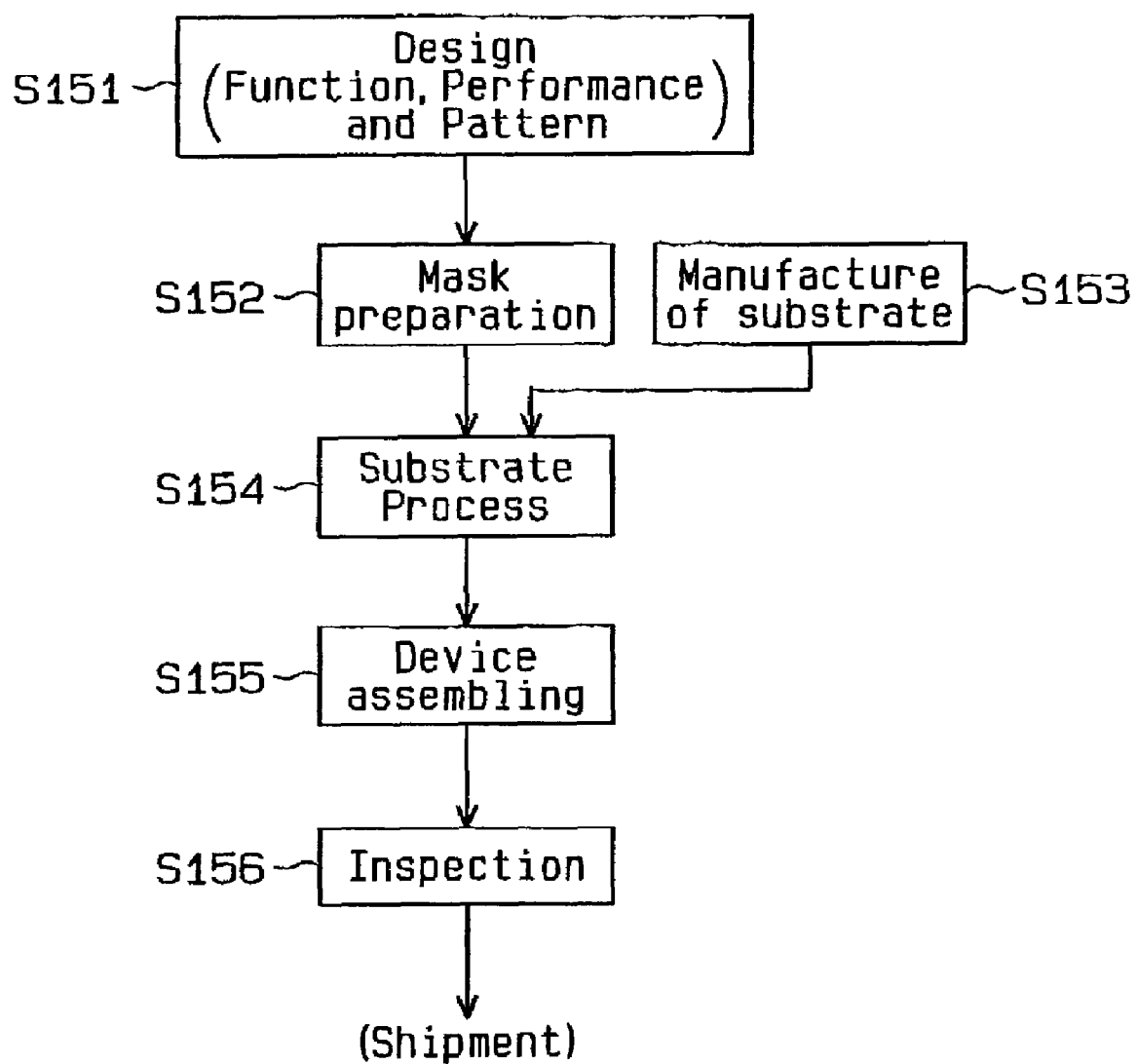
FIG. 48 is a flowchart illustrating an example of a semiconductor device fabrication process.

FIG. 48 is a flowchart illustrating a process of fabricating a device (a semiconductor device, such as IC or LSI, a liquid crystal display, an image pickup device (CCD), a thin-film magnetic head ,and a micro machine). As shown in FIG. 48, first, the design (e.g., circuit design of a semiconductor device) of the functions and performance of a device (micro device) is performed and the pattern design that accomplishes the functions is carried out in step S151 (design step). In the next step S152 (mask producing step), a mask (reticle R or the like) on which the designed circuit pattern is formed is produced. In step S153 (substrate producing step), a substrate (wafer W when a silicon material is used) is produced using a material, such as silicon or glass plate.

In the next step S154 (substrate processing step), a circuit is formed on the substrate through the lithography technology using the mask and substrate prepared in steps S151 to S153. Then, a device is assembled in step S155 (device assembling step) using the substrate processed in step S154. In step S155, steps, such as a dicing step, a bonding step, and a packaging step (chip packaging or the like), are executed as needed.

Finally, inspection of the device manufactured in step S155, such as an operational test and durability test, is performed in step S156 (inspection step). Through the above steps, the device is completed.

Figure 49:
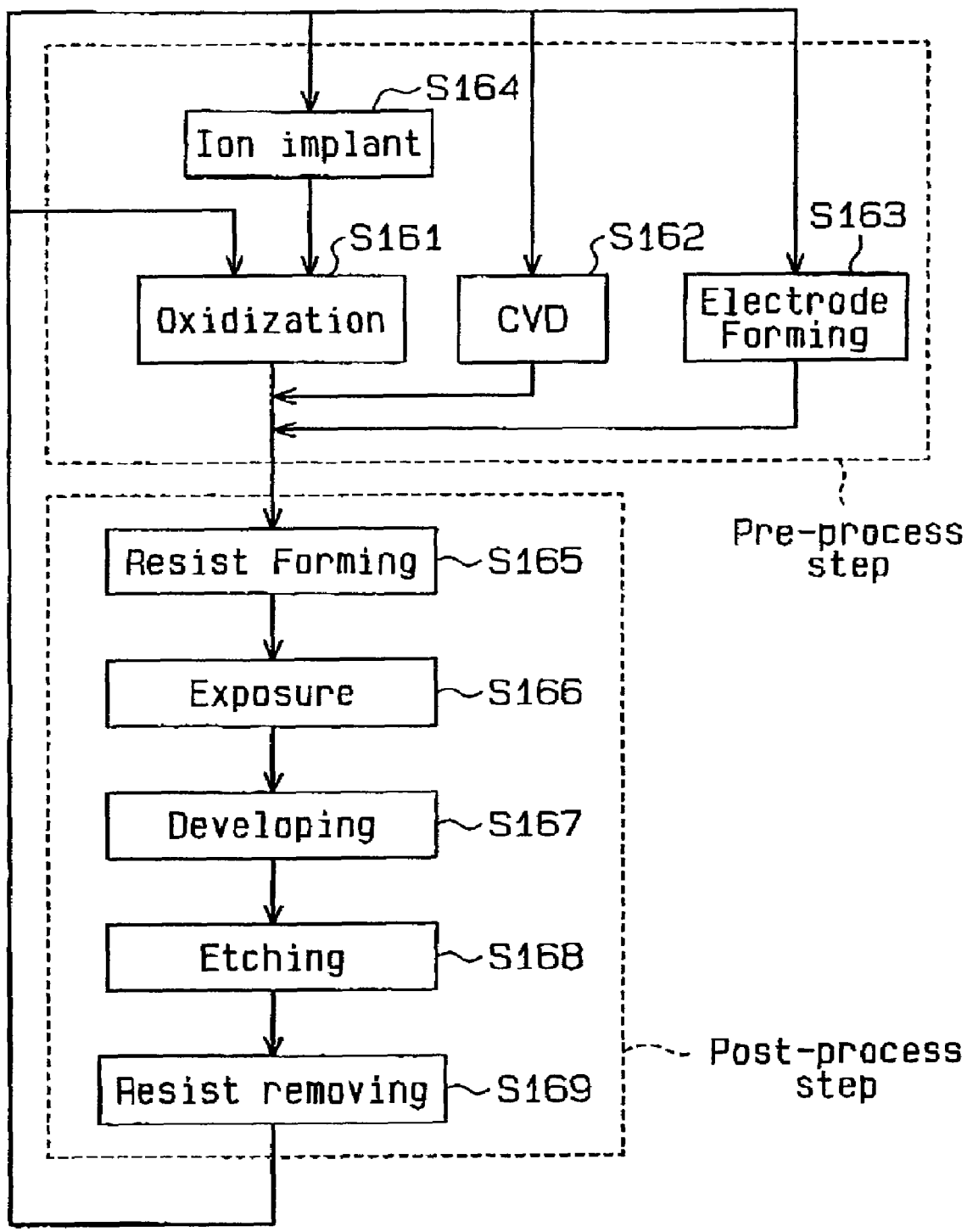
FIG. 49 is a flowchart illustrating a substrate processing in the semiconductor device fabrication process.

FIG. 49 is a detailed flowchart of step S154 of FIG. 48 in the fabrication of a semiconductor device. In FIG. 49, the surface of the wafer W is oxidized in step S161 (oxidizing step). In step S162 (CVD step), an insulating film is formed on the surface of the wafer W. In step S163 (electrode forming step), electrodes are formed on the wafer W by vapor deposition. In step S164 (ion implanting step), ions are implanted in the wafer W. Steps S161 to S164 are a pre-process of the individual stages of the wafer process and are selectively executed in accordance with the required process at each stage.

When the pre-process is finished at each stage of the wafer process, a post-process is executed as follows. In the post-process, first, a photosensitive agent is applied to the wafer W in step S165 (resist forming step). Subsequently, the circuit pattern of a mask (reticle R) is transferred onto the wafer W by a lithography system (exposure apparatus 31) in step S166 (exposure step). Next, the exposed wafer W is developed in step S167 (developing step), and an exposed member at a portion excluding the resist-remaining portion is removed through etching in step S168 (etching step). In step S169 (resist removing step), unnecessary resist is removed. The pre-process and post-process are repeated to form multiple circuit patterns on the wafer W.

In the device fabrication method, the exposure apparatus 31 is used in the exposure step (step S166) so that the degree of the resolution by the exposure light EL of the ultraviolet range is improved. Further, the exposure control is executed with high accuracy. This ensures production of high-integration devices with the minimum line width of about 0.1 µm and increases the yield.

The invention claimed is:

1. A holding apparatus for holding a member, comprising:
   a drive mechanism which includes a plurality of flexure members and provides the member to be held with three movements along three coordinate axes with an origin being substantially the center of the member to be held and at least two rotations about at least two coordinate axes of the three coordinate axes, wherein at least one of the plurality of flexure members includes,
   a base portion fixed to a base member;
   a support portion connected to the member to be held; and
   a pair of link mechanisms arranged between the base portion and the support portion.

2. The holding apparatus according claim 1, wherein the drive mechanism includes a displacement member connected to at least one of the plurality of flexure members, wherein the displacement member displaces the at least one of the plurality of flexure members to provide the member to be held with the three movements and the at least two rotations.

3. The holding apparatus according to claim 1, wherein the plurality of flexure members comprise the three flexure members which are arranged at predetermined intervals.

4. The holding apparatus according to claim 3, wherein the three flexure members are arranged at equal intervals around a peripheral portion of the member to be held.

5. The holding apparatus according to claim 1, wherein the pair of link mechanisms is connected to the base portion and the support portion, wherein the pair of link mechanisms rotatably supports the support portion about each of axes along a plurality of different directions and restricts movements of the support portion relative to the base portion along a plurality of different directions.

6. The holding apparatus according to claim 5, wherein the pair of link mechanisms includes:
   a horizontal restriction link rotatably supports the support portion about a horizontal axis and restricts movement of the support portion along a horizontal direction; and
   an intersecting direction restriction link rotatably supports the support portion about an axis in a direction intersecting the horizontal direction and restricts movement of the support portion along said intersecting direction.

7. The holding apparatus according to claim 1, wherein at least one of the plurality of flexure members includes rotational pivots that connect the base portion, the support portion, and the pair of link mechanisms.

8. The holding apparatus according to claim 2, wherein at least one of the plurality of flexure members includes a conversion mechanism that converts drive force, which is applied to the displacement member in a predetermined direction, to drive force in a direction which differs from the predetermined direction.

9. The holding apparatus according to claim 8, wherein the conversion mechanism converts drive force, which is applied to the displacement member in a perpendicular direction, to drive force in a horizontal direction.

10. The holding apparatus according to claim 8, wherein the conversion mechanism converts drive force, which is applied to the displacement member in a first perpendicular direction, to drive force in a second perpendicular direction, with respect to the member to be held.

11. The holding apparatus according to claim 1, wherein the base portion, the support portion and the pair of link mechanisms are formed of a single member.

12. The holding apparatus according to claim 11, wherein at least one of the plurality of flexure members includes a plurality of first notch springs, which are formed of the single member, to link the base portion, the support portion, and the pair of link mechanisms.

13. The holding apparatus according to claim 8, wherein at least one of the plurality of flexure members includes a plurality of first notch springs, and wherein the conversion mechanism includes a plurality of second notch springs formed on the base portion, and wherein the plurality of first notch springs includes a plurality of link notch springs connected to the pair of link mechanisms, and the plurality of second notch springs includes a plurality of conversion notch springs used to convert drive force, which is applied to the drive mechanism in a predetermined direction with respect to the member to be held, to drive force in a direction which differs from the predetermined direction.

14. The holding apparatus according to claim 13, wherein the plurality of first notch springs and the plurality of second notch springs are arranged on the same plane.

15. The holding apparatus according to claim 2, wherein the displacement member is connected to the pair of link mechanisms, and wherein the displacement member transmits drive force to the pair of link mechanisms.

16. The holding apparatus according to claim 1, wherein the drive mechanism has an actuator.

17. The holding apparatus according to claim 2, wherein the displacement member includes first and second manipulators connected to at least one of the plurality of flexure members, and wherein the displacement member manipulates at least one of the plurality of flexure members, such that manipulation of the first manipulator causes at least one of the plurality of flexure members to move the member to be held in a first direction and such that manipulation of the second manipulator causes at least one of the plurality of flexure members to move the member to be held in a second direction that differs from the first direction.

18. The holding apparatus according to claim 17, wherein the member to be held is an optical element, and wherein the first direction is a tangential direction of the optical element, and the second direction is an optical axis direction of the optical element.

19. The holding apparatus according to claim 1, wherein the plurality of flexure members consist of three flexure members arranged at predetermined intervals, and the drive mechanism includes a displacement member connected to at least one of the plurality of flexure members, wherein the displacement member displaces the flexure members to provide the member to be held with the three movements and the two rotations.

20. A holding apparatus comprising:
three flexure members including a base portion fixed to a base member, a support portion connected to a member to be held, and a pair of link mechanisms arranged between the base portion and the support portion; and
first and second manipulators connected to at least one of the three flexure members, wherein the first and second manipulators manipulate at least one of the three flexure members, such that manipulation of the first manipulator causes at least one of the three flexure members to move the member to be held in a first direction and such that manipulation of the second manipulator causes at least one of the three flexure members to move the member to be held in a second direction that differs from the first direction.

21. The holding apparatus according to claim 20, wherein at least one of the first and second manipulators has an actuator.

22. The holding apparatus according to claim 20, wherein the three flexure members are arranged at equal intervals.

23. The holding apparatus according to claim 20, wherein at least one of the first and second manipulators provides the member to be held with three movements along three coordinate axes with an origin being substantially the center of the member to be held and two rotations about at least two coordinate axes of the three coordinate axes.

24. The holding apparatus according to claim 22, wherein the three flexure members support the member to be held in a kinematical manner by the cooperative action of the three flexure members.

25. The holding apparatus according to claim 20, wherein the base portion, the support portion, and the pair of link mechanisms are formed from a single member.

26. The holding apparatus according to claim 25, wherein at least one of flexure members include rotational pivots that connect the base portion, the support portion, and the pair of link mechanisms.

27. The holding apparatus according to claim 25, wherein the at least one of flexure members include a plurality of first notch springs, formed from the single member, to link the base portion, the support portion, and the pair of link mechanisms.

* * * * *